(12) United States Patent
Jeon et al.

(10) Patent No.: US 12,382,781 B2
(45) Date of Patent: Aug. 5, 2025

(54) DISPLAY PANEL AND DISPLAY APPARATUS

(71) Applicant: Samsung Display Co., Ltd., Yongin-Si (KR)

(72) Inventors: Woosik Jeon, Yongin-si (KR); Wonkyu Kwak, Yongin-si (KR); Sangyeol Kim, Yongin-si (KR); Gyeongnam Bang, Yongin-si (KR); Sungsik Yun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 769 days.

(21) Appl. No.: 17/570,458

(22) Filed: Jan. 7, 2022

(65) Prior Publication Data

US 2022/0352486 A1 Nov. 3, 2022

(30) Foreign Application Priority Data

Apr. 30, 2021 (KR) .................. 10-2021-0056768
Nov. 23, 2021 (KR) .................. 10-2021-0162787

(51) Int. Cl.
*H10K 50/14* (2023.01)
*H10K 50/844* (2023.01)
(Continued)

(52) U.S. Cl.
CPC ........... *H10K 50/14* (2023.02); *H10K 50/844* (2023.02); *H10K 59/40* (2023.02); *H10K 59/87* (2023.02); *H10K 59/873* (2023.02)

(58) Field of Classification Search
CPC ...... H10K 50/14; H10K 50/844; H10K 59/40; H10K 59/87; H10K 59/873; H10K 59/122; H10K 59/124; G06F 3/044; G06F 3/0443; G06F 3/0412; G06F 2203/04103; G06F 3/0445; G01M 11/0278
See application file for complete search history.

(56) References Cited

U.S. PATENT DOCUMENTS 9,632,487 B2    4/2017    Kim et al.
9,991,465 B2    6/2018    Jeon
(Continued)

FOREIGN PATENT DOCUMENTS

IN           110890474 A    3/2020
KR    10-2016-0127873 A    11/2016
(Continued)

*Primary Examiner* — Yasser A Abdelaziz
(74) *Attorney, Agent, or Firm* — Innovation Counsel LLP

(57) ABSTRACT

A display panel may include a substrate, a light-emitting diode, a first dam, a crack sensing member, and a planarization layer. The substrate may include a transmission area, a display area at least partially surrounding the transmission area, and an intermediate area positioned between the transmission area and the display area. The light-emitting diode may be positioned on the display area and may include a first electrode, a second electrode, and a functional layer positioned between the first electrode and the second electrode. The first dam may be positioned on the intermediate area. The crack sensing member may be positioned farther from the transmission area than the first dam. The planarization layer may be positioned on the crack sensing member.

40 Claims, 44 Drawing Sheets

(51) Int. Cl.
 *H10K 59/40* (2023.01)
 *H10K 59/80* (2023.01)

(56) References Cited

U.S. PATENT DOCUMENTS

| | | | |
|---|---|---|---|
| 10,135,010 B2 | 11/2018 | Kim et al. | |
| 10,480,313 B2 | 11/2019 | Murugesan et al. | |
| 2016/0232826 A1* | 8/2016 | Cho | H10K 59/131 |
| 2016/0307971 A1* | 10/2016 | Jeon | H10K 59/00 |
| 2018/0090517 A1* | 3/2018 | Park | H10K 50/8426 |
| 2020/0127233 A1 | 4/2020 | Sung et al. | |
| 2020/0175900 A1* | 6/2020 | Han | G09G 3/006 |
| 2020/0176709 A1 | 6/2020 | Moon et al. | |
| 2020/0365672 A1 | 11/2020 | Choi et al. | |

FOREIGN PATENT DOCUMENTS

| | | |
|---|---|---|
| KR | 10-2017-0015632 A | 2/2017 |
| KR | 10-2017-0045549 A | 4/2017 |
| KR | 10-2020-0063377 A | 6/2020 |
| KR | 10-2020-0131399 A | 11/2020 |

\* cited by examiner

DISPLAY PANEL AND DISPLAY APPARATUS

CROSS-REFERENCE TO RELATED APPLICATIONS

This application claims priority under 35 U.S.C. § 119 to Korean Patent Application No. 10-2021-0056768 filed on Apr. 30, 2021 and Korean Patent Application No. 10-2021-0162787 filed on Nov. 23, 2021; the Korean Patent Applications are incorporated by reference.

BACKGROUND

1. Field

The technical field relates to a display panel and a related display apparatus.

2. Description of the Related Art

A display apparatus may include a display panel. The display panel may display images according to input signals. The display apparatus may include additional components for performing additional functions. The additional components may be smaller than the display panel.

SUMMARY

One or more embodiments may be related to a display panel having an opening area (or transmission area). For receiving inputs and/or providing outputs, one or more components may be exposed through the opening area. One or more embodiments may be related to a display apparatus that includes the display panel.

According to one or more embodiments, a display panel may include the following elements: a substrate including an opening area, a display area at least partially surrounding the opening area, and a middle area between the opening area and the display area; a light-emitting diode arranged in the display area and including a first electrode, a second electrode, and a functional layer between the first electrode and the second electrode; a first dam portion in the middle area; a crack sensing layer between the display area and the first dam portion; and a planarization layer on the crack sensing layer.

The display panel may further include a second dam portion between the first dam portion and the opening area.

The display panel may further include a metal layer overlapping at least one of the first dam portion and the second dam portion.

The metal layer may at least partially overlap an upper surface of the first dam portion and a side surface of the first dam portion, the side surface being adjacent to the second dam portion, and the metal layer may at least partially overlap an upper surface of the second dam portion, a first side surface of the second dam portion, and a second side surface of the second dam portion, the first side surface being adjacent to the first dam portion, and the second side surface being adjacent to the opening area.

The metal layer may include an opening overlapping at least one of the upper surface of the second dam portion, the first side surface of the second dam portion, and the second side surface of the second dam portion.

The metal layer may include a first metal layer and a second metal layer, wherein the first metal layer and the second metal layer may at least partially overlap each other.

The planarization layer may cover the second metal layer.

The display panel may further include an input sensing layer arranged on the light-emitting diode and including a first touch insulating layer, a first conductive layer, a second touch insulating layer, and a second conductive layer, which are sequentially stacked.

The first touch insulating layer and the second touch insulating layer may extend from the display area to the middle area, and the metal layer may be on the first touch insulating layer or the second touch insulating layer.

The first metal layer may be on the first touch insulating layer, and the second metal layer may be on the second touch insulating layer.

The planarization layer may have a thickness of about 16,000 angstroms (Å) to about 150,000 Å.

The planarization layer may be directly on the crack sensing layer.

The crack sensing layer may at least partially overlap the first dam portion.

The crack sensing layer may include a first crack sensing layer and a second crack sensing layer, wherein the first crack sensing layer may be between the display area and the opening area, and the second crack sensing layer may be between the first crack sensing layer and the opening area.

A width between the first crack sensing layer and the second crack sensing layer may be 2 μm or more.

The first crack sensing layer and the second crack sensing layer may be integrally formed.

The crack sensing layer may be directly on the first touch insulating layer or the second touch insulating layer.

The second electrode may extend from the display area to the middle area, and the second electrode may include a hole corresponding to the opening area.

The functional layer may extend from the display area to the middle area, and the functional layer may include at least one opening in the middle area.

The display panel may further include at least one inorganic insulating layer on the substrate, wherein the at least one opening of the functional layer may be on the at least one inorganic insulating layer.

The at least one opening may include a first opening, a second opening, and a third opening, wherein the first opening may be between the display area and the first dam portion, the second opening may be between the first dam portion and the second dam portion, and the third opening may be between the second dam portion and the opening area.

The display panel may further include an encapsulation layer arranged on the light-emitting diode and including a first inorganic film layer, an organic film layer, and a second inorganic film layer, which are sequentially stacked.

The encapsulation layer may extend from the display area to the middle area, and the encapsulation layer may overlap the at least one opening of the functional layer.

The display panel may further include an alignment mark between the display area and the crack sensing layer.

According to one or more embodiments, a display apparatus includes a display panel including an opening area, a display area at least partially surrounding the opening area, and a middle area between the opening area and the display area, and a component arranged on a lower surface of the display panel and at least partially overlapping the opening area, wherein the display panel includes a light-emitting diode arranged in the display area and including a first electrode, a second electrode, and a functional layer between the first electrode and the second electrode, a first dam portion in the middle area, a crack sensing layer between the display area and the first dam portion, and a planarization layer on the crack sensing layer.

The display panel may further include a second dam portion between the first dam portion and the opening area.

The display panel may further include a metal layer overlapping at least one of the first dam portion and the second dam portion.

The metal layer may include a first metal layer and a second metal layer, wherein the first metal layer and the second metal layer may at least partially overlap each other.

The planarization layer may cover the second metal layer.

The component may include an imaging device or a sensor.

According to one or more embodiments, a display panel includes a substrate including an opening area, a display area at least partially surrounding the opening area, and a middle area between the opening area and the display area, a light-emitting diode arranged in the display area and including a first electrode, a second electrode, and a functional layer between the first electrode and the second electrode, a first dam portion in the middle area, a crack sensing layer between the display area and the first dam portion and at least partially overlapping the first dam portion, and a second dam portion between the first dam portion and the opening area.

According an embodiment, the display panel may further a third dam portion between the second dam portion and the opening area.

According an embodiment, the first dam portion may have a first height, and the second dam portion may have a second height equal to the first height.

According an embodiment, the third dam portion may have a third height less than the first height.

According an embodiment, the display panel may further an inorganic insulating layer on the substrate, wherein a groove may be defined in the inorganic insulating layer.

According an embodiment, the groove may be between the third dam portion and the opening area.

According an embodiment, the functional layer may extend from the display area to the middle area, and the functional layer may include at least one opening in the middle area.

According an embodiment, the at least one opening may include a first opening, a second opening, a third opening, and a fourth opening, the first opening may be between the display area and the first dam portion, the second opening may be between the first dam portion and the second dam portion, the third opening may be between the second dam portion and the third dam portion, and the fourth opening may be between the third dam portion and the opening area.

According an embodiment, the display panel may further include a metal layer arranged in the middle area and overlapping at least one of the first dam portion, the second dam portion, and the third dam portion.

According an embodiment, the metal layer may at least partially overlap the fourth opening.

An embodiment may be related to a display panel. The display panel may include a substrate, a light-emitting diode, a first dam, a crack sensing member, and a planarization layer. The substrate may include a transmission area, a display area at least partially surrounding the transmission area, and an intermediate area positioned between the transmission area and the display area. The light-emitting diode may be positioned on the display area and may include a first electrode, a second electrode, and a functional layer positioned between the first electrode and the second electrode. The first dam may be positioned on the intermediate area. The crack sensing member may be positioned farther from the transmission area than the first dam. The planarization layer may be positioned on the crack sensing member.

The display panel may include a second dam positioned between the first dam and the transmission area.

The display panel may include at least one metal layer overlapping at least one of the first dam and the second dam.

The at least one metal layer may at least partially overlap a first face of the first dam and a second face of the first dam. The second face of the first dam may be positioned between the first face of the first dam and the second dam. The at least one metal layer may at least partially overlap each of a first face of the second dam, a second face of the second dam, and a third face of the second dam. The second face of the second dam may be positioned between the first face of the second dam and the first dam. The third face of the second dam may be positioned between the first face of the second dam and the transmission area.

The at least one metal layer may include an opening exposing at least one of the first face of the second dam, the second face of the second dam, and the third face of the second dam.

The at least one metal layer may include a first metal layer and a second metal layer. The first metal layer and the second metal layer may at least partially overlap each other.

The planarization layer may cover and directly contact the second metal layer.

The display panel may include an input sensing layer arranged on the light-emitting diode. The input sensing layer may include a first touch insulating layer, a first conductive layer, a second touch insulating layer, and a second conductive layer, which may be sequentially stacked.

Each of the first touch insulating layer and the second touch insulating layer may extend from the display area to the intermediate area. The at least one metal layer directly contacts at least one of the first touch insulating layer and the second touch insulating layer.

The first metal layer may be positioned between the first touch insulating layer and the second touch insulating layer. The second touch insulating layer may be positioned between the first metal layer and the second metal layer.

A thickness of the planarization layer may be in a range of 16,000 angstroms (Å) to 150,000 Å.

The planarization layer may be positioned directly on the crack sensing member.

The crack sensing member may at least partially overlap the first dam.

The crack sensing member may include a first crack sensing member section and a second crack sensing member section, which may be formed of a same material. The first crack sensing member section may be positioned between the display area and the transmission area. The second crack sensing member section may be spaced from the first crack sensing member section and may be positioned between the first crack sensing member section and the transmission area.

A distance between the first crack sensing member section and the second crack sensing member section may be 2 μm or more.

The crack sensing member may include a third crack sensing member section. The third crack sensing member section may be bent and may be formed of the same material as the first crack sensing member section and the second crack sensing member section. The first crack sensing member section may be connected through the third crack sensing member section to the second crack sensing member section. The third crack sensing member section may be directly connected to each of the first crack sensing member and the second crack sensing member.

The crack sensing member may be positioned directly on the first touch insulating layer or the second touch insulating layer.

The second electrode may extend from the display area to the intermediate area and may include a hole corresponding to the transmission area.

The functional layer may extend from the display area to the intermediate area and may include at least one opening positioned on the intermediate area.

The display panel may include an inorganic insulating layer positioned on the substrate. At least one edge of the at least one opening of the functional layer may directly contact the inorganic insulating layer.

The at least one opening may include a first opening, a second opening, and a third opening. The first opening may be positioned between the display area and the first dam. The second opening may be positioned between the first dam and the second dam. The third opening may be positioned between the second dam and the transmission area.

The display panel may include an encapsulation layer arranged on the light-emitting diode. The encapsulation layer may include a first inorganic film layer, an organic film layer, and a second inorganic film layer, which may be sequentially stacked.

The encapsulation layer may extend from the display area to the intermediate area. The encapsulation layer may overlap the at least one opening of the functional layer.

The display panel may include an alignment mark positioned between the display area and the crack sensing member.

An embodiment may be related to a display apparatus. The display apparatus may include a component and a display panel. The display panel may include the following elements: a substrate including an transmission area at least partially exposing the component, a display area at least partially surrounding the transmission area, and an intermediate area positioned between the transmission area and the display area; a light-emitting diode positioned on the display area and including a first electrode, a second electrode, and a functional layer positioned between the first electrode and the second electrode; a first dam positioned on the intermediate area; a crack sensing member positioned farther from the transmission area than the first dam; and a planarization layer positioned on the crack sensing member.

The display panel may include a second dam positioned between the first dam and the transmission area.

The display panel may include at least one metal layer overlapping at least one of the first dam and the second dam.

The at least one metal layer may include a first metal layer and a second metal layer. The first metal layer and the second metal layer may at least partially overlap each other.

The planarization layer may cover and directly contact the second metal layer.

The component may include at least one of an imaging device and a sensor.

BRIEF DESCRIPTION OF THE DRAWINGS

Each of FIG. 13A, FIG. 13B.

Each of FIG. 14A, FIG. 14B.

Each of FIG. 15A, FIG. 15B.

Each of FIG. 16A, FIG. 16B.

Each of FIG. 17A, FIG. 17B.

Each of FIG. 18A, FIG. 18B.

Each of FIG. 19A, FIG. 19B.

Each of FIG. 22A, FIG. 22B.

Each of FIG. 23A, FIG. 23B.

Each of FIG. 24A, FIG. 24B.

DETAILED DESCRIPTION

Figure 1:
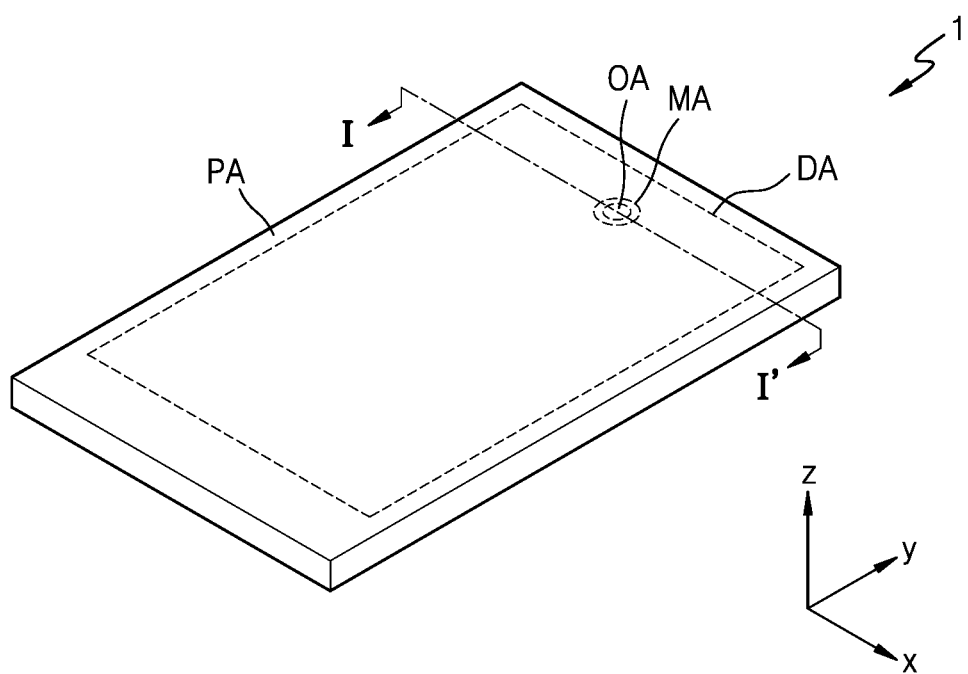
FIG. 1 is a schematic perspective view of a display apparatus according to an embodiment.

Examples of embodiments are described with reference to the accompanying drawings, wherein like reference numerals may refer to like elements.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

An expression used in the singular may encompass the expression of the plural.

When a first element is referred to as being on a second element, the first element can be directly or indirectly on the second element.

Dimensions in the drawings may be exaggerated for convenience of explanation. Dimensions in the drawings may not limit embodiments.

The term "opening area" may mean "transmission area." The term "middle area" may mean "intermediate area." The term "dam portion" may mean "dam" or dam structure." The term "layer" may mean "member," "section of a member," or "layer set." The term "surface" may mean "face" or "flat face." The term "portion" may mean "section." The term "shape" may mean "structure." The term "separated" may mean "spaced." The term "different from" may mean "unequal to." "The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The expression "include a material" may mean "be made of the material." The term "adjacent" may mean "immediately adjacent." The term "define" may mean "form" or "provide." The term "operation" may mean "process." The expression that an element extends in a particular direction may mean that the lengthwise direction of the element is in the particular direction and/or that the element extends lengthwise in the particular direction. The expression that an opening overlaps an object may mean that the opening exposes the object and/or that the position of the opening overlaps with the position of the object.

FIG. 1 is a schematic perspective view of a display apparatus 1 according to an embodiment.

The display apparatus 1 may display a video or a still image. The display apparatus 1 may be a portable display apparatus, such as a mobile phone, a smart phone, a table personal computer (PC), a mobile communication terminal, an electronic notebook, an electronic book, a portable multimedia player (PMP), a navigation device, or an Ultra Mobile PC (UMPC). The display apparatus 1 may be (part of) a display screen of a television, a laptop computer, a monitor, an advertisement board, the Internet of things (IoT), or the like. The display apparatus 1 may be (part of) a wearable device, such as a smart watch, a watch phone, a glasses-type display, or a head mounted display (HMD). The display apparatus 1 may be (part of) a dashboard of a vehicle, a center fascia of a vehicle, a center information display (CID) arranged on a dashboard, a rear-view mirror display replacing a rear-view mirror of a vehicle, or a display arranged on a back surface of a front seat for providing information and entertainment for a back seat of a vehicle.

The display apparatus 1 may have a substantially rectangular shape in a plan view. The display apparatus 1 may have a short side in an x-direction and a long side in a y-direction. A corner where the short side in the x-direction and the long side in the y-direction meet may be rounded or may have a right angle. The display apparatus 1 have one or more of various shapes, such as another polygonal shape, an elliptical shape, and/or an irregular shape.

The display apparatus 1 may include an opening area OA (or first area or transmission area) and a display area DA (or second area) that at least surrounds the opening area OA. The display apparatus 1 may include a middle area MA (or third area or intermediate area) between the opening area OA and the display area DA, and a peripheral area PA (or fourth area) abutting and/or surrounding the display area DA. The middle area MA may have a closed-loop shape entirely surrounding the opening area OA in a plan view.

The opening area OA may be inside the display area DA. The opening area OA may be equidistant from two opposite long sides of the display area DA and closer to one of two opposite short sides of the display area DA, as shown in FIG. 1. The position of the opening area OA may vary according to embodiments. The opening area OA may be positioned near a corner of the display area DA. Although FIG. 1 illustrates one opening area OA, a plurality of opening areas OA may be provided.

Figure 2:
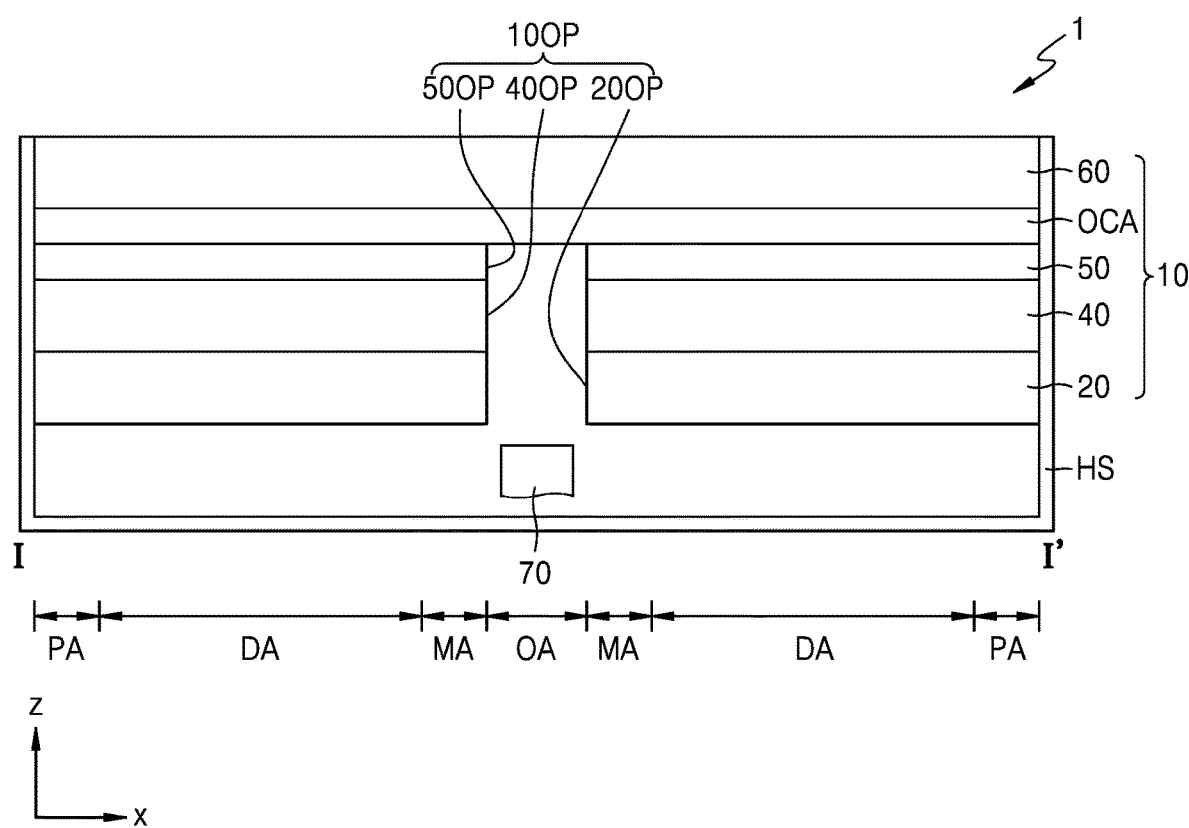
FIG. 2 is a schematic cross-sectional view of the display apparatus of FIG. 1 taken along line I-I' of FIG. 1, according to an embodiment.

FIG. 2 is a schematic cross-sectional view taken along line I-I' of FIG. 1 according to an embodiment.

Referring to FIG. 2, the display apparatus 1 may include a display panel 10 and a component 70. The component 70 may be arranged under the display panel 10, and the component 70 may by at least partially exposed by the opening area OA. The display panel 10 and the component 70 may be accommodated in a housing HS.

The display panel 10 may include an image generating layer 20, an input sensing layer 40, an optical functional layer 50, and a cover window 60, which are stacked in the z-direction.

The image generating layer 20 may include display elements (or light-emitting elements) that emit light to display an image. A display element may include a light-emitting diode, for example, an organic light-emitting diode including an organic emission layer. The light-emitting diode may be an inorganic light-emitting diode including an inorganic material. The inorganic light-emitting diode may include a PN junction diode including materials based on inorganic semiconductors. When a voltage is applied to the PN junction diode in a forward direction, holes and electrons are injected, and energy generated by recombination of the holes and electrons is converted into light energy to emit a certain color of light. The inorganic light-emitting diode may have a width in a range of several to several hundred micrometers, or several to several hundred nanometers. The image generating layer 20 may include a quantum dot light-emitting diode. For example, an emission layer of the image generating layer 20 may include an organic material, an inorganic material, a quantum dot, an organic material and a quantum dot, or an inorganic material and a quantum dot.

The input sensing layer 40 may obtain coordinate information according to an external input, for example, a touch event. The input sensing layer 40 may include a sensing electrode (or a touch electrode) and a trace line connected to the sensing electrode. The input sensing layer 40 may be on the image generating layer 20. The input sensing layer 40 may sense an external input in a mutual-capacitance method and/or a self-capacitance method.

The input sensing layer 40 may be directly formed on the image generating layer 20, or may be coupled to the image generating layer 20 through an adhesive layer such as an optical clear adhesive. The input sensing layer 40 may be immediately formed after an operation of forming the image generating layer 20, and no adhesive layer may be between the input sensing layer 40 and the image generating layer 20. FIG. 2 illustrates that the input sensing layer 40 is between the image generating layer 20 and the optical functional layer 50, but the input sensing layer 40 may be above the optical functional layer 50.

The optical functional layer 50 may include an anti-reflection layer. The anti-reflection layer may reduce the reflectance of external light incident from the outside toward the display panel 10 through the cover window 60. The anti-reflection layer may include a retarder and a polarizer. The anti-reflection layer may include a black matrix and color filters. The color filters may be arranged according to colors of light emitted from the light-emitting diodes of the image generating layer 20. The optical functional layer 50 may have a thickness of about 100 μm.

To improve the transmittance of the opening area OA, the display panel 10 may include an opening 10OP penetrating some of the layers constituting the display panel 10. The opening 10OP may include openings 20OP, 40OP, and 50OP respectively penetrating the image generating layer 20, the input sensing layer 40, and the optical functional layer 50. The opening 20OP of the image generating layer 20, the opening 40OP of the input sensing layer 40, and the opening 50OP of the optical functional layer 50 may be connected to form the opening 10OP of the display panel 10.

The cover window 60 may be above the optical functional layer 50. The cover window 60 may be coupled to the optical functional layer 50 through an adhesive layer, such as an optical clear adhesive (OCA), between the cover window 60 and the optical functional layer 50. The cover window 60 may cover the opening 20OP of the image generating layer 20, the opening 40OP of the input sensing layer 40, and the opening 50OP of the optical functional layer 50. Although not illustrated in FIG. 2, the OCA and/or the cover window 60 may also include an opening. The OCA may have a thickness of about 100 μm, and the cover window 60 may have a thickness of about 660 μm.

The cover window 60 may include a glass material or a plastic material. The glass material may include ultra-thin glass. The plastic material may include polyethersulfone, polyacrylate, polyetherimide, polyethylene naphthalate, polyethylene terephthalate, polyphenylene sulfide, polyarylate, polyimide, polycarbonate, cellulose acetate propionate, or the like.

The opening area OA may be a component area (e.g., a sensor area, a camera area, a speaker area, or the like) in which the component 70 for performing one or more function is positioned.

The component 70 may include an electronic element. The component 70 may be an electronic element using and/or generating light or sound. The electronic element may be/include an infrared sensor, a camera capturing an image by receiving light, a sensor outputting and sensing light or sound to measure a distance or recognize a fingerprint or the like, a small lamp outputting light, a speaker outputting sound, or the like. An electronic element using light may use light of one or more predetermined ranges of wavelengths such as visible light, infrared light, or ultraviolet light. The opening area OA may transmit light and/or sound output from the component 70 to the outside or traveled from the outside toward the electronic element.

Figure 3:
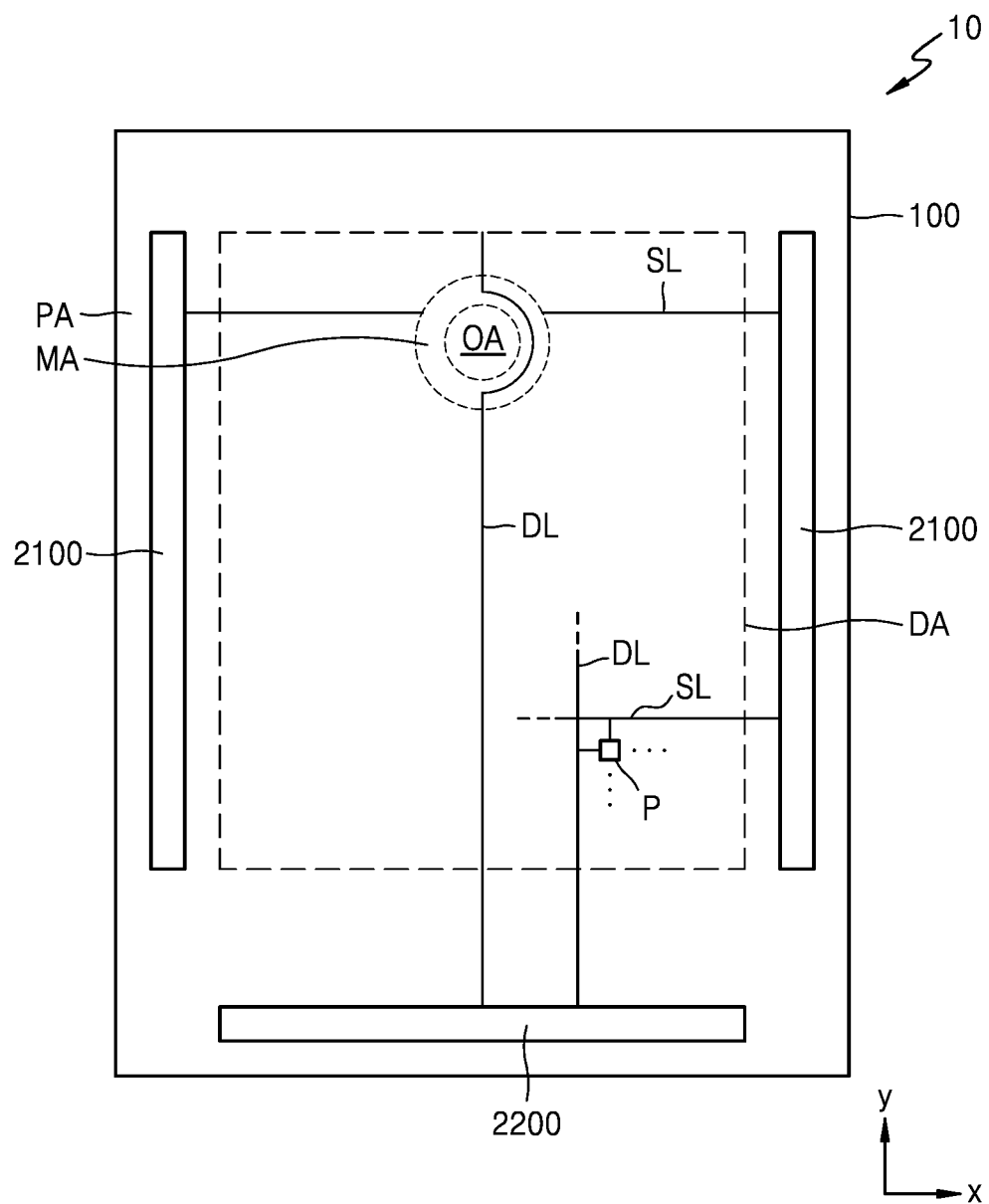
FIG. 3 is a schematic plan view of a display panel according to an embodiment.

FIG. 3 is a schematic plan view of the display panel 10 according to an embodiment.

Referring to FIG. 3, the display panel 10 may include the opening area OA, the display area DA, the middle area MA, and the peripheral area PA. A substrate 100 included in (the image generating layer 20 of) the display panel 10 may include areas corresponding to the opening area OA, the display area DA, the middle area MA, and the peripheral area PA.

The display panel 10 may include sub-pixels P in the display area DA, and the display panel 10 may display an image using light emitted from the sub-pixels P. Each sub-pixel P may emit red, green, or blue light using a light-emitting diode. The light-emitting diode of each sub-pixel P may be connected to a scan line SL and a data line DL.

A scan driver 2100 (providing scan signals to sub-pixels P) and a data driver 2200 (providing data signals to sub-pixels P) may be arranged in the peripheral area PA. A first main power supply line (not shown) and a second main power supply line (not shown) (respectively providing a first power supply voltage and a second power supply voltage) may be arranged in the peripheral area PA. Two scan drivers 2100 may be respectively arranged at two opposite sides of the display area DA. Sub-pixels P arranged on the left side with respect to the opening area OA may be connected to the scan driver 2100 on the left side, and sub-pixels P arranged on the right side with respect to the opening area OA may be connected to the scan driver 2100 on the right side.

The middle area MA may surround the opening area OA. The middle area MA may accommodate no display elements (e.g., no light-emitting diodes. Signal lines providing signals to sub-pixels P around the opening area OA may bypass the middle area MA. For example, data lines DL and/or scan lines SL may be positioned in the display area DA, and some of the data lines DL and/or the scan lines SL may be partially positioned in the middle area MA along an edge of the opening 10OP of the display panel 10 formed in the opening area OA. Data lines DL may extend lengthwise generally in a y-direction, and some of the data lines DL are partially positioned in the middle area MA and may partially surround the opening area OA. Scan lines SL may extend lengthwise generally in an x-direction. The opening area OA may be positioned between two scan lines that are spaced from each other and aligned with each other in the x-direction.

FIG. 3 illustrates that the data driver 2200 is arranged on the substrate 100. The data driver 2200 may be arranged on a printed circuit board electrically connected to a pad arranged on the display panel 10. The printed circuit board may be flexible, and a portion of the printed circuit board may be bent to be positioned under a rear surface of the substrate 100.

Figure 4:
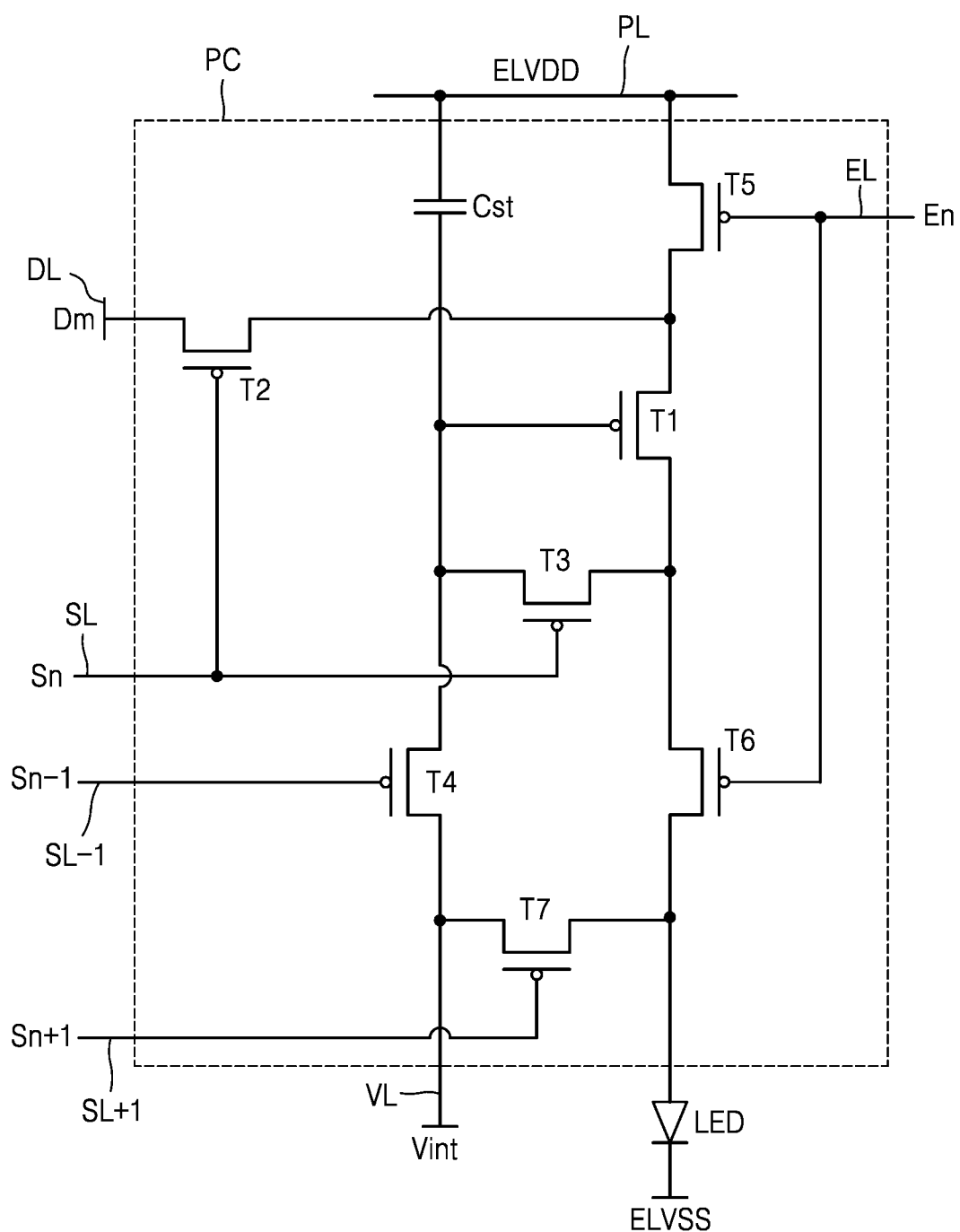
FIG. 4 is a schematic equivalent circuit diagram illustrating a light-emitting diode and a circuit connected to the light-emitting diode according to an embodiment.

FIG. 4 is a schematic equivalent circuit diagram illustrating a light-emitting diode LED and a pixel circuit PC electrically connected to the light-emitting diode LED according to an embodiment.

Referring to FIG. 4, a sub-pixel P described with reference to FIG. 3 may include the light-emitting diode LED and the pixel circuit PC.

The pixel circuit PC may include a first transistor T1, a second transistor T2, a third transistor T3, a fourth transistor T4, a fifth transistor T5, a sixth transistor T6, a seventh transistor T7, and a storage capacitor Cst.

The second transistor T2 is a switching thin-film transistor which may be connected to the scan line SL and the data line DL and configured to deliver, to the first transistor T1, a data voltage (or a data signal Dm) input from the data line DL based on a switching voltage (or a switch signal Sn) input from the scan line SL. The storage capacitor Cst may be connected to the second transistor T2 and a driving voltage line PL and store a voltage corresponding to a difference between a voltage received from the second transistor T2 and a first power supply voltage ELVDD supplied to the driving voltage line PL.

The first transistor T1 is a driving thin-film transistor which may be connected to the driving voltage line PL and the storage capacitor Cst and control a driving current flowing from the driving voltage line PL through the light-emitting diode LED in accordance with a voltage value stored in the storage capacitor Cst. The light-emitting diode LED may emit light having certain brightness according to the driving current. A second electrode (for example, a cathode) of the light-emitting diode LED may receive a second power supply voltage ELVSS.

The third transistor T3 is a compensating thin-film transistor, and a gate electrode of the third transistor T3 may be connected to the scan line SL. A source electrode (or a drain electrode) of the third transistor T3 may be connected to a first electrode (e.g., an anode) of the light-emitting diode LED via the sixth transistor T6 while being connected to a drain electrode (or a source electrode) of the first transistor T1. The drain electrode (or the source electrode) of the third transistor T3 may be connected to any one electrode of the storage capacitor Cst, a source electrode (or a drain electrode) of the fourth transistor T4, and a gate electrode of the first transistor T1. The third transistor T3 is turned on according to the scan signal Sn received through the scan line SL and connects the gate electrode and the drain electrode of the first transistor T1 to each other to diode-connect the first transistor T1.

The fourth transistor T4 is an initialization thin-film transistor, and a gate electrode thereof may be connected to a previous scan line SL-1. A drain electrode (or a source electrode) of the fourth transistor T4 may be connected to an initialization voltage line VL. The source electrode (or the drain electrode) of the fourth transistor T4 may be connected to any one electrode of the storage capacitor Cst, the drain electrode (or the source electrode) of the third transistor T3, and the gate electrode of the first transistor T1. The fourth transistor T4 may be turned on according to a previous scan signal Sn-1 received through the previous scan line SL-1 and configured to transmit an initialization voltage Vint to the gate electrode of the first transistor T1 to perform an initialization operation for initializing a voltage of the gate electrode of the first transistor T1.

The fifth transistor T5 is an operation-control thin-film transistor, and a gate electrode thereof may be connected to an emission control line EL. A source electrode (or a drain electrode) of the fifth transistor T5 may be connected to the driving voltage line PL. The drain electrode (or the source electrode) of the fifth transistor T5 may be connected to the source electrode (or the drain electrode) of the first transistor T1 and a drain electrode (or a source electrode) of the second transistor T2.

The sixth transistor T6 is an emission-control thin-film transistor, and a gate electrode thereof may be connected to the emission control line EL. A source electrode (or a drain electrode) of the sixth transistor T6 may be connected to the drain electrode (or the source electrode) of the first transistor T1 and the source electrode (or the drain electrode) of the third transistor T3. The drain electrode (or the source electrode) of the sixth transistor T6 may be electrically connected to the first electrode of the light-emitting diode LED. The fifth transistor T5 and the sixth transistor T6 are simultaneously turned on according to an emission control signal En received through the emission control line EL, the first power supply voltage ELVDD is transferred to the light-emitting diode LED, and the driving current flows through the light-emitting diode LED.

The seventh transistor T7 may be an initialization thin-film transistor initializing the first electrode of the light-emitting diode LED. A gate electrode of the seventh transistor T7 may be connected to a following scan line SL+1. A source electrode (or a drain electrode) of the seventh transistor T7 may be connected to the first electrode of the light-emitting diode LED. The drain electrode (or the source electrode) of the seventh transistor T7 may be connected to the initialization voltage line VL. The seventh transistor T7 may be turned on according to a following scan signal Sn+1 received through the following scan line SL+1 to initialize the first electrode of the light-emitting diode LED.

Although FIG. 4 illustrates that the fourth transistor T4 and the seventh transistor T7 are respectively connected to the previous scan line SL-1 and the following scan line SL+1. Both the fourth transistor T4 and the seventh transistor T7 may be connected to the previous scan line SL-1 to be driven by the previous scan signal Sn-1.

One electrode of the storage capacitor Cst may be connected to the driving voltage line PL. The other one electrode of the storage capacitor Cst may be connected to the gate electrode of the first transistor T1, the drain electrode (or the source electrode) of the third transistor T3, and the source electrode (or the drain electrode) of the fourth transistor T4.

The second electrode of the light-emitting diode LED may receive the second power supply voltage ELVSS. The light-emitting diode LED may receive the driving current from the first transistor T1 to emit light.

All of the first to seventh transistors T1 to T7 may include a semiconductor layer including silicon.

At least one of the first to seventh transistors T1 to T7 may include a semiconductor layer including an oxide, and the others may include a semiconductor layer including silicon. The first transistor T1 that directly affects the brightness of the display panel 10 may include a silicon semiconductor including polycrystalline silicon having high reliability, thereby realizing the display panel 10 having high resolution.

Because an oxide semiconductor has high carrier mobility and low leakage current, a voltage drop is not large even when a driving time is long. That is, because color change of an image according to a voltage drop is not large even during low-frequency driving, the low-frequency driving is possible. For an oxide semiconductor, because a leakage current is small, at least one of the third transistor T3 and the fourth transistor T4 connected to the gate electrode of the first transistor T1 may be employed as an oxide semiconductor, so that a leakage current that may flow to the gate electrode of the first transistor T1 may be prevented, and power consumption may be reduced. A signal line and/or a voltage line may be also added to the pixel circuit PC of FIG. 4. Other transistors other than the third transistor T3 and the fourth transistor T4 may include a semiconductor layer including an oxide. The seventh transistor T7 may include a semiconductor layer include an oxide semiconductor.

Figure 5:
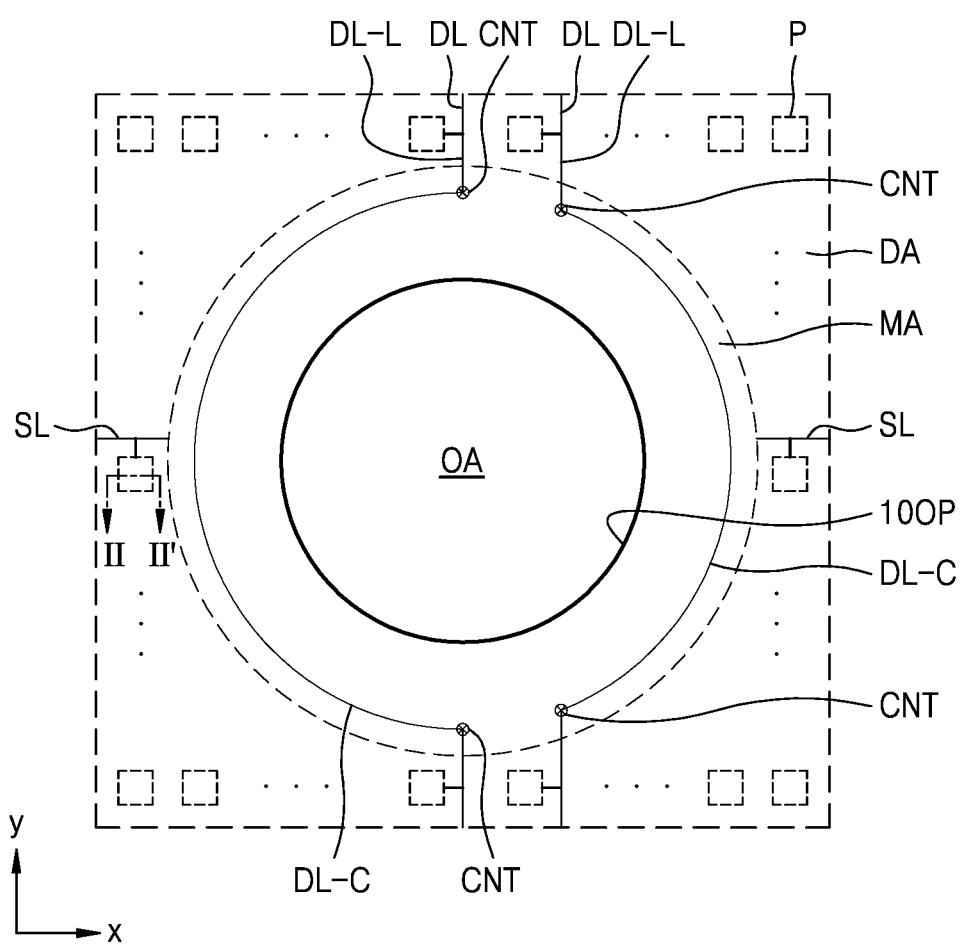
FIG. 5 is a schematic plan view of a portion of a display panel according to an embodiment.

FIG. 5 is a schematic plan view of a portion of a display panel according to an embodiment.

Referring to FIG. 5, the sub-pixels P may be in the display area DA. The middle area MA may be between the opening area OA and the display area DA. Sub-pixels P adjacent to the opening area OA may be spaced from each other around the opening area OA in a plan view. The opening area OA may be positioned between sub-pixels P in the y-direction and in the x-direction. Each sub-pixel P may include a light-emitting diode.

Signal lines adjacent to the opening area OA may bypass the opening area OA and/or the opening 10OP. Some bypassing data lines DL among the data lines DL may provide data signals to sub-pixels P arranged at opposite sides of the opening area OA, and the opening area OA may be positioned between the sub-pixels P in the y direction.

Bypassing sections of the bypassing data lines DL may bypass an edge of the opening area OA and/or the opening 1OOP and may be positioned in the middle area MA.

A bypassing portion/section DL-C of a data line DL (in the middle area MA) and an extending portion/section DL-L of the data line (substantially in the display area DA) are in two different conductive layers, and the bypassing portion DL-C and the extending portion DL-L of the data line DL may be connected through a contact hole CNT. The bypass portion DL-C and the extending portion DL-L may be in the same conductive layer and may be integrally formed.

Opposite scan lines SL may be spaced from each other by the opening area OA. Scan lines SL arranged on the left side relative to the opening area OA may receive a signal from the scan driver 2100 arranged on the left side of the display area DA, and the scan line SL arranged on the right side relative to the opening area OA may receive a signal from the scan driver 2100 arranged on the right side of the display area DA shown in FIG. 3. Some bypassing scan lines SL among the scan lines SL may provide scan signals to sub-pixels P arranged on opposite sides of the opening area OA; the opening area OA may be between the sub-pixels P in the x-direction. Sections of the bypassing scan lines SL may bypass an edge of the opening area OA and/or the opening 1OOP and may be positioned in the middle area MA.

Figure 6:
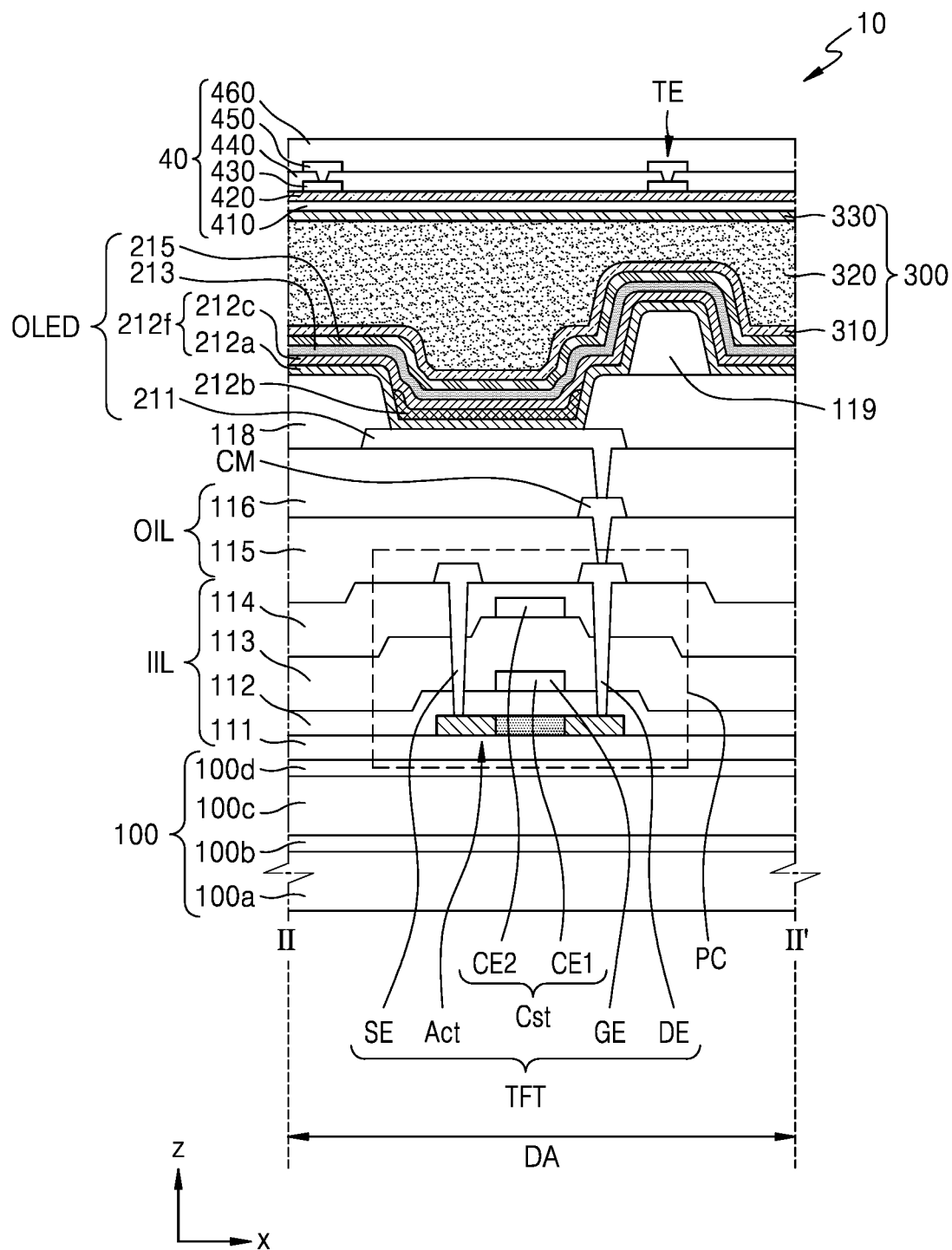
FIG. 6 is a cross-sectional view taken along line II-II' of FIG. 5 according to an embodiment.

FIG. 6 is a cross-sectional view taken along line II-II' of FIG. 5 according to an embodiment.

Referring to FIG. 6, the display panel 10 may include the substrate 100, an inorganic insulating layer IIL, an organic insulating layer OIL, the pixel circuit PC, a connection electrode CM, an organic light-emitting diode OLED, a pixel defining film 118, a spacer 119, and an encapsulation layer 300. The substrate 100, the inorganic insulating layer IIL, the organic insulating layer OIL, the pixel circuit PC, the connection electrode CM, the organic light-emitting diode OLED, the pixel defining layer 118, the spacer 119, and the encapsulation layer 300 may be arranged in the display area DA of the display panel 10.

The substrate 100 may include a first base layer 100a, a first barrier layer 100b, a second base layer 100c, and a second barrier layer 100d. The first base layer 100a, the first barrier layer 100b, the second base layer 100c, and the second barrier layer 100d may be sequentially stacked in the z-direction.

At least one of the first base layer 100a and the second base layer 100c may include a polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate.

The first barrier layer 100b and the second barrier layer 100d may prevent penetration of external foreign substances, and may be a single layer or a multi-layer structure, each including an inorganic material such as silicon nitride ($SiN_x$), silicon oxide ($SiO_x$), and/or silicon oxynitride (SiON).

The inorganic insulating layer IIL may be arranged on the substrate 100. The inorganic insulating layer IIL may include a buffer layer 111, a first gate insulating layer 112, a second gate insulating layer 113, and an interlayer insulating layer 114. The pixel circuit PC may be arranged in the display area DA. The pixel circuit PC may include a thin-film transistor TFT and a storage capacitor Cst.

The buffer layer 111 may be arranged on the substrate 100. The buffer layer 111 may include an inorganic insulating material such as silicon nitride ($SiN_x$), silicon oxynitride (SiON), and silicon oxide ($SiO_2$), and may include a single layer or a multi-layer structure.

The thin-film transistor TFT may include a semiconductor layer Act, a gate electrode GE, a source electrode SE, and a drain electrode DE. The semiconductor layer Act may be arranged on the buffer layer 111. The semiconductor layer Act may include polysilicon. The semiconductor layer Act may include amorphous silicon, an oxide semiconductor, an organic semiconductor, or the like. The semiconductor layer Act may include a channel area, a drain area, and a source area, the drain area and the source area being respectively arranged on two opposite sides of the channel area.

The gate electrode GE may overlap the channel area. The gate electrode GE may include a low-resistance metal material. The gate electrode GE may include a conductive material including molybdenum (Mo), aluminum (Al), copper (Cu), titanium (Ti), or the like, and may include a multi-layer structure or a single layer.

The first gate insulating layer 112 between the semiconductor layer Act and the gate electrode GE may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_X$). The zinc oxide ($ZnO_X$) may include zinc oxide (ZnO) and/or zinc peroxide ($ZnO_2$).

The second gate insulating layer 113 may cover the gate electrode GE. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_X$). The zinc oxide ($ZnO_X$) may include zinc oxide (ZnO) and/or zinc peroxide ($ZnO_2$).

An upper electrode CE2 of the storage capacitor Cst may be arranged on the second gate insulating layer 113. The upper electrode CE2 may overlap the gate electrode GE. The gate electrode GE and the upper electrode CE2, which overlap each other and are separated by the second gate insulating layer 113, may form the storage capacitor Cst. The gate electrode GE may function as a lower electrode CE1 of the storage capacitor Cst.

The storage capacitor Cst and the thin-film transistor TFT may overlap each other. The storage capacitor Cst may not overlap the thin-film transistor TFT.

The upper electrode CE2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may include a single layer or a multi-layer structure.

The interlayer insulating layer 114 may cover the upper electrode CE2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_X$), or the like. The zinc oxide ($ZnO_X$) may include zinc oxide (ZnO) and/or zinc peroxide ($ZnO_2$). The interlayer insulating layer 114 may include a single layer or a multi-layer structure.

Each of the drain electrode DE and the source electrode SE may be arranged on the interlayer insulating layer 114. Each of the drain electrode DE and the source electrode SE may be connected to the semiconductor layer Act through contact holes included in the first gate insulating layer 112, the second gate insulating layer 113, and the interlayer insulating layer 114. The drain electrode DE and the source electrode SE may include a material having good conductivity. The drain electrode DE and the source electrode SE may include a conductive material including Mo, Al, Cu, Ti, or the like, and may include a multi-layer structure or a single layer. The drain electrode DE and the source electrode SE may have a multi-layered structure of Ti—Al—Ti.

The organic insulating layer OIL may be arranged on the inorganic insulating layer IIL. The organic insulating layer OIL may include a first organic insulating layer 115 and a second organic insulating layer 116. The first organic insulating layer 115 may cover the drain electrode DE and the source electrode SE. The first organic insulating layer 115 may include a general commercial polymer such as poly (methyl methacrylate) (PMMA) or polystyrene (PS), a polymer derivative having a phenol group, and/or an organic insulating material such as an acrylic polymer, an imide polymer, an aryl ether polymer, an amide polymer, a fluorine polymer, a p-xylene polymer, and/or a vinyl alcohol polymer.

The connection electrode CM may be arranged on the first organic insulating layer 115. The connection electrode CM may be connected to the drain electrode DE or the source electrode SE through a contact hole of the first organic insulating layer 115. The connection electrode CM may include a material having good conductivity. The connection electrode CM may include a conductive material including Mo, Al, Cu, Ti, or the like, and may include a multi-layer or a single layer. The connection electrode CM may have a multi-layered structure of Ti—Al—Ti.

The second organic insulating layer 116 may cover the connection electrode CM. The second organic insulating layer 116 may include a polymer such as poly(methyl methacrylate) (PMMA) or polystyrene (PS), a polymer derivative having a phenol group, and/or an organic insulating material such as an acrylic polymer, an imide polymer, an aryl ether polymer, an amide polymer, a fluorine polymer, a p-xylene polymer, and/or a vinyl alcohol polymer.

A light-emitting diode may be on the second organic insulating layer 116. The organic light-emitting diode OLED may be on the second organic insulating layer 116. Although not illustrated in FIG. 6, an inorganic light-emitting diode or the like may be on the second organic insulating layer 116.

The organic light-emitting diode OLED may be on the second organic insulating layer 116. The organic light-emitting diode OLED may emit red, green, or blue light, or may emit red, green, blue, or white light. The organic light-emitting diode OLED may include a first electrode 211, an emission layer 212b, a functional layer 212f, a second electrode 213, and a capping layer 215. The first electrode 211 may be a pixel electrode (e.g., an anode) of the organic light-emitting diode OLED, and the second electrode 213 may be an opposite electrode (e.g., a cathode) of the organic light-emitting diode OLED.

The first electrode 211 may be on the second organic insulating layer 116. The first electrode 211 may be electrically connected to the connection electrode CM through a contact hole positioned in the second organic insulating layer 116. The first electrode 211 may include a conductive oxide material such as indium tin oxide (ITO), indium zinc oxide (IZO), zinc oxide (ZnO), indium oxide ($In_2O_3$), indium gallium oxide (IGO), or aluminum zinc oxide (AZO). The first electrode 211 may include a reflective film including Ag, Mg, Al, Pt, Pd, Au, Ni, Nd, Ir, and/or Cr. The first electrode 211 may further include a film including ITO, IZO, ZnO, or $In_2O_3$ above/below the reflective film. The first electrode 211 may have a multi-layered structure of ITO-Ag-ITO.

The pixel defining film 118 may have an opening exposing at least a portion of the first electrode 211. The opening of the pixel defining film 118 may define an emission area of light emitted from the organic light-emitting diode OLED. A width of the opening may equal to a width of the emission area.

The pixel defining film 118 may include an organic insulating material. The pixel defining film 118 may include an inorganic insulating material such as silicon nitride, silicon oxynitride, or silicon oxide. The pixel defining film 118 may include an organic insulating material and an inorganic insulating material. The pixel defining film 118 may include a light-blocking material and may be provided in black. The light-blocking material may include carbon black, carbon nanotubes, a resin or paste including a black dye, metal particles such as nickel, aluminum, and/or molybdenum, metal oxide particles (e.g., chromium oxide), metal nitride particles (e.g., chromium nitride), or the like. When the pixel defining film 118 includes a light-blocking material, reflection of external light by metal structures on a lower portion of the pixel defining film 118 may be reduced.

A spacer 119 may be arranged on the pixel defining film 118. The spacer 119 may include an organic insulating material such as polyimide. The spacer 119 may include an inorganic insulating material such as silicon nitride ($SiN_X$) or silicon oxide ($SiO_2$), or may include an organic insulating material and an inorganic insulating material.

The spacer 119 may include the same material as that of the pixel defining film 118. The pixel defining film 118 and the spacer 119 may be formed together in a mask operation using a halftone mask or the like. The spacer 119 may include a material different from that of the pixel defining film 118.

The emission layer 212b may be in the opening of the pixel defining film 118. The emission layer 212b may include a polymer organic material or a low-molecular-weight organic material which emits light of a certain color.

The functional layer 212f may include at least one of a first functional layer 212a (between the first electrode 211 and the emission layer 212b) and a second functional layer 212c (between the emission layer 212b and the second electrode 213). The first functional layer 212a may be between the first electrode 211 and the emission layer 212b, and the second functional layer 212c may be between the emission layer 212b and the second electrode 213. The first functional layer 212a between the first electrode 211 and the emission layer 212b may be optional, and the second functional layer 212c may be between the emission layer 212b and the second electrode 213. The first functional layer 212a may be between the first electrode 211 and the emission layer 212b, and the second functional layer 212c may be between the emission layer 212b and the second electrode 213.

The first functional layer 212a may include a hole transport layer (HTL), or an HTL and a hole injection layer (HIL). The second functional layer 212c may include an electron transport layer (ETL) and/or an electron injection layer (EIL). Similar to the second electrode 213, the first functional layer 212a and/or the second functional layer 212c may substantially or entirely cover a face of the substrate 100.

The second electrode 213 may include a conductive material having a low work function. The second electrode 213 may include a (semi)transparent layer including Ag, Mg, Al, Pt, Pd, Au, Ni, Nd, Ir, Cr, lithium (Li), and/or Ca. The second electrode 213 may further include a layer of ITO, IZO, ZnO, or $In_2O_3$ above the (semi)transparent layer.

The capping layer 215 may be on the second electrode 213. The capping layer 215 may include lithium fluoride (LiF), an inorganic material, and/or an organic material.

The encapsulation layer 300 may cover the organic light-emitting diode OLED. The encapsulation layer 300 may be on the second electrode 213 and/or the capping layer 215. The encapsulation layer 300 may include at least one inorganic film layer and at least one organic film layer. FIG. 6 illustrates that the encapsulation layer 300 includes a first inorganic film layer 310, an organic film layer 320, and a second inorganic film layer 330, which are sequentially stacked.

The first inorganic film layer 310 and the second inorganic film layer 330 may each include one or more inorganic materials such as aluminum oxide, titanium oxide, tantalum oxide, hafnium oxide, zinc oxide, silicon oxide, silicon nitride, and/or silicon oxynitride. Each of the first inorganic film layer 310 and the second inorganic film layer 330 may be a single layer or a multi-layer structure. The organic film layer 320 may include a polymer-based material. The polymer-based material may include an acrylic resin, an epoxy resin, polyimide, polyethylene, or the like. The organic film layer 320 may include acrylate.

The thickness of the first inorganic film layer 310 and the thickness of the second inorganic film layer 330 may be different from (i.e., unequal to) each other. The thickness of the first inorganic film layer 310 may be greater than the thickness of the second inorganic film layer 330. The thickness of the second inorganic film layer 330 may be greater than the thickness of the first inorganic film layer 310. The first inorganic film layer 310 and the second inorganic film layer 330 may have the same thickness.

The input sensing layer 40 may be on the encapsulation layer 300. The input sensing layer 40 may include a first touch insulating layer 410, a second touch insulating layer 420, a first conductive layer 430, a third touch insulating layer 440, a second conductive layer 450, and a planarization layer 460.

The first touch insulating layer 410 may be on the second inorganic film layer 330, and the second touch insulating layer 420 may be on the first touch insulating layer 410. The first touch insulating layer 410 and the second touch insulating layer 420 may each include an inorganic insulating material and/or an organic insulating material. The first touch insulating layer 410 and the second touch insulating layer 420 may each include an inorganic insulating material such as silicon oxide, silicon nitride, and/or silicon oxynitride.

At least one of the first touch insulating layer 410 and the second touch insulating layer 420 may be optional. The first touch insulating layer 410 may be optional. The second touch insulating layer 420 may be on the second inorganic film layer 330, and the first conductive layer 430 may be on the second touch insulating layer 420.

The first conductive layer 430 may be on the second touch insulating layer 420, and the third touch insulating layer 440 may be on the first conductive layer 430. The third touch insulating layer 440 may include an inorganic insulating material and/or an organic insulating material. The third touch insulating layer 440 may include an inorganic insulating material such as silicon oxide, silicon nitride, and/or silicon oxynitride.

The second conductive layer 450 may be on the third touch insulating layer 440. A touch electrode TE of the input sensing layer 40 may include a structure in which the first conductive layer 430 and the second conductive layer 450 are connected. The touch electrode TE may be formed on one of the first conductive layer 430 and the second conductive layer 450, and may include a metal line provided in the corresponding conductive layer. The first conductive layer 430 and the second conductive layer 450 may each include at least one of Al, Cu, Ti, Mo, and ITO, and may include a single layer or a multi-layer structure. The first conductive layer 430 and the second conductive layer 450 may each have a three-layer structure of a titanium layer, an aluminum layer, and a titanium layer sequentially stacked.

The planarization layer 460 may cover the second conductive layer 450. The planarization layer 460 may include an organic insulating material.

Figure 7:
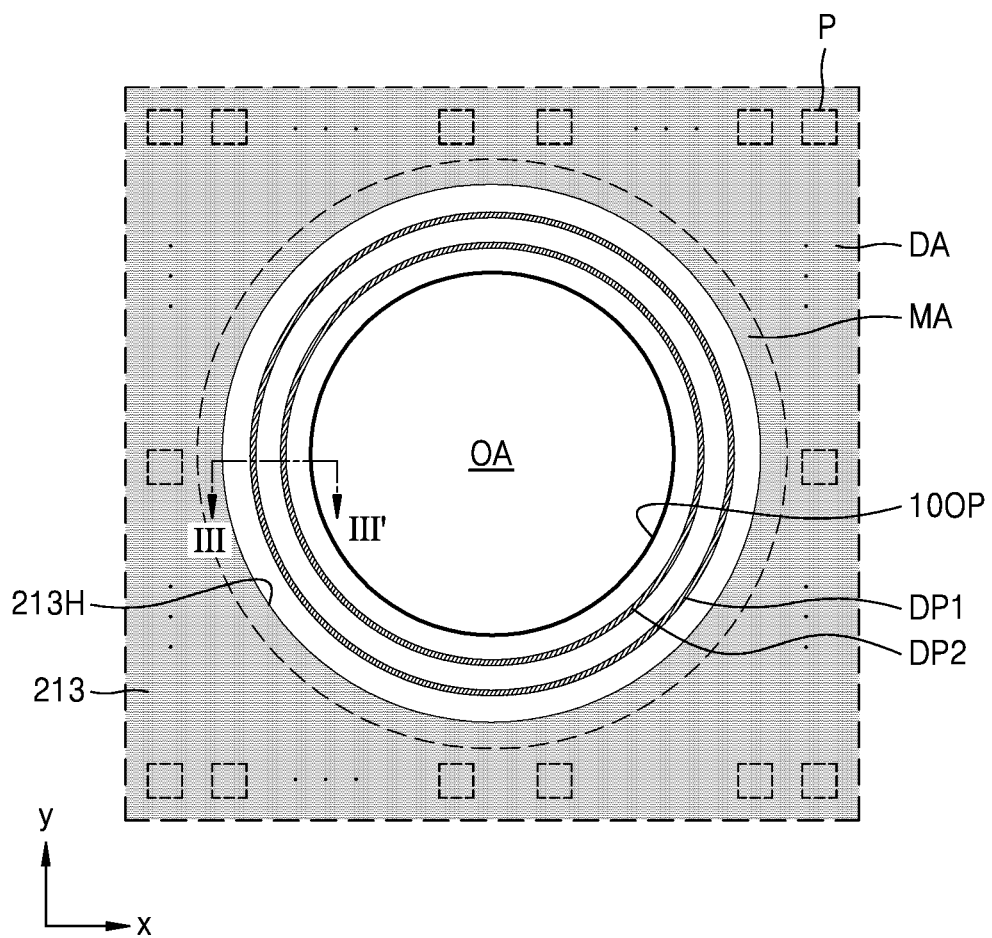
FIG. 7 is a schematic plan view of a portion of a display panel according to an embodiment.

FIG. 7 is a schematic plan view of a portion of a display panel according to an embodiment. The data line DL, the scan line SL, or the like shown in FIG. 5 may also be arranged in the display panel of FIG. 7.

Referring to FIG. 7, a first dam portion DP1 and a second dam portion DP2 may be in the middle area MA. Each of the first dam portion DP1 and the second dam portion DP2 may have a closed-loop shape/structure surrounding the opening area OA in a plan view. In a plan view, the first dam portion DP1 and the second dam portion DP2 may be spaced from each other.

The first dam portion DP1 may be between the display area DA and the opening area OA, and the second dam portion DP2 may be between the first dam portion DP1 and the opening area OA. The second dam portion DP2 may be positioned closer to the opening area OA than the first dam portion DP1.

Although FIG. 7 illustrates that two dam portions (the first and second dam portions DP1 and DP2) are arranged in the middle area MA. One dam portion may be arranged in the middle area MA. Two or more dam portions may be arranged in the middle area MA.

Figure 8:
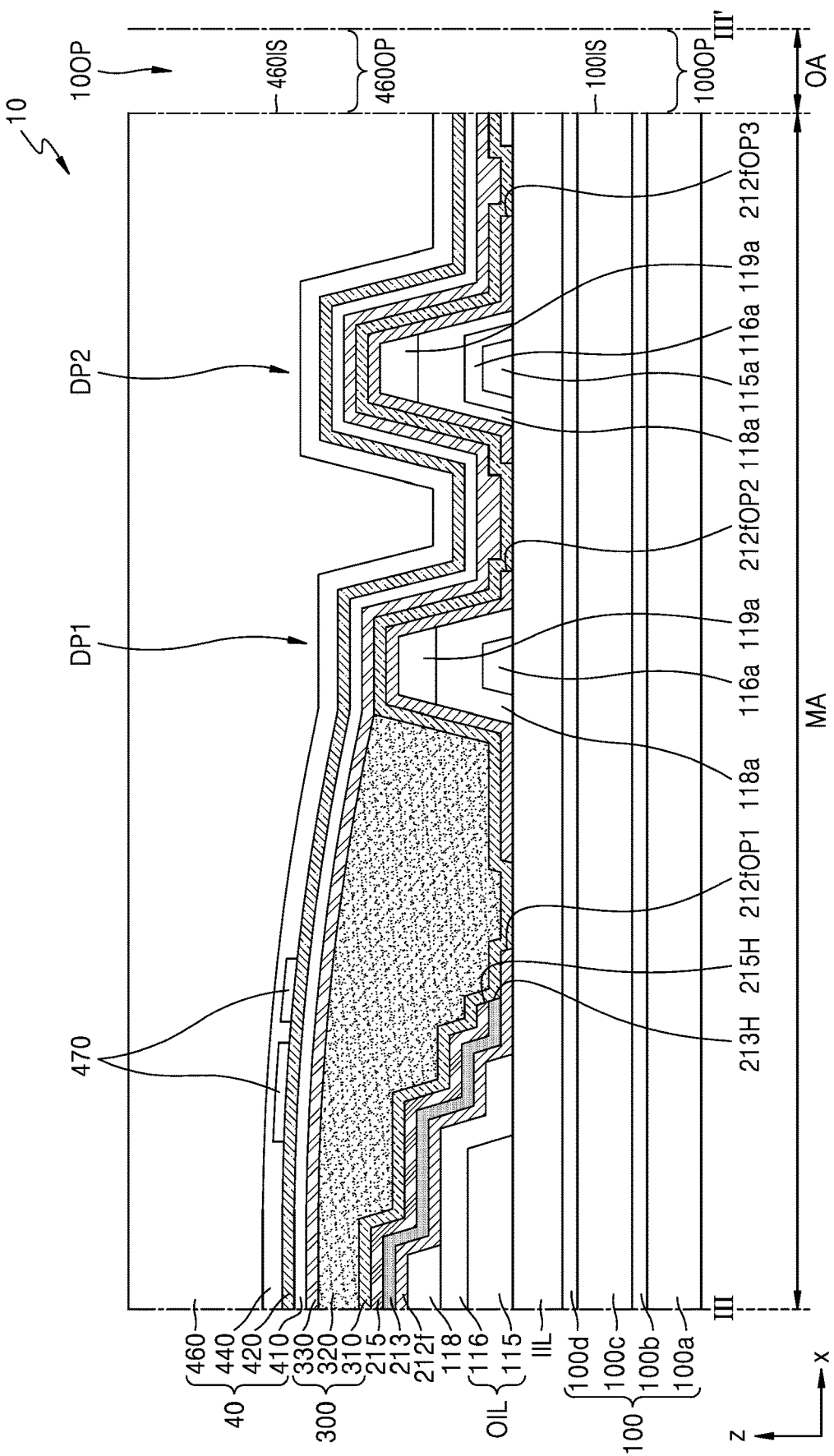
FIG. 8 is a cross-sectional view taken along line III-III' of FIG. 7, according to an embodiment.

FIG. 8 is a cross-sectional view of the display panel 10 taken along line III-III' of FIG. 7 according to an embodiment. FIG. 8 is a diagram for explaining components arranged in the middle area MA. Some elements shown in FIG. 8 have been described with reference to FIG. 6.

Referring to FIG. 8, the first base layer 100a, the first barrier layer 100b, the second base layer 100c, and the second barrier layer 100d may be sequentially stacked. Each of the first base layer 100a, the first barrier layer 100b, the second base layer 100c, and the second barrier layer 100d may continuously extend from a display area (DA of FIG. 6) to the opening area OA.

The inorganic insulating layer IIL may be on the substrate 100. The inorganic insulating layer IIL is in the display area (DA of FIG. 6), but the inorganic insulating layer IIL may extend from the display area DA to the middle area MA. The inorganic insulating layer IIL may include a buffer layer (111 of FIG. 6), a first gate insulating layer (112 of FIG. 6), a second gate insulating layer (113 of FIG. 6), and an interlayer insulating layer (114 of FIG. 6). At least one of the buffer layer 111, the first gate insulating layer 112, the second gate insulating layer 113, and the interlayer insulating layer 114 may not be present in the middle area MA.

The organic insulating layer OIL may be on the inorganic insulating layer IIL. The organic insulating layer OIL is substantially in the display area (DA of FIG. 6) and may extend from the display area DA to the middle area MA. The organic insulating layer OIL may include the first organic insulating layer 115 and the second organic insulating layer 116. The second organic insulating layer 116 may cover a side surface of the first organic insulating layer 115. The second organic insulating layer 116 may expose the side surface of the first organic insulating layer 115.

The pixel defining film 118 may be on the second organic insulating layer 116. The pixel defining film 118 is substantially in the display area (DA of FIG. 6) and may extend from the display area DA to the middle area MA.

The first dam portion DP1 and the second dam portion DP2 may be positioned in the middle area MA. The first dam portion DP1 and the second dam portion DP2 may be on an upper surface of the inorganic insulating layer IIL. The first dam portion DP1 and the second dam portion DP2 may be on an upper surface of the interlayer insulating layer (114 of FIG. 6). The first dam portion DP1 and the second dam portion DP2 may be on an upper surface of the buffer layer (111 of FIG. 6), an upper surface of the first gate insulating layer (112 of FIG. 6), or an upper surface of the second gate insulating layer (113 of FIG. 6).

The first dam portion DP1 and the second dam portion DP2 may include stacked layers. The first dam portion DP1 may include a second organic pattern layer 116a, a third organic pattern layer 118a, and a fourth organic pattern layer 119a. The second dam portion DP2 may include a first organic pattern layer 115a, a second organic pattern layer 116a, a third organic pattern layer 118a, and a fourth organic pattern layer 119a. The first dam portion DP1 may include a first organic pattern layer 115a.

Because the first dam portion DP1 includes three organic pattern layers, and because the second dam portion DP2 includes four organic pattern layers, the height of the second dam portion DP2 may be greater than the height of the first dam portion DP1. The height of the second dam portion DP2 from the upper surface of the inorganic insulating layer IIL may be greater than the height of the first dam portion DP1.

The first organic pattern layer 115a may be separated from the first organic insulating layer 115. The first organic pattern layer 115a may include the same material as that of the first organic insulating layer 115.

The second organic pattern layer 116a may be separated from the second organic insulating layer 116. The second organic pattern layer 116a may include the same material as that of the second organic insulating layer 116.

The third organic pattern layer 118a may be on the second organic pattern layer 116a. The third organic pattern layer 118a may be on an upper surface of the second organic pattern layer 116a. The third organic pattern layer 118a may be separated from the pixel defining film 118. The third organic pattern layer 118a may include the same material as that of the pixel defining film 118.

The fourth organic pattern layer 119a may be on the third organic pattern layer 118a. The fourth organic pattern layer 119a may be separated from the spacer 119. The fourth organic pattern layer 119a may include the same material as that of the spacer 119.

The functional layer 212f may be in the middle area MA. The functional layer 212f is substantially in the display area (DA of FIG. 6) and may extend from the display area DA to the middle area MA. The functional layer 212f may include at least one of the first functional layer 212a and the second functional layer 212c described above with reference to FIG. 6.

The functional layer 212f may have discontinuities in the middle area MA. The functional layer 212f may include at least one opening (e.g., one or more of openings 212fOP1, 212fOP2, and 212fOP3) positioned in the middle area MA.

After forming a sacrificial layer on the inorganic insulating layer IIL and forming the functional layer 212f on the sacrificial layer, portions of the functional layer 212f formed on the sacrificial layer may also be removed in an operation of removing the sacrificial layer by irradiating a laser on a rear surface of the substrate 100, and the first to third openings 212fOP1, 212fOP2, and 212fOP3 may be formed in the functional layer 212f.

The at least one opening (e.g., the first to third openings 212fOP1, 212fOP2, and 212fOP3) of the functional layer 212f may be on the inorganic insulating layer IIL. The functional layer 212f is on the upper surface of the inorganic insulating layer IIL, and the upper surface of the inorganic insulating layer IIL may be exposed through the at least one opening of the functional layer 212f.

The functional layer 212f may include the first opening 212fOP1, the second opening 212fOP2, and the third opening 212fOP3. The first opening 212fOP1 may be between a display area (DA of FIG. 7) and the first dam portion DP1, the second opening 212fOP2 may be between the first dam portion DP1 and the second dam portion DP2, and the third opening 212fOP3 may be between the second dam portion DP2 and the opening area OA. The first opening 212fOP1 and the second opening 212fOP2 may be between the display area (DA of FIG. 7) and the first dam portion DP1, and the third opening 212fOP3 may be between the second dam portion DP2 and the opening area OA. The first opening 212fOP1 may be between the display area (DA of FIG. 7) and the first dam portion DP1, and/or the second opening 212fOP2 and the third opening 212fOP3 may be between the second dam portion DP2 and the opening area OA.

FIG. 8 illustrates that three openings are formed in the functional layer 212f. One opening, two openings, or four or more openings may be formed in the functional layer 212f.

Potential penetration (or diffusion) of oxygen or moisture in the vicinity of the opening area OA into a light-emitting diode of the display area DA may be prevented or minimized by the at least one opening in the functional layer 212f.

The second electrode 213 and the capping layer 215 may be in the middle area MA. The second electrode 213 and the capping layer 215 are substantially in the display area (DA of FIG. 6) and may extend from the display area DA to the middle area MA.

The second electrode 213 and the capping layer 215 may have ends/edges that are positioned in the middle area MA. The portions of the second electrode 213 and the capping layer 215 in the middle area MA may respectively include holes 213H and 215H corresponding to (and concentric with) the opening area OA. The holes 213H and 215H of the second electrode 213 and the capping layer 215 may be in the middle area MA. At least a portion of the functional layer 212f and/or the inorganic insulating layer IIL may be exposed through the holes 213H and 215H.

As shown in FIGS. 7 and 8, the hole 213H of the second electrode 213 may be larger than the opening area OA. Advantageously, penetration (or diffusion) of oxygen or moisture in the vicinity of the opening area OA into a light-emitting diode of the display area DA may be prevented or minimized.

The hole 215H of the capping layer 215 may be larger than the opening area OA. Advantageously, penetration (or diffusion) of oxygen or moisture in the vicinity of the opening area OA into a light-emitting diode of the display area DA may be prevented or minimized.

The encapsulation layer 300 may be in the middle area MA. The encapsulation layer 300 is substantially in the display area (DA of FIG. 6) and may extend from the display area DA to the middle area MA. The encapsulation layer 300 may include the first inorganic film layer 310, the organic film layer 320, and the second inorganic film layer 330, which are sequentially stacked. Each of the first inorganic film layer 310, the organic film layer 320, and the second inorganic film layer 330 may extend from the display area DA to the middle area MA.

The organic film layer 320 is formed by coating and then curing a monomer, and the flow of the monomer may be controlled by the first and second dam portions DP1 and DP2. The flow of the monomer toward the opening area OA may be prevented or minimized by the first dam portion DP1 and/or the second dam portion DP2 in the middle area MA.

An end portion of the organic film layer 320 is positioned at one side of the first dam portion DP1 and/or the second dam portion DP2. The first inorganic film layer 310 and the second inorganic film layer 330 may directly contact an upper surface of the first dam portion DP1 and/or the second dam portion DP2.

The encapsulation layer 300 may overlap the at least one opening (e.g., openings 212fOP1, 212fOP2, and 212fOP3) formed in the functional layer 212f. The first inorganic film layer 310, the organic film layer 320, and the second inorganic film layer 330 of the encapsulation layer 300 may overlap the first opening 212fOP1 formed in the functional layer 212f.

The first inorganic film layer 310 may directly contact portions of the upper surface of the inorganic insulating layer IIL exposed by the first opening 212fOP1 of the functional layer 212f. In addition, the first inorganic film layer 310 may directly contact a portion of the upper surface of the inorganic insulating layer IIL exposed by the second opening 212fOP2 and the third opening 212fOP3 of the functional layer 212f.

The input sensing layer 40 may be in the middle area MA. The input sensing layer 40 is substantially in the display area (DA of FIG. 6) and may extend from the display area DA to the middle area MA. The input sensing layer 40 may include the first touch insulating layer 410, the second touch insulating layer 420, the third touch insulating layer 440, and the planarization layer 460, which are sequentially stacked. Each of the first touch insulating layer 410, the second touch insulating layer 420, the third touch insulating layer 440, and the planarization layer 460 may extend from the display area DA to the middle area MA. The first touch insulating layer 410 and/or the second touch insulating layer 420 may be optional.

An alignment mark 470 may be arranged on the second touch insulating layer 420 of the middle area MA. The alignment mark 470 may include the same material as that of a first conductive layer 430 described above with reference to FIG. 6 and may be positioned directly on the same layer 420 as the first conductive layer 430. The alignment mark 470 may include the same material as that of a second conductive layer 450 of FIG. 6 and may be positioned directly on the same layer as the second conductive layer 450.

The alignment mark 470 may be between the display area DA and the first dam portion DP1. The accuracy of a laser operation may be improved and cutting defects may be prevented or minimized by performing the laser operation with the alignment mark 470 being present between the display area DA and the first dam portion DP1.

While the first organic insulating layer 115 and the second organic insulating layer 116 are in the display area DA, the first organic insulating layer 115 and the second organic insulating layer 116 may be absent in a portion of the middle area MA. Accordingly, a step difference may exist between the display area DA and the middle area MA.

The planarization layer 460 may be in the middle area MA. The planarization layer 460 may planarize the middle area MA. The planarization layer 460 may prevent or minimize a step difference between the display area DA and the middle area MA. The planarization layer 460 may be on the third touch insulating layer 440. The planarization layer 460 may cover an underlying structure.

The planarization layer 460 may have a thickness in a range of about 16,000 angstroms (Å) to about 150,000 Å. When/if the thickness of the planarization layer 460 is less than 16,000 Å, a bubble may be generated between the planarization layer 460 and the optical functional layer 50 due to the step difference between the display area DA and the middle area MA. When/if the thickness of the planarization layer 460 is greater than 150,000 Å, a thickness distribution of the planarization layer 460 may increase, and the step difference between the display area DA and the middle area MA may increase.

The step difference between the display area DA and the middle area MA may be reduced by adjusting the thicknesses of the planarization layer 460 respectively arranged in the display area DA and the middle area MA, and the step difference between the display area DA and the middle area MA may be reduced through methods such as adjusting a waiting time after coating a material forming the planarization layer 460, adding a surface treatment, or performing multiple exposures.

The thickness of the planarization layer 460 in the middle area MA may be greater than or equal to the thickness of the planarization layer 460 in the display area DA. A height difference between an upper surface of the planarization layer 460 in the middle area MA and an upper surface of the planarization layer 460 in the display area DA may be less than or equal to 2 μm.

Referring to the opening area OA of FIG. 8, the display panel 10 may include the opening 10OP. The opening 10OP may include openings of components constituting the display panel 10. The opening 10OP of the display panel 10 may include an opening 100OP of the substrate 100, an opening 460OP of the planarization layer 460, or the like.

The openings of the components constituting the display panel 10 may be substantially simultaneously formed. Accordingly, an inner surface 100IS of the substrate 100, the inner surface 100IS defining the opening 100OP of the substrate 100, and an inner surface 460IS of the planarization layer 460, the inner surface 460IS defining the opening 460OP of the planarization layer 460, may be aligned in a cross-sectional view of the display panel 10.

Figure 9:
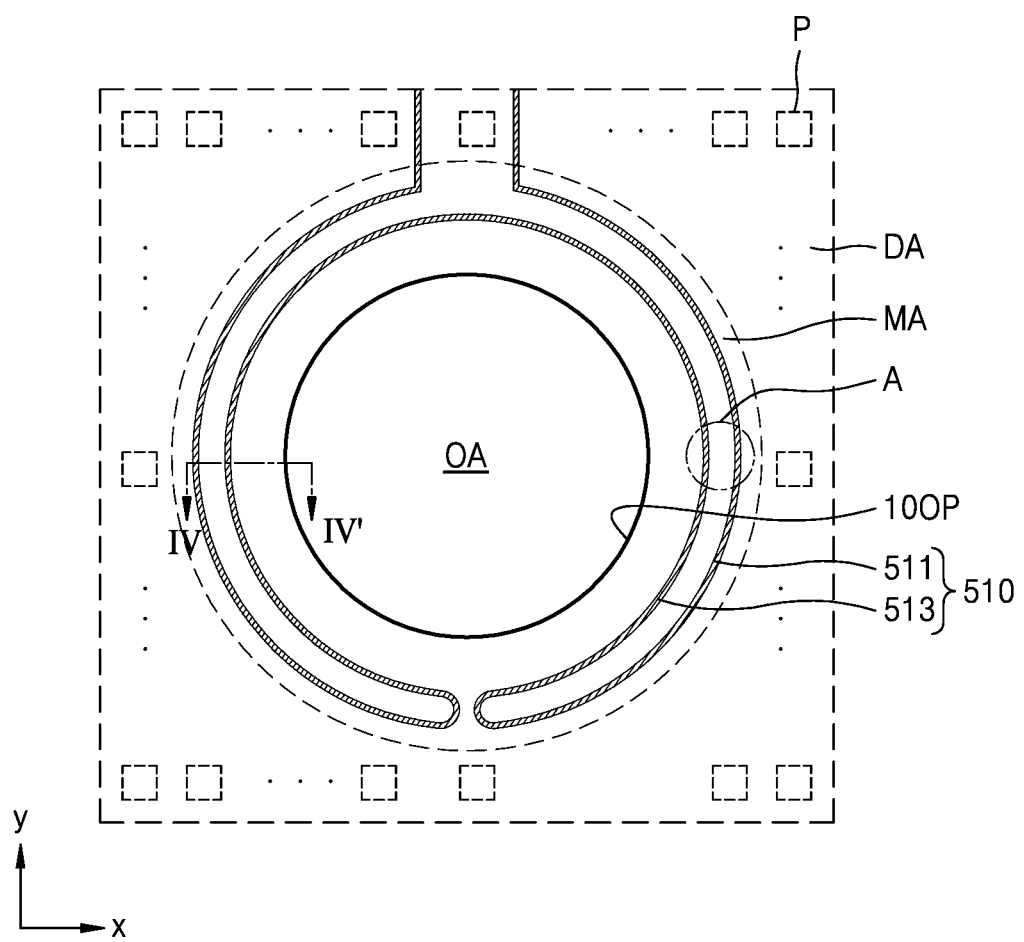
FIG. 9 is a schematic plan view of a portion of a display panel according to an embodiment.

FIG. 9 is a schematic plan view of a portion of a display panel according to an embodiment. The data line DL, the scan line SL, or the like shown in FIG. 5 may also be arranged in the display panel of FIG. 9, and the first dam portion DP1 and the second dam portion DP2 shown in FIG. 7 may also be arranged in the display panel of FIG. 9.

Referring to FIG. 9, a crack sensing layer 510 (or crack sensing member 510) may be in the middle area MA. The crack sensing layer 510 may be arranged along the periphery of the opening area OA. The crack sensing layer 510 may sense cracks occurring in the opening area OA and/or the middle area MA around the opening area OA. The crack sensing layer 510 may be connected to a pad (or a pad unit) on one side of the display panel 10.

The crack sensing layer 510 may include a first crack sensing layer 511 (or first crack sensing member section 511) and a second crack sensing layer 513 (or second crack sensing member section 513). The first crack sensing layer 511 may be between the opening area OA and the display area DA, and the second crack sensing layer 513 may be between the opening area OA and the first crack sensing layer 511. The second crack sensing layer 513 may be closer to the opening area OA than the first crack sensing layer 511. The first crack sensing layer 511 and the second crack sensing layer 513 may be integrally formed and/or may connected to each other through a bent/curved section of the crack sensing layer 510.

Figure 10:
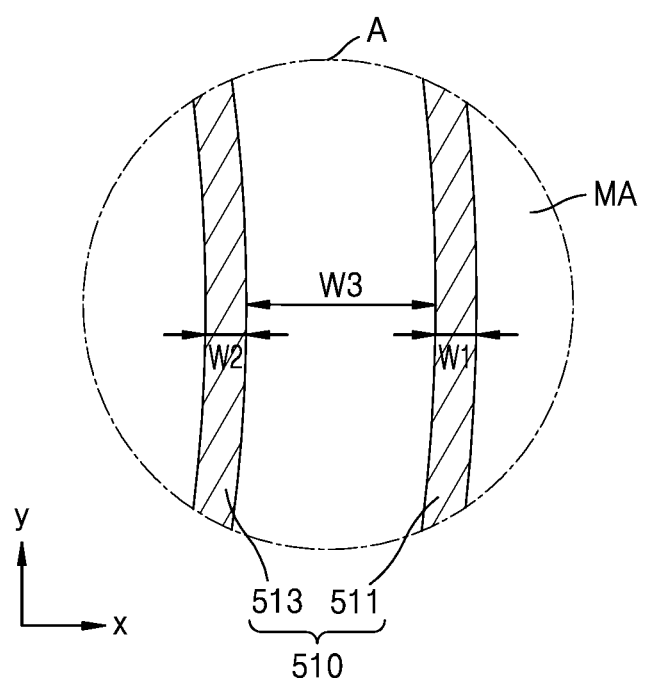
FIG. 10 is a schematic plan view of a portion A of the display panel of FIG. 9 according to an embodiment.

FIG. 10 is a schematic plan view of a portion A of the display panel of FIG. 9 according to an embodiment.

Referring to FIG. 10, the crack sensing layer 510 may include the first crack sensing layer 511 and the second crack sensing layer 513, wherein the first crack sensing layer 511 may have a first width W1, and the second crack sensing layer 513 may have a second width W2.

The first width W1 of the first crack sensing layer 511 and the second width W2 of the second crack sensing layer 513 may both be 1 μm or more. The first width W1 of the first crack sensing layer 511 may be equal to the second width W2 of the second crack sensing layer 513. The first width W1 of the first crack sensing layer 511 may be different from the second width W2 of the second crack sensing layer 513. The second width W2 of the second crack sensing layer 513 may be greater than the first width W1 of the first crack sensing layer 511, or the first width W1 of the first crack sensing layer 511 may be greater than the second width W2 of the second crack sensing layer 513.

The first crack sensing layer 511 and the second crack sensing layer 513 may be spaced from each other by a distance W3. The distance W3 between the first crack sensing layer 511 and the second crack sensing layer 513 may mean a minimum distance between the first crack sensing layer 511 and the second crack sensing layer 513, which are parallel to each other. The distance W3 between the first crack sensing layer 511 and the second crack sensing layer 513 may be 2 μm or more. The first crack sensing layer 511 and the second crack sensing layer 513 may be spaced from each other by 2 μm or more and positioned in the middle area MA.

Figure 11:
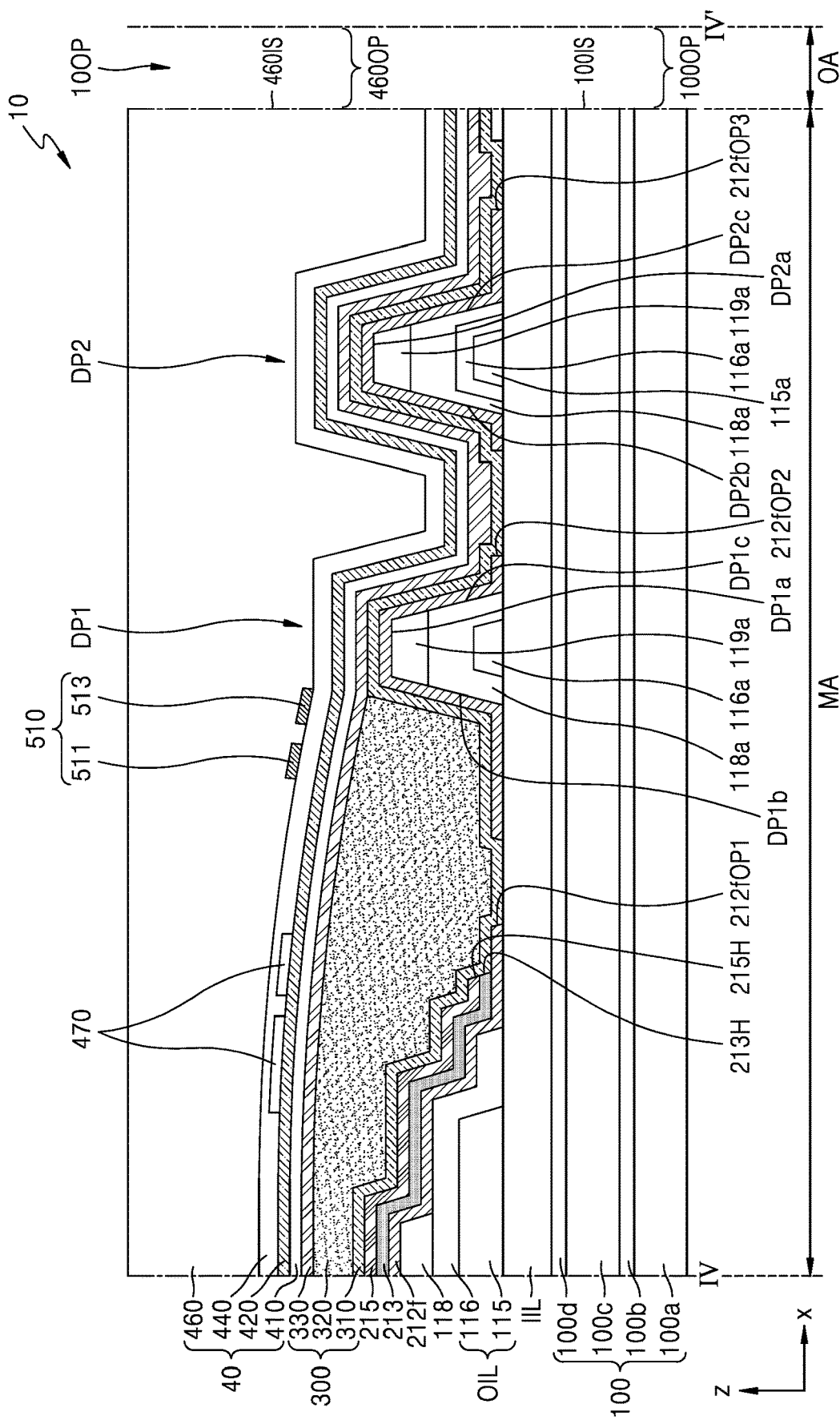
FIG. 11 is a cross-sectional view taken along line IV-IV' of FIG. 9 according to an embodiment.

FIG. 11 is a cross-sectional view of the display panel 10 taken along line IV-IV' of FIG. 9 according to an embodiment. The embodiment of FIG. 11 differs from the embodiment of FIG. 8 in that the crack sensing layer 510 is on the third touch insulating layer 440. In FIG. 11, the same reference numerals as those in FIG. 8 refer to the same members and/or analogous members.

Referring to FIG. 11, the crack sensing layer 510 may be in the middle area MA. The crack sensing layer 510 may include the first crack sensing layer 511 and the second crack sensing layer 513. The crack sensing layer 510 may be between the display area DA and the first dam portion DP1. The crack sensing layer 510 may at least partially overlap the first dam portion DP1. The second crack sensing layer 513 of the crack sensing layer 510 may at least partially overlap the first dam portion DP1.

The crack sensing layer 510 may at least partially overlap an upper surface DP1a of the first dam portion DP1. The crack sensing layer 510 may at least partially overlap a first side surface DP1b of the first dam portion DP1b, the first side surface DP1B being adjacent to (and facing) the display area DA.

Although not illustrated in FIG. 11, the crack sensing layer 510 may at least partially overlap a second side surface DP1c of the first dam portion DP1, the second side surface DP1C being adjacent to (and facing) the second dam portion DP2, at least partially overlap an upper surface DP2a of the second dam portion DP2, at least partially overlap a first side surface DP2b of the second dam portion DP2 (the first side surface DP2b being adjacent to the first dam portion DP1), and/or at least partially overlap a second side surface DP2c of the second dam portion DP2 (the second side surface DP2c being adjacent to the opening area OA).

The crack sensing layer 510 may be on the third touch insulating layer 440. The crack sensing layer 510 may be directly on an upper surface of the third touch insulating layer 440. When the crack sensing layer 510 is directly on the upper surface of the third touch insulating layer 440, the crack sensing layer 510 may include the same material as that of the second conductive layer 450 of FIG. 6 and may be positioned directly on the same layer as the second conductive layer 450.

The crack sensing layer 510 may be directly on the first touch insulating layer 410 or the second touch insulating layer 420. The crack sensing layer 510 may be directly on an upper surface of the first touch insulating layer 410 or the second touch insulating layer 420.

The planarization layer 460 may be on the crack sensing layer 510. The planarization layer 460 may cover the crack sensing layer 510. The planarization layer 460 may include an organic insulating layer.

When/if an organic insulating layer (or a planarization layer) is on an inorganic insulating layer (or a touch insulating layer), and the crack sensing layer 510 is on the organic insulating layer (or the planarization layer), a distance between a crack occurrence point and the crack sensing layer 510 increases due to the thickness of the organic insulating layer (or the planarization layer), and the crack sensing sensitivity of the crack sensing layer 510 may be reduced. A distance between a crack occurrence point and the crack sensing layer 510 may decrease to improve the crack sensing sensitivity of the crack sensing layer 510 by arranging the crack sensing layer 510 on an inorganic insulating layer (or a touch insulating layer) and arranging the organic insulating layer (or a planarization layer) on the crack sensing layer 510. The sensitivity of the crack sensing layer 510 may be improved.

Figure 12:
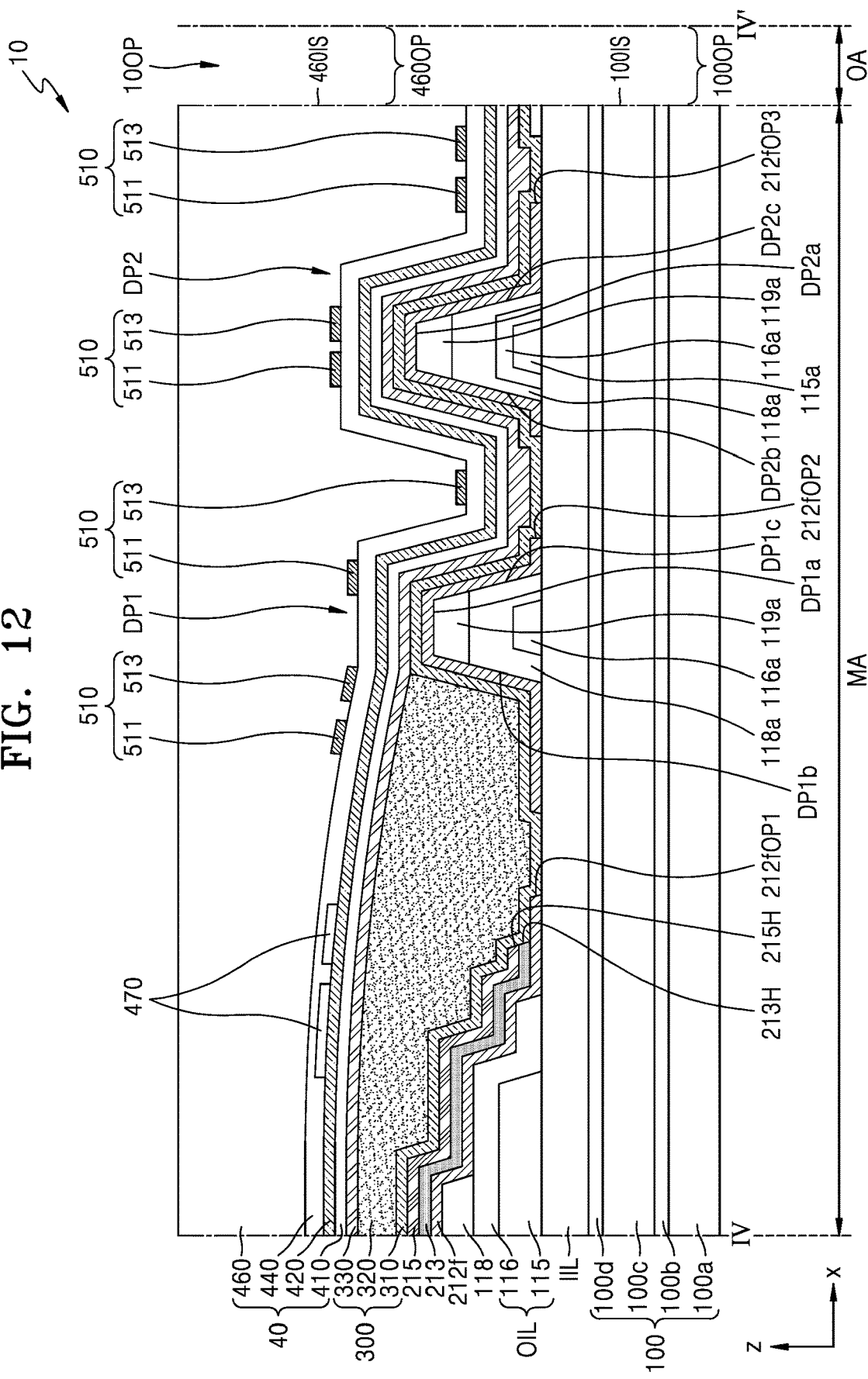
FIG. 12 is a schematic cross-sectional view of a portion of a display panel according to an embodiment.

FIG. 12 is a schematic cross-sectional view of a portion of the display panel 10 according to an embodiment. The embodiment of FIG. 12 differs from the embodiment of FIG. 11 in that multiple crack sensing layers 510 are included. In FIG. 12, the same reference numerals as those in FIG. 11 refer to the same members and/or analogous members.

Referring to FIG. 12, the crack sensing layers 510 may be in the middle area MA. The plurality of crack sensing layers 510 may be directly on the third touch insulating layer 440. Each of the crack sensing layers 510 may include a first crack sensing layer 511 and a second crack sensing layer 513. FIG. 12 illustrates that four crack sensing layers 510 are in the middle area MA. Two, three, five or more crack sensing layers 510 may be implemented.

The crack sensing layers 510 may be between the display area DA and the first dam portion DP1, between the first dam portion DP1 and the second dam portion DP2, on the second dam portion DP2, and/or between the second dam portion DP2 and the opening area OA.

A crack sensing layer 510 may be between the display area DA and the first dam portion DP1. The crack sensing layer 510 may at least partially overlap the upper surface DP1a of the first dam portion DP1 and/or the first side surface DP1b of the first dam portion DP1.

A crack sensing layer 510 may be between the first dam portion DP1 and the second dam portion DP2. The crack sensing layer 510 may at least partially overlap the upper surface DP1a of the first dam portion DP1 and/or the second side surface DP1c of the first dam portion DP1.

A crack sensing layer 510 may be on the second dam portion DP2. The crack sensing layer 510 may at least partially overlap at least one of the upper surface DP2a of the second dam portion DP2, the first side surface DP2b of the second dam portion DP2, and the second side surface DP2c of the second dam portion DP2.

A crack sensing layer 510 may be between the second dam portion DP2 and the opening area OA. The crack sensing layer 510 may at least partially overlap the third opening 212fOP3 defined in the functional layer 212f.

Figure 13A:
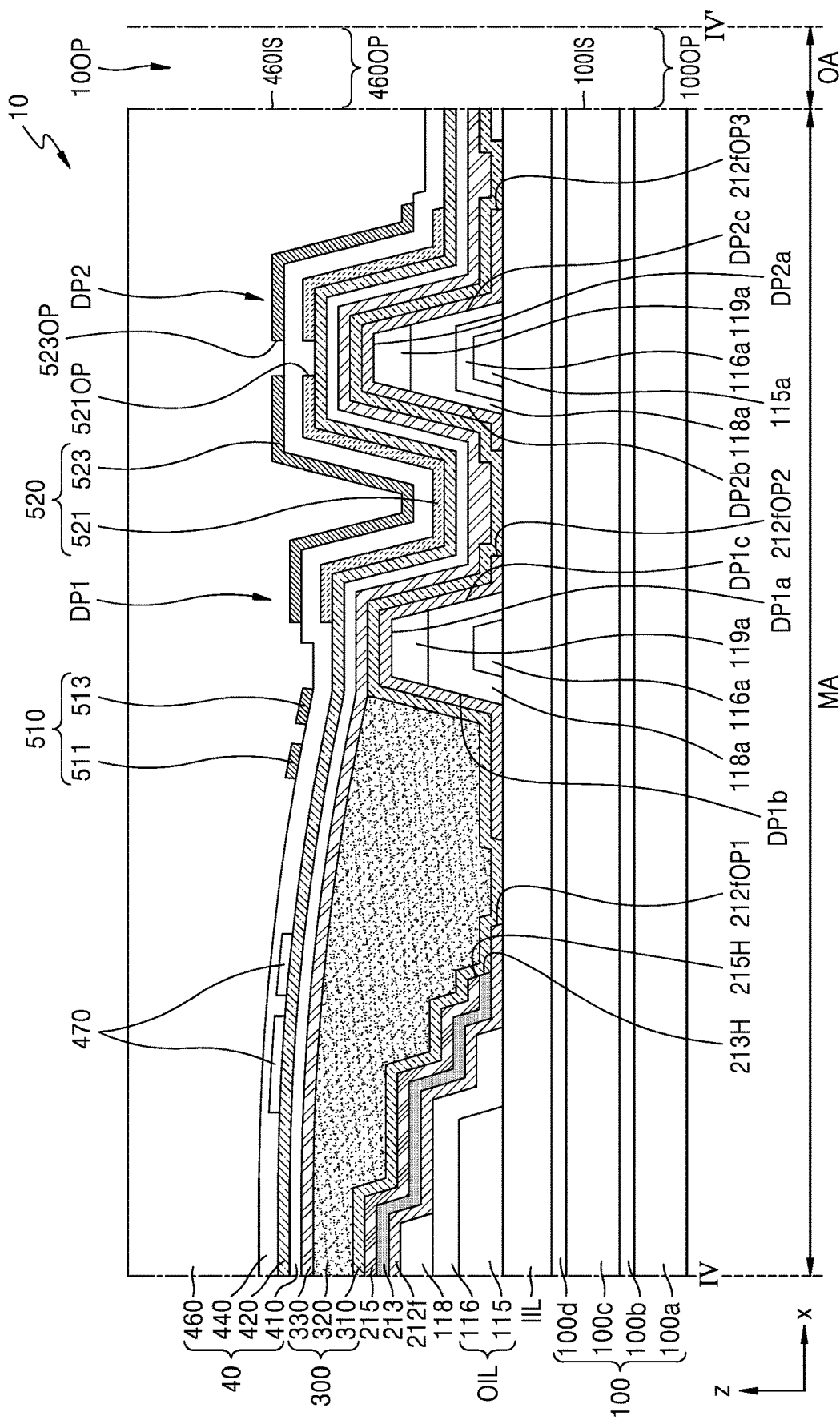
FIG. 13C is a schematic cross-sectional view of a portion of a display panel according to an embodiment.
Figure 13B:
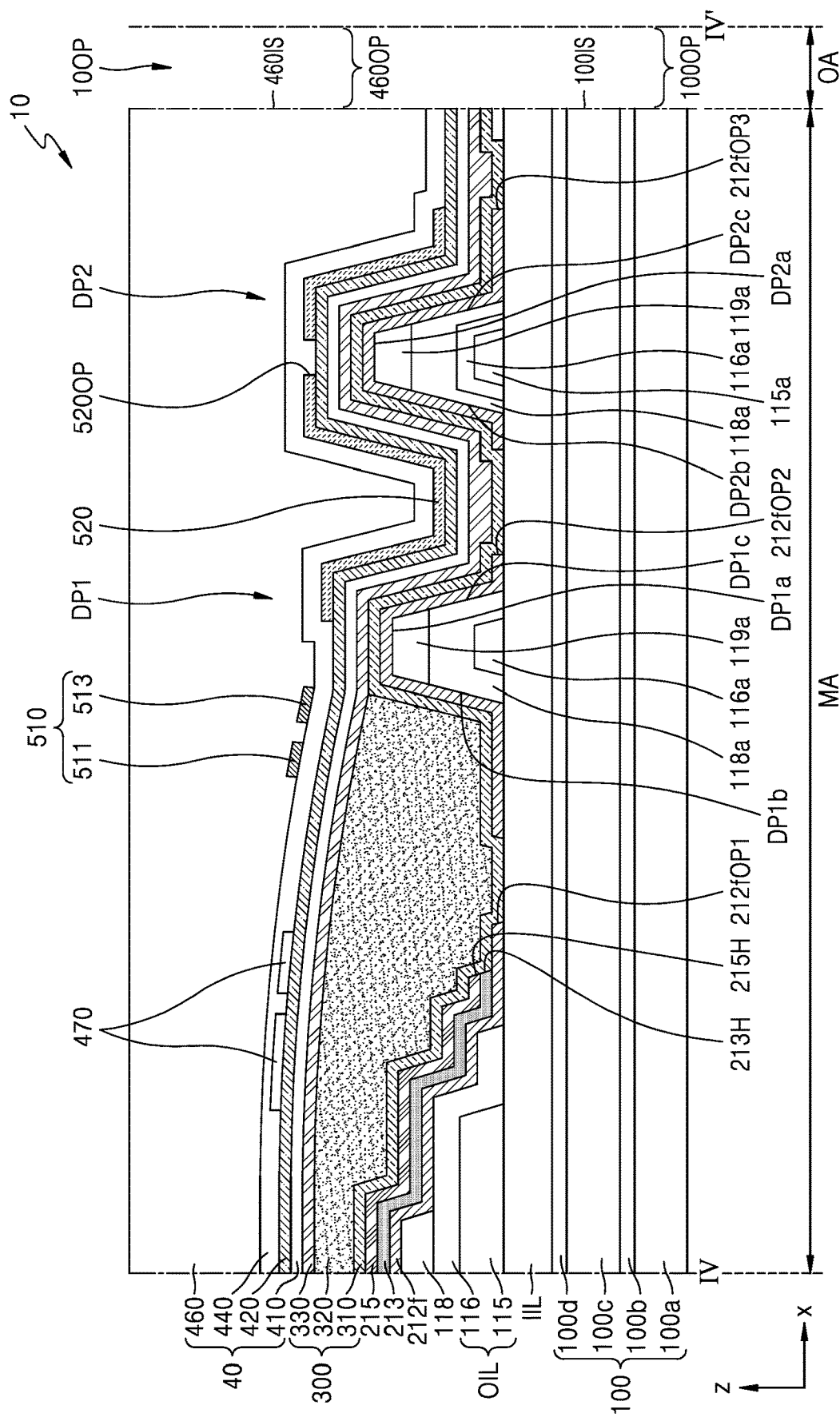
Figure 13C:
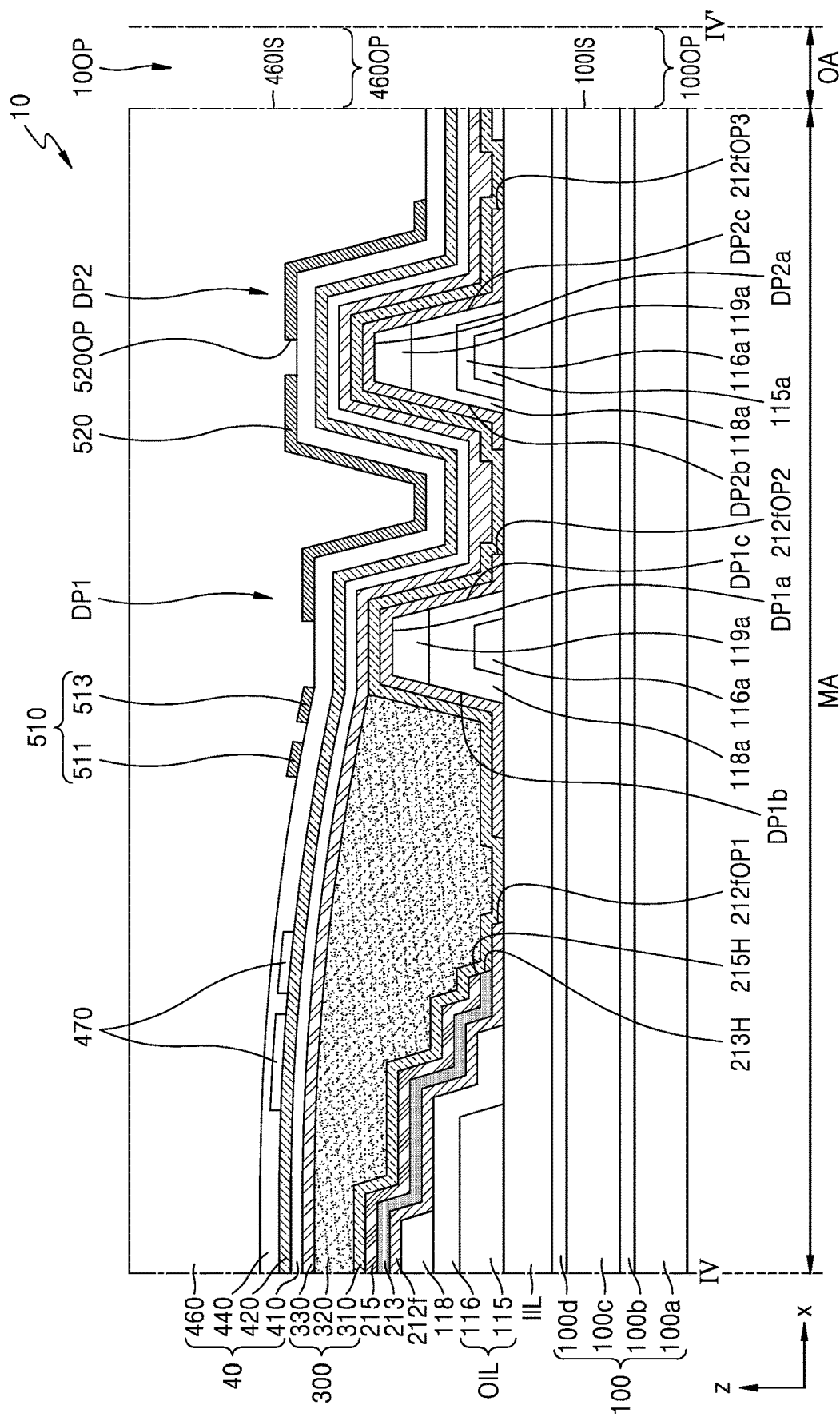

Each of FIGS. 13A to 13C is a schematic cross-sectional view of a portion of the display panel 10 according to an embodiment. The embodiments of FIGS. 13A to 13C differ from the embodiment of FIG. 11 in that a metal layer 520 is in the middle area MA. In FIGS. 13A to 13C, the same reference numerals as those in FIG. 11 refer to the same members and/or analogous members.

Referring to FIGS. 13A to 13C, the metal layer 520 may be in the middle area MA. The metal layer 520 may overlap at least one of the first dam portion DP1 and the second dam portion DP2. The metal layer 520 may overlap the first dam portion DP1 and the second dam portion DP2. The metal layer 520 may substantially cover at least one of the first dam portion DP1 and the second dam portion DP2.

The metal layer 520 may be directly on the second touch insulating layer 420 and/or the third touch insulating layer 440. As shown in FIG. 13A, the metal layer 520 may include a first metal layer 521 and a second metal layer 523, wherein the first metal layer 521 may be directly on the second touch insulating layer 420, and the second metal layer 523 may be directly on the third touch insulating layer 440. The first metal layer 521 may include the same material as that of a first conductive layer 430 of FIG. 6 and may be positioned on the same layer of the first conductive layer 430; the second metal layer 523 may include the same material as that of a second conductive layer 450 of FIG. 6 and may be positioned on the same layer of the second conductive layer 450. The first metal layer 521 and the second metal layer 523 may at least partially overlap each other.

The metal layer 520 may at least partially overlap the upper surface DP1a of the first dam portion DP1, and may at least partially overlap the second side surface DP1c of the first dam portion DP1, the second side surface DP1c being adjacent to the second dam portion DP2. The first metal layer 521 and the second metal layer 523 may at least partially overlap the upper surface DP1a of the first dam portion DP1, and may at least partially overlap the second side surface DP1c of the first dam portion DP1, the second side surface DP1c being adjacent to the second dam portion DP2. The metal layer 520 may at least partially cover the upper surface DP1a of the first dam portion DP1, and may at least partially cover the second side surface DP1c of the first dam portion DP1, the second side surface DP1c being adjacent to the second dam portion DP2. The first metal layer 521 and the second metal layer 523 may at least partially cover the upper surface DP1a of the first dam portion DP1, and may at least partially cover the second side surface DP2c of the first dam portion DP1, the second side surface DP2c being adjacent to the second dam portion DP2.

The metal layer 520 may be between the first dam portion DP1 and the second dam portion DP2. The first metal layer 521 and the second metal layer 523 may be between the first dam portion DP1 and the second dam portion DP2.

The metal layer 520 may at least partially overlap the upper surface DP2a of the second dam portion DP2, at least partially overlap the first side surface DP2b of the second dam portion DP2 (the first side surface DP2b being adjacent to the first dam portion DP1), and/or at least partially overlap the second side surface DP2c of the second dam portion DP2 (the second side surface DP2c being adjacent to the opening area OA). The first metal layer 521 and the second metal layer 523 may at least partially overlap the upper surface DP2a of the second dam portion DP2, at least partially overlap the first side surface DP2b of the second dam portion DP2, and at least partially overlap the second side surface DP2c of the second dam portion DP2. The metal layer 520 may at least partially cover the upper surface DP2a of the second dam portion DP2, at least partially cover the first side surface DP2b of the second dam portion DP2 (the first side surface DP2b being adjacent to the first dam portion DP1), and at least partially cover the second side surface DP2c of the second dam portion DP2 (the second side surface DP2c being adjacent to the opening area OA). The first metal layer 521 and the second metal layer 523 may at least partially cover the upper surface DP2a of the second dam portion DP2, at least partially cover the first side surface DP2b of the second dam portion DP2, and at least partially cover the second side surface DP2c of the second dam portion DP2.

The metal layer 520 may have discontinuities in the middle area MA. The metal layer 520 may include openings 521OP and 523OP which expose the second dam portion DP2. The openings 521OP and 523OP of the metal layer 520 may at least partially expose the upper surface DP2a of the second dam portion DP2.

The first metal layer 521 may have a discontinuity in the middle area MA. The first metal layer 521 may include the opening 521OP exposing the second dam portion DP2. The opening 521OP formed in the first metal layer 521 may at least partially expose the upper surface DP2a of the second dam portion DP2.

The second metal layer 523 may have a discontinuity in the middle area MA. The second metal layer 523 may include the opening 523OP exposing the second dam portion DP2. The opening 523OP formed in the second metal layer 523 may at least partially expose the upper surface DP2a of the second dam portion DP2.

The first metal layer 521 and the second metal layer 523 respectively includes the openings 521OP and 523OP which expose the second dam portion DP2, so that the transfer of a crack generated in the opening area OA and/or the middle area MA around the opening area OA to a light-emitting diode in the display area DA may be prevented or minimized.

When/if no metal layer is formed on the first touch insulating layer 410 and the second touch insulating layer 420, a residual film is formed on the upper surfaces or side surfaces of the first and second dam portions DP1 and DP2 due to the height of the first and second dam portions DP1 and DP2, thereby causing defects.

The metal layer 520 overlaps the first dam portion DP1 and the second dam portion DP2, so that a residual film overlapping the first dam portion DP1 and the second dam portion DP2 may be prevented or minimized, and related defects may be prevented or minimized.

The first metal layer 521 may at least partially overlap the upper surface DP1a of the first dam portion DP1, the second side surface DP1c of the first dam portion DP1, the upper surface DP2a of the second dam portion DP2, the first side surface DP2b of the second dam portion DP2, and/or the second side surface DP2c of the second dam portion DP2, so that a residual film at a position adjacent to the first dam portion DP1 and the second dam portion DP2 may be prevented or minimized in an operation of forming a first conductive layer 430 of FIG. 6, and related defects may be prevented or minimized.

The second metal layer 523 may at least partially overlap the upper surface DP1a of the first dam portion DP1, the second side surface DP1c of the first dam portion DP1, the upper surface DP2a of the second dam portion DP2, the first side surface DP2b of the second dam portion DP2, and/or the second side surface DP2c of the second dam portion DP2, so that a residual film at a position adjacent to the first dam portion DP1 and the second dam portion DP2 may be prevented or minimized in an operation of forming a second conductive layer 450 of FIG. 6, and related defects may be prevented or minimized.

A metal layer (e.g., the first metal layer 521 and/or the second metal layer 523) may overlap the upper surfaces and side surfaces of the first and second dam portions DP1 and DP2, so that the transfer (or propagation) of a crack generated in the opening area OA and/or the middle area MA around the opening area OA to a light-emitting diode in the display area DA may be prevented or minimized, and damage to the light-emitting diode of the display area DA by the crack may be prevented or minimized because a portion of energy of the crack may be absorbed by the metal layer.

As shown in FIG. 13B, the metal layer 520 may be directly on the second touch insulating layer 420. The metal layer 520 may include an opening 520OP exposing the second dam portion DP2. The opening 520OP formed in the metal layer 520 may at least partially expose the upper surface DP2a of the second dam portion DP2.

As shown in FIG. 13C, the metal layer 520 may be directly on the third touch insulating layer 440. The metal layer 520 may include the opening 520OP exposing the second dam portion DP2. The opening 520OP formed in the metal layer 520 may at least partially expose the upper surface DP2a of the second dam portion DP2.

Figure 14A:
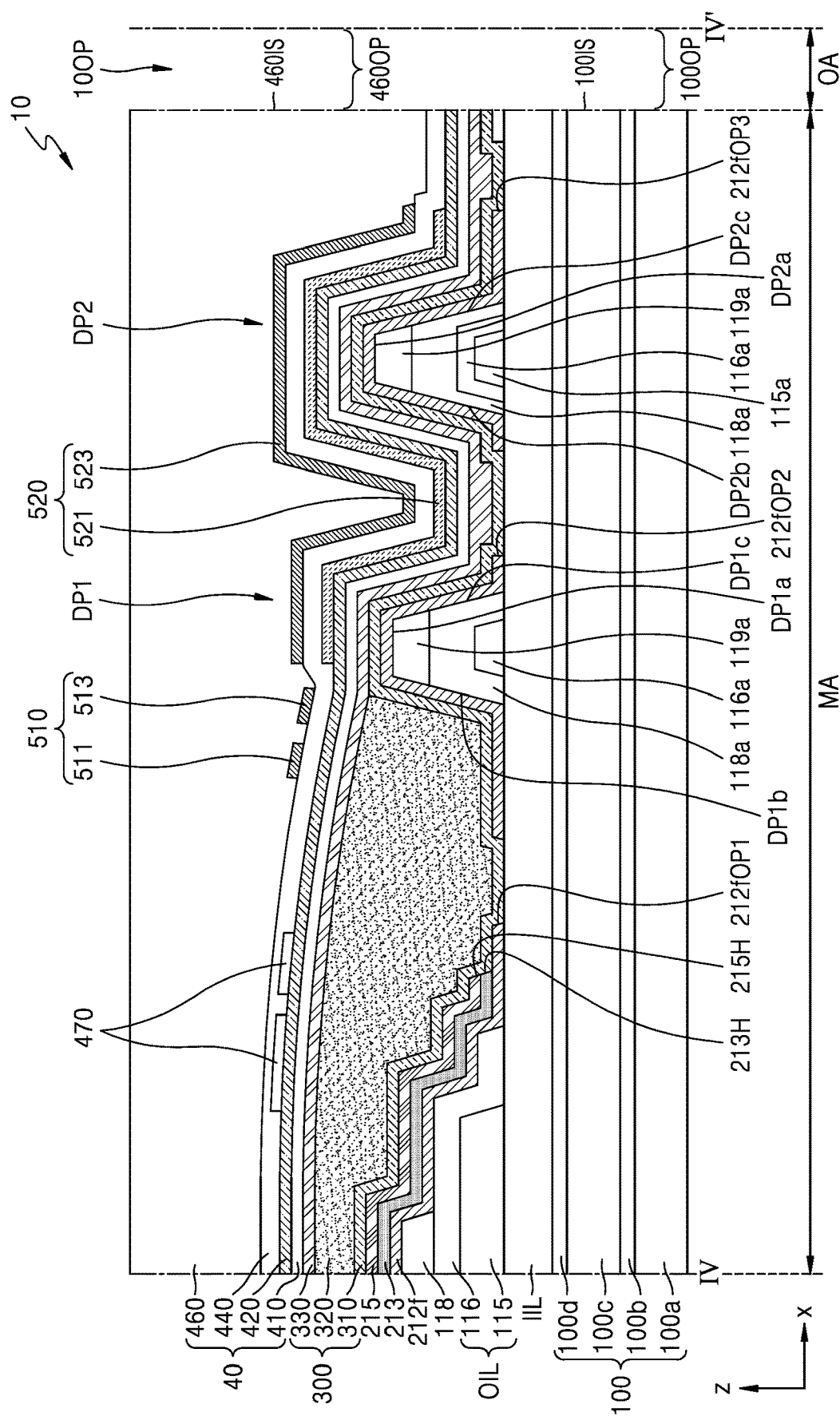
FIG. 14C is a schematic cross-sectional view of a portion of a display panel according to an embodiment.
Figure 14B:
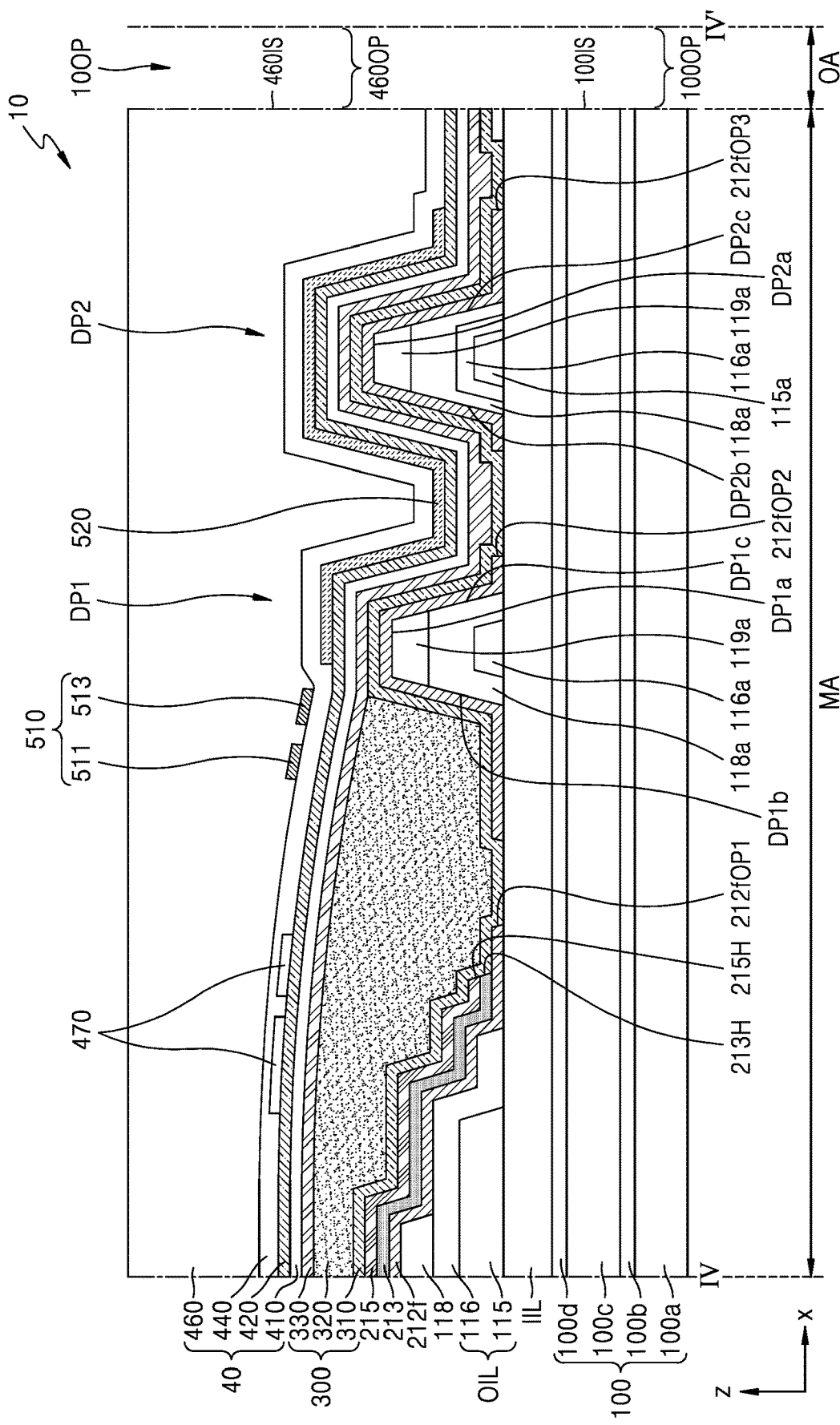
Figure 14C:
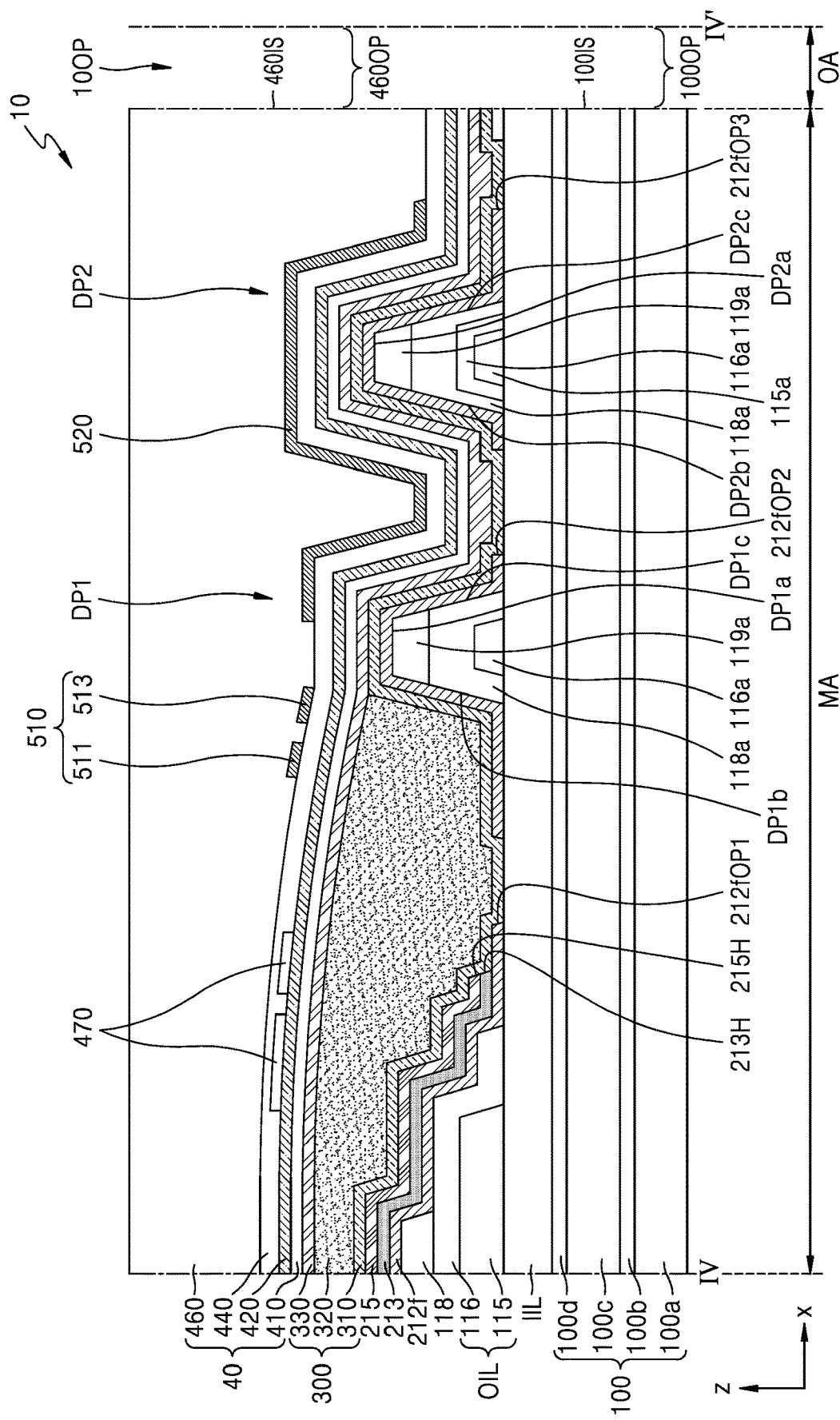

Each of FIGS. 14A to 14C is a schematic cross-sectional view of a portion of the display panel 10 according to an embodiment. The embodiments of FIGS. 14A to 14C differ from the embodiments of FIGS. 13A to 13C in that the metal layer 520 does not include internal openings. In FIGS. 14A to 14C, the same reference numerals as those in FIGS. 13A to 13C refer to the same members and/or analogous members.

Referring to FIGS. 14A to 14C, the metal layer 520 may be on the second touch insulating layer 420 and/or the third touch insulating layer 440. The metal layer 520 may include the first metal layer 521 and the second metal layer 523, wherein the first metal layer 521 may be on the second touch insulating layer 420, and the second metal layer 523 may be on the third touch insulating layer 440.

The metal layer 520 may entirely overlap the upper surface DP1a of the first dam portion DP1 and the second side surface DP1c of the first dam portion DP1. The first metal layer 521 and the second metal layer 523 may entirely overlap the upper surface DP1a of the first dam portion DP1 and the second side surface DP1c of the first dam portion DP1. The metal layer 520 may entirely cover the upper surface DP1a of the first dam portion DP1 and the second side surface DP1c of the first dam portion DP1. The first metal layer 521 and the second metal layer 523 may entirely cover the upper surface DP1a of the first dam portion DP1 and the second side surface DP1c of the first dam portion DP1.

The metal layer 520 may entirely cover the upper surface DP2a of the second dam portion DP2, the first side surface DP2b of the second dam portion DP2, and the second side surface DP2c of the second dam portion DP2. The first metal layer 521 and the second metal layer 523 may entirely overlap the upper surface DP2a of the second dam portion DP2, the first side surface DP2b of the second dam portion DP2, and the second side surface DP2c of the second dam portion DP2. The metal layer 520 may entirely cover the upper surface DP2a of the second dam portion DP2, the first side surface DP2b of the second dam portion DP2, and the second side surface DP2c of the second dam portion DP2. The first metal layer 521 and the second metal layer 523 may entirely cover the upper surface DP2a of the second dam portion DP2, the first side surface DP2b of the second dam portion DP2, and the second side surface DP2c of the second dam portion DP2.

The metal layer 520 may not include the openings 521OP and 523OP on the upper surface DP2a of the second dam portion DP2. The metal layer 520 is integrally provided, and may entirely overlap the upper surface DP1a of the first dam portion DP1, the second side surface DP1c of the first dam portion DP1, the upper surface DP2a of the second dam portion DP2, the first side surface DP2b of the second dam portion DP2, and the second side surface DP2c of the second dam portion DP2.

The first metal layer 521 is integrally provided and may entirely overlap the upper surface DP1a of the first dam portion DP1, the second side surface DP1c of the first dam portion DP1, the upper surface DP2a of the second dam portion DP2, the first side surface DP2b of the second dam portion DP2, and the second side surface DP2c of the second dam portion DP2. The second metal layer 523 is integrally provided and may entirely overlap the upper surface DP1a of the first dam portion DP1, the second side surface DP1c of the first dam portion DP1, the upper surface DP2a of the second dam portion DP2, the first side surface DP2b of the second dam portion DP2, and the second side surface DP2c of the second dam portion DP2.

As shown in FIG. 14B, the metal layer 520 may be directly on the second touch insulating layer 420. As shown in FIG. 14C, the metal layer 520 may be directly on the third touch insulating layer 440.

Figure 15A:
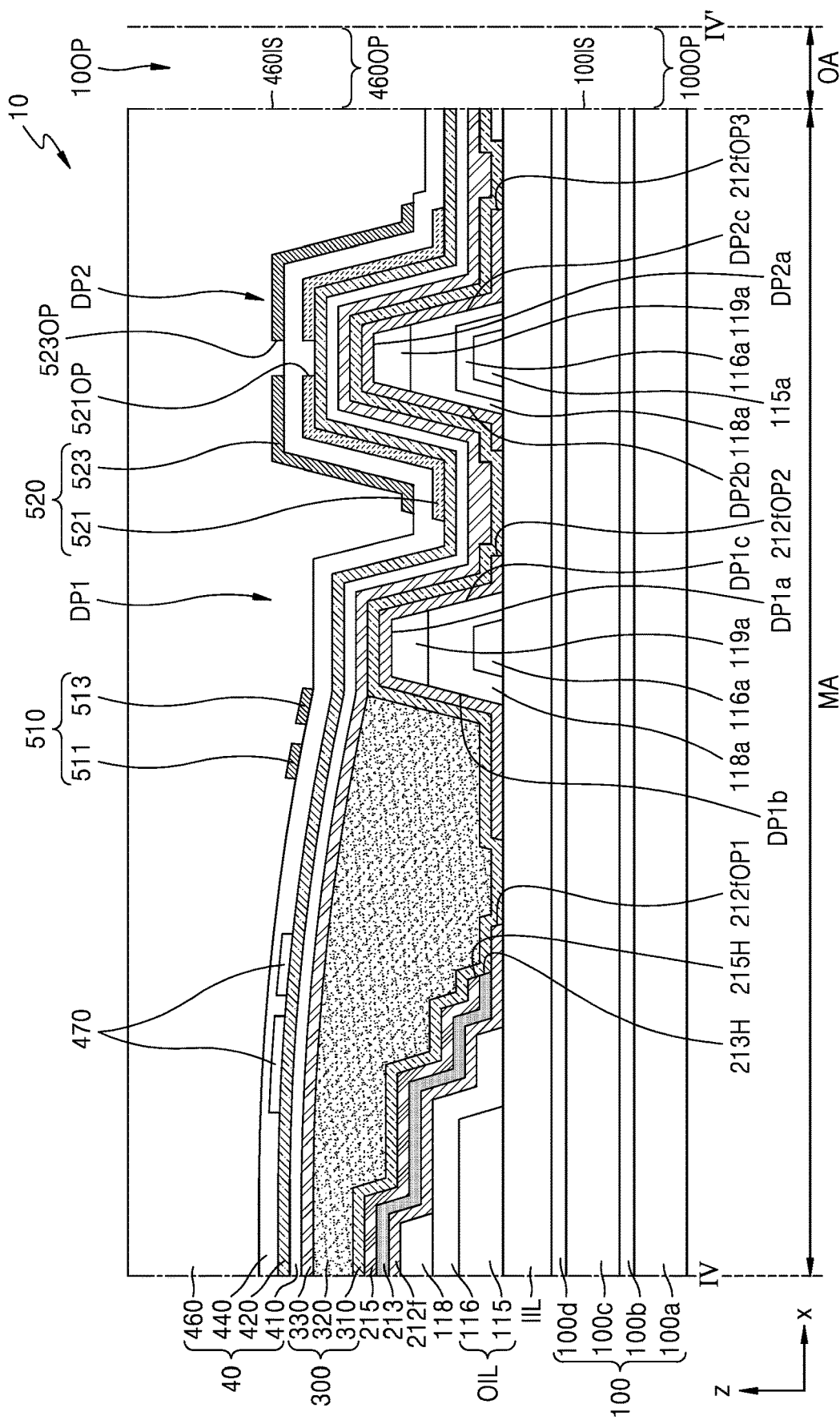
FIG. 15C is a schematic cross-sectional view of a portion of a display panel according to an embodiment.
Figure 15B:
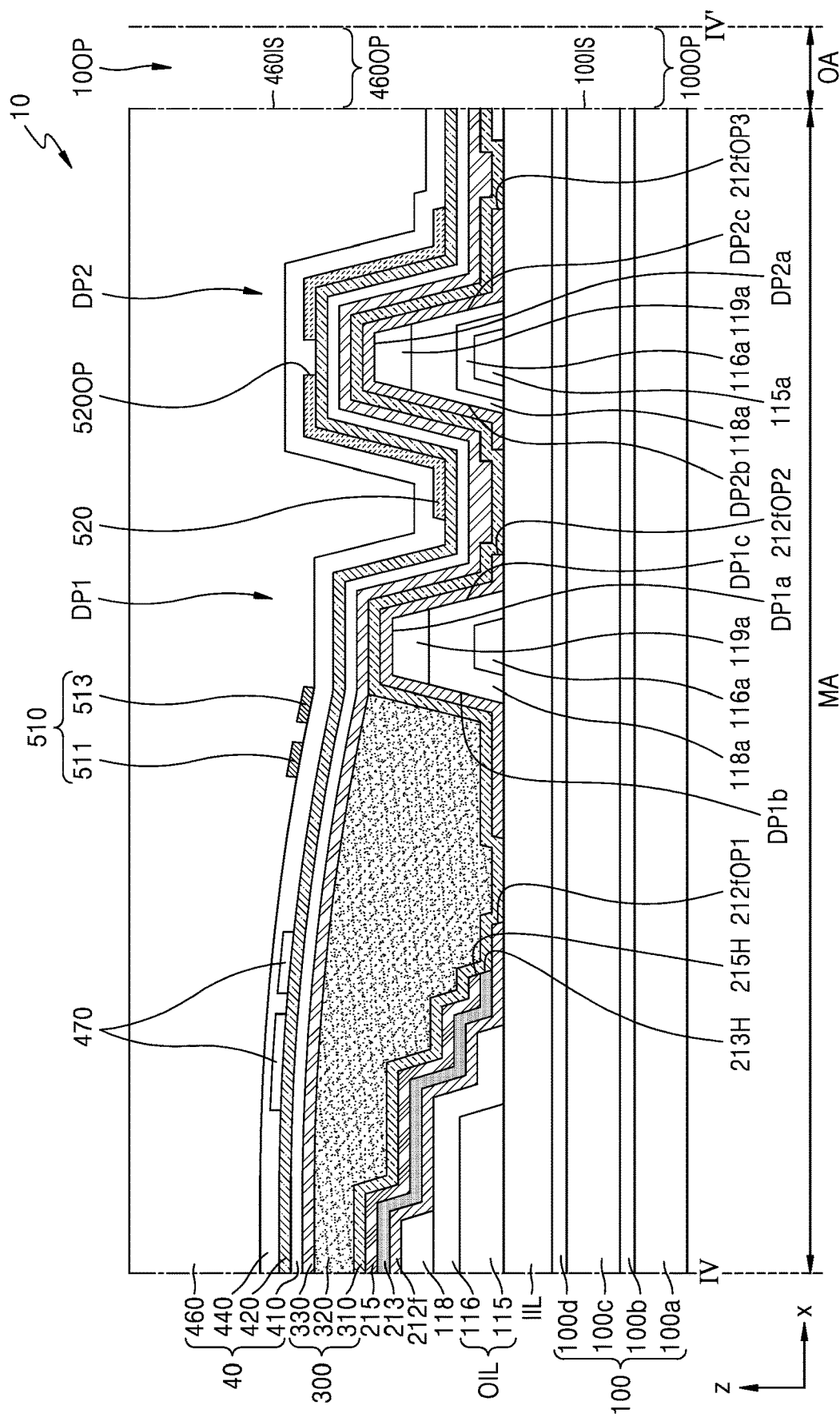
Figure 15C:
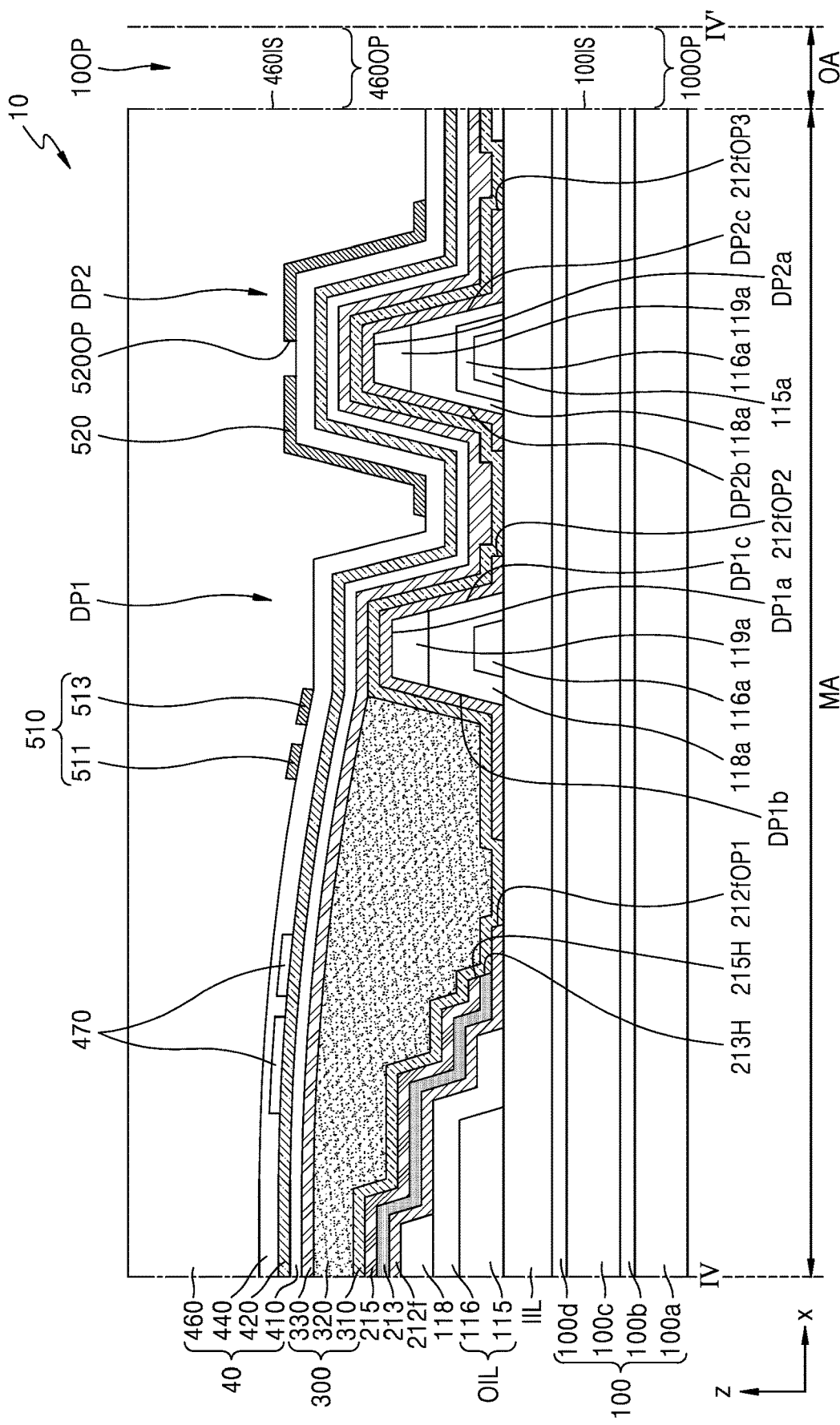

Each of FIGS. 15A to 15C is a schematic cross-sectional view of a portion of the display panel 10 according to an embodiment. The embodiments of FIGS. 15A to 15C differ from the embodiments of FIGS. 13A to 13C in that the metal layer 520 does not overlap the first dam portion DP1. In FIGS. 15A to 15C, the same reference numerals as those in FIGS. 13A to 13C refer to the same members and/or analogous members.

Referring to FIGS. 15A to 15C, the metal layer 520 may be on the second touch insulating layer 420 and/or the third touch insulating layer 440. The metal layer 520 may include the first metal layer 521 and the second metal layer 523, wherein the first metal layer 521 may be on the second touch insulating layer 420, and the second metal layer 523 may be on the third touch insulating layer 440.

The metal layer 520 may not overlap the first dam portion DP1 and may overlap the second dam portion DP2. The metal layer 520 may not be on the first dam portion DP1, and may be on the second dam portion DP2. The metal layer 520 may not cover the first dam portion DP1 and may cover the second dam portion DP2.

The first metal layer 521 and the second metal layer 523 may at least partially overlap the second dam portion DP2, and the first metal layer 521 and the second metal layer 523 may not overlap the first dam portion DP1. The first metal layer 521 and the second metal layer 523 may at least partially overlap the upper surface DP2a of the second dam portion DP2, at least partially overlap the first side surface DP2*b* of the second dam portion DP2, and at least partially overlap the second side surface DP2*c* of the second dam portion DP2. The first metal layer 521 and the second metal layer 523 may respectively include the openings 521OP and 523OP, which expose the upper surface DP2*a* of the second dam portion DP2.

As shown in FIG. 15B, the metal layer 520 may be directly on the second touch insulating layer 420. The metal layer 520 may include the opening 520OP exposing the second dam portion DP2. The opening 520OP formed in the metal layer 520 may at least partially expose the upper surface DP2*a* of the second dam portion DP2.

As shown in FIG. 15C, the metal layer 520 may be directly on the third touch insulating layer 440. The metal layer 520 may include the opening 520OP exposing the second dam portion DP2. The opening 520OP formed in the metal layer 520 may at least partially expose the upper surface DP2*a* of the second dam portion DP2.

Figure 16A:
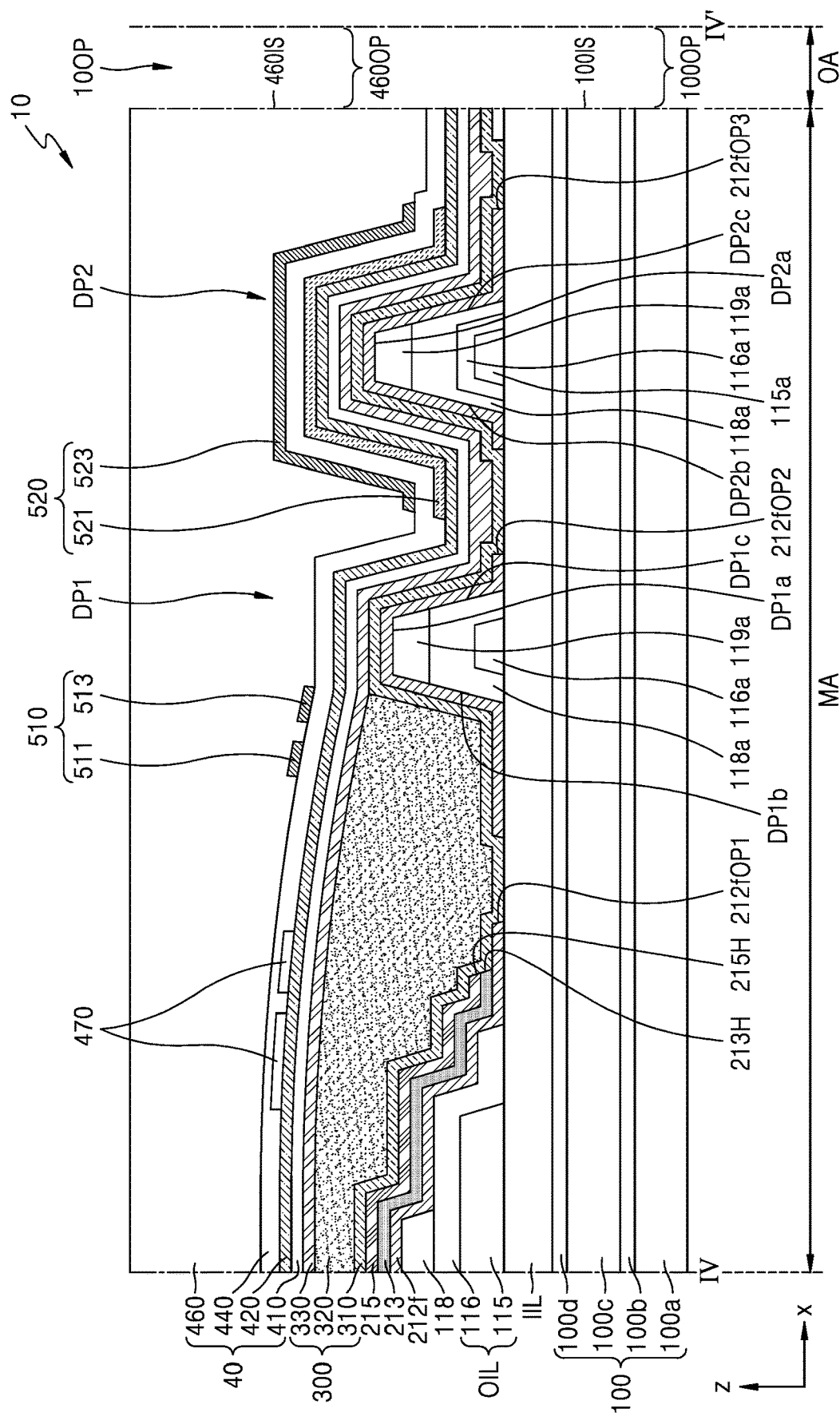
FIG. 16C is a schematic cross-sectional view of a portion of a display panel according to an embodiment.
Figure 16B:
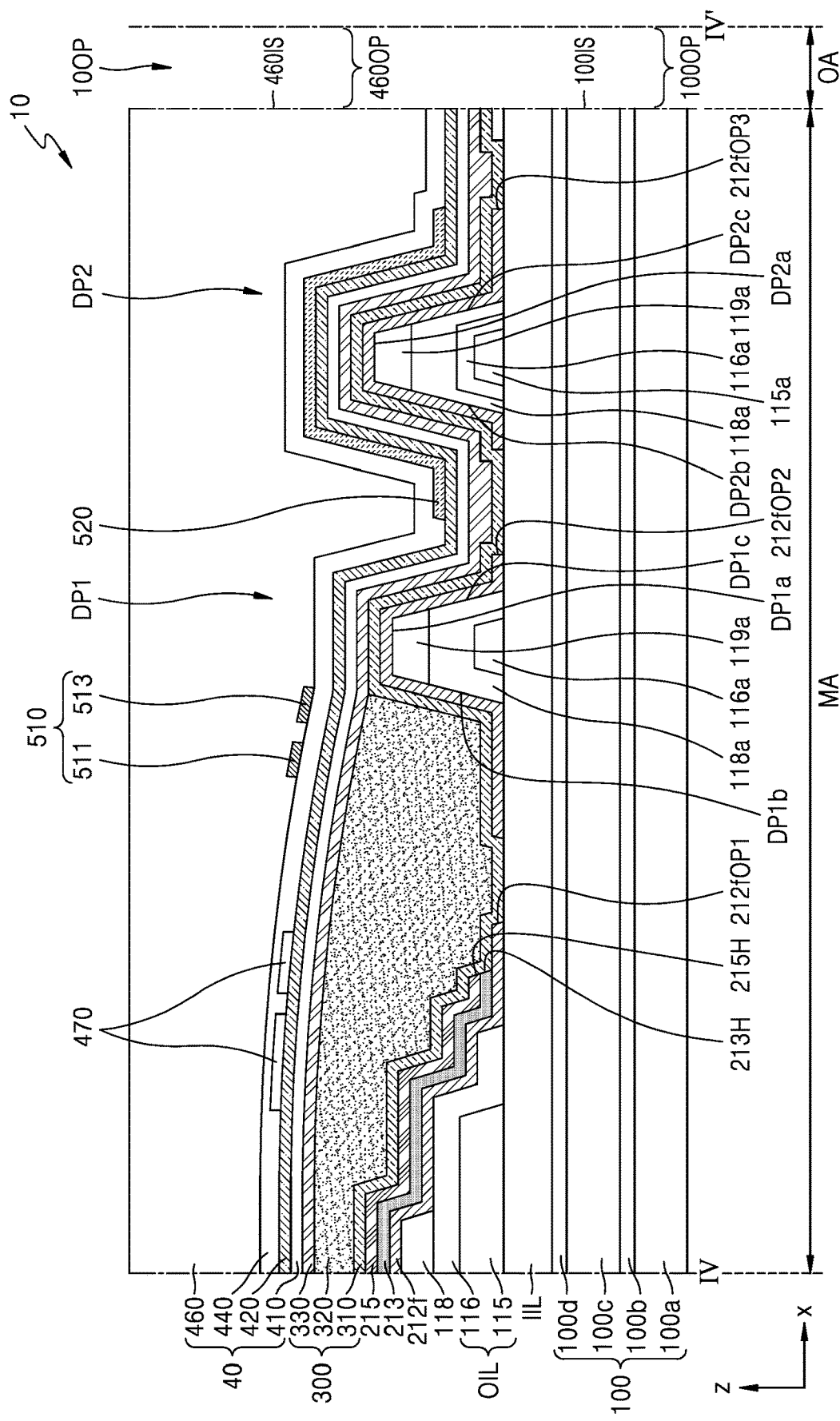
Figure 16C:
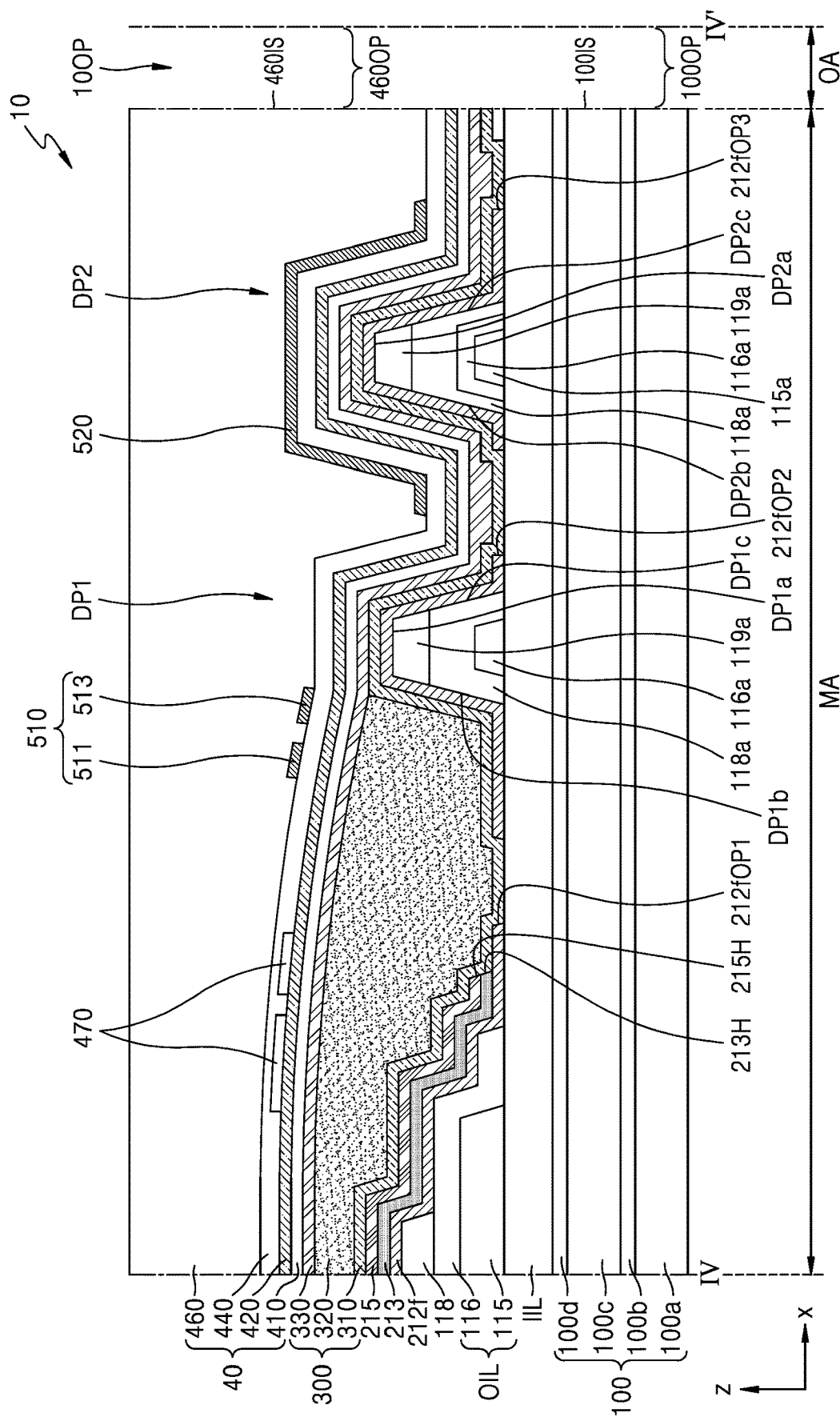

Each of FIGS. 16A to 16C is a schematic cross-sectional view of a portion of the display panel 10 according to an embodiment. The embodiments of FIGS. 16A to 16C differ from the embodiments of FIGS. 15A to 15C in that the metal layer 520 is integrally formed. In FIGS. 16A to 16C, the same reference numerals as those in FIGS. 15A to 15C refer to the same members and/or analogous members.

Referring to FIGS. 16A to 16C, the metal layer 520 may be on the second touch insulating layer 420 and/or the third touch insulating layer 440. The metal layer 520 may include the first metal layer 521 and the second metal layer 523, wherein the first metal layer 521 may be on the second touch insulating layer 420, and the second metal layer 523 may be on the third touch insulating layer 440.

The metal layer 520 may entirely cover the upper surface DP2*a* of the second dam portion DP2, the first side surface DP2*b* of the second dam portion DP2, and the second side surface DP2*c* of the second dam portion DP2. The metal layer 520 is integrally provided and may entirely cover the upper surface DP2*a* of the second dam portion DP2, the first side surface DP2*b* of the second dam portion DP2, and the second side surface DP2*c* of the second dam portion DP2. The metal layer 520 may entirely cover the upper surface DP2*a* of the second dam portion DP2, the first side surface DP2*b* of the second dam portion DP2, and the second side surface DP2*c* of the second dam portion DP2.

The first metal layer 521 is integrally provided and may entirely overlap the upper surface DP2*a* of the second dam portion DP2, the first side surface DP2*b* of the second dam portion DP2, and the second side surface DP2*c* of the second dam portion DP2. The second metal layer 523 is integrally provided and may overlap the upper surface DP2*a* of the second dam portion DP2, the first side surface DP2*b* of the second dam portion DP2, and the second side surface DP2*c* of the second dam portion DP2.

As shown in FIG. 16B, the metal layer 520 may be directly on the second touch insulating layer 420. As shown in FIG. 16C, the metal layer 520 may be directly on the third touch insulating layer 440.

Figure 17A:
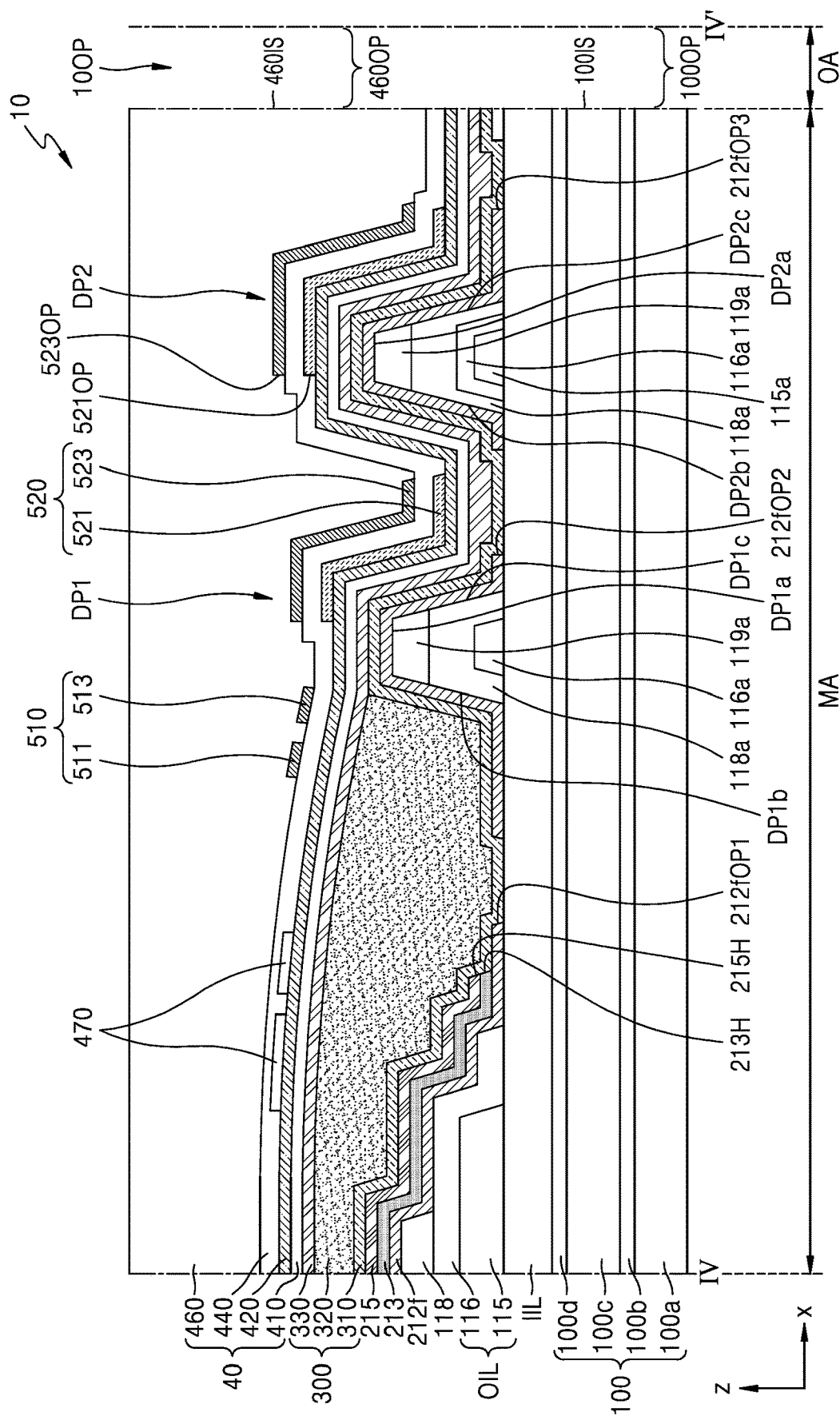
FIG. 17C is a schematic cross-sectional view of a portion of a display panel according to an embodiment.
Figure 17B:
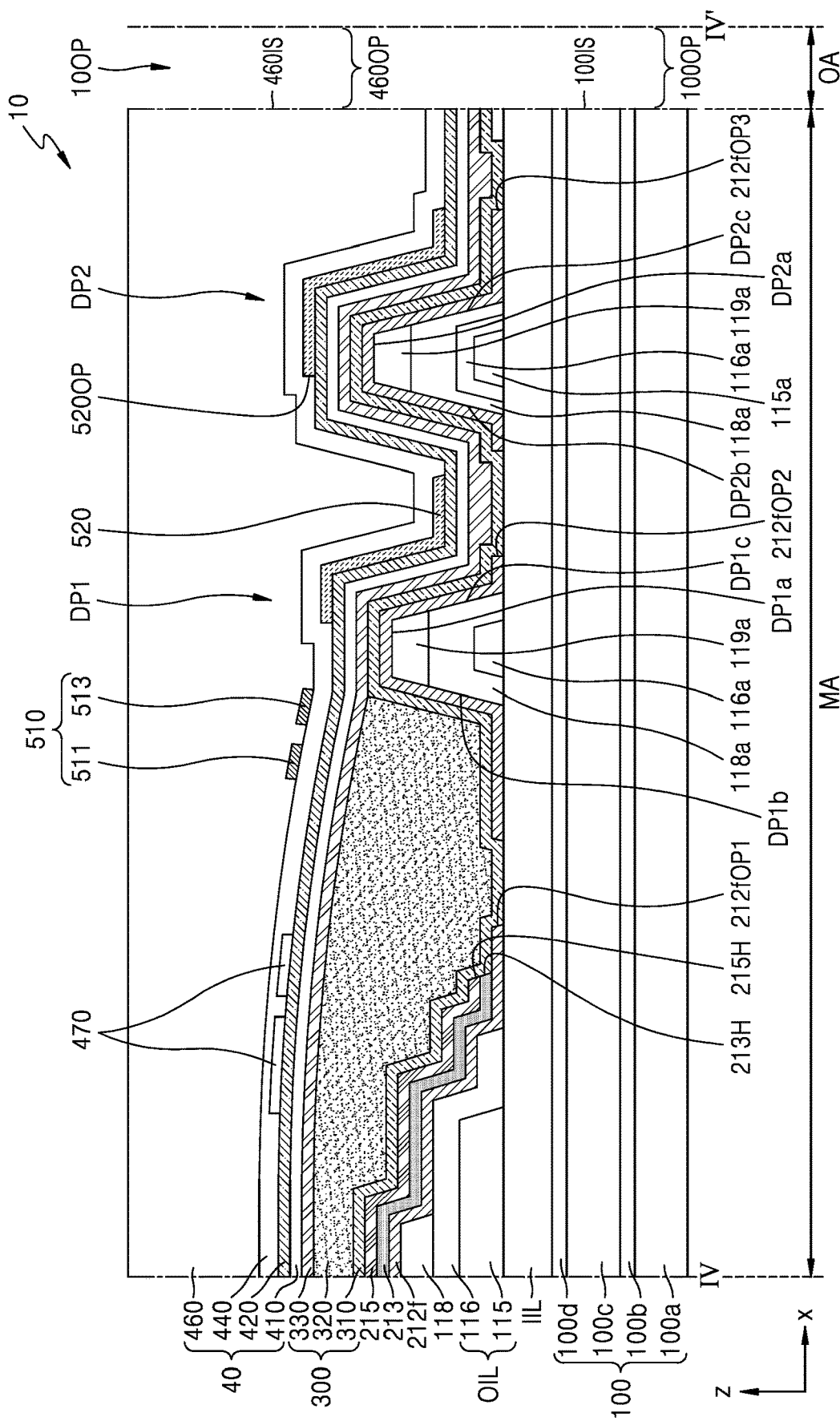
Figure 17C:
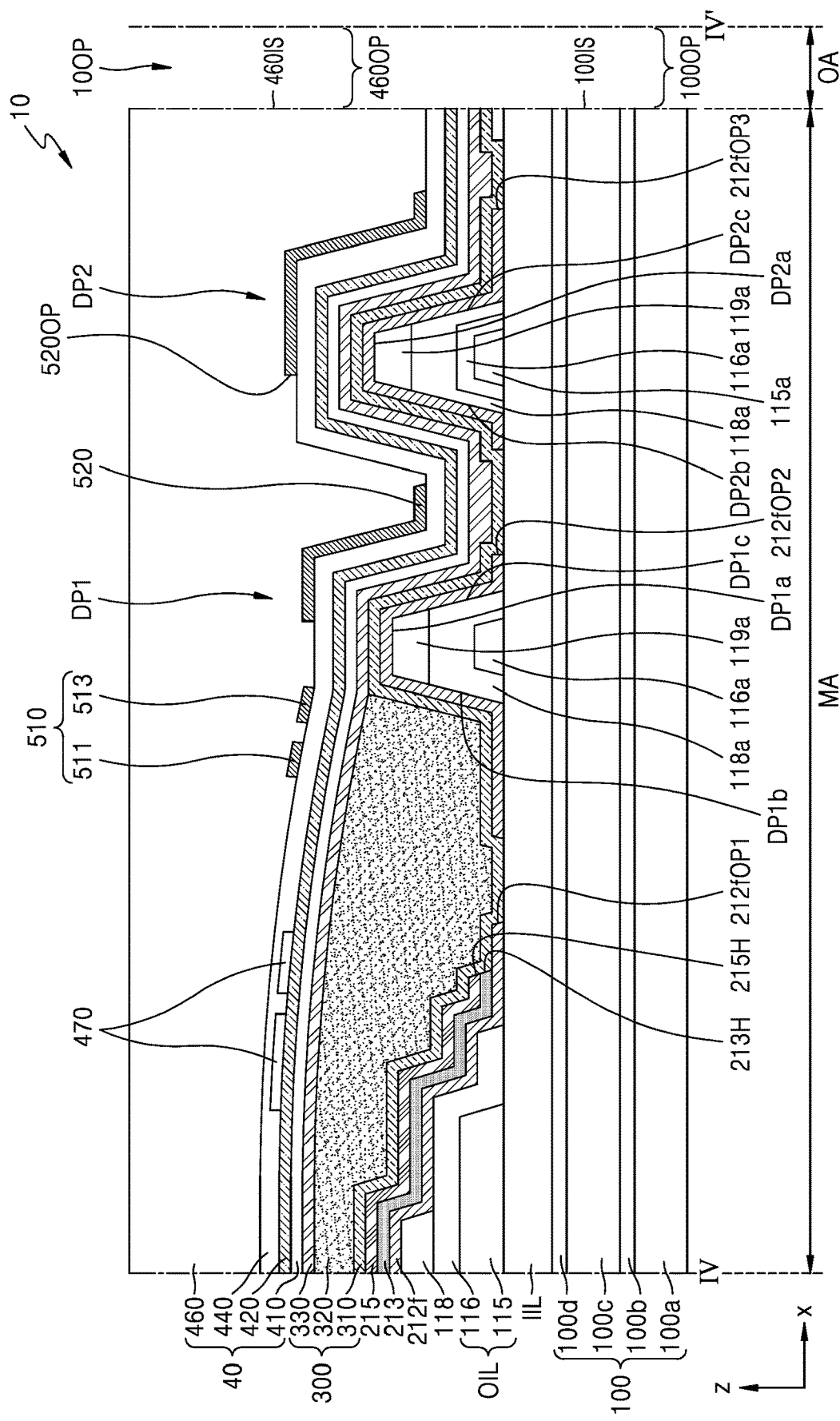

Each of FIGS. 17A to 17C is a schematic cross-sectional view of a portion of the display panel 10 according to an embodiment. The embodiments of FIGS. 17A to 17C differ from the embodiments of FIGS. 13A to 13C in that the metal layer 520 does not overlap the first side surface DP2*b* of the second dam portion DP2. In FIGS. 17A to 17C, the same reference numerals as those in FIGS. 13A to 13C refer to the same members and/or analogous members.

Referring to FIGS. 17A to 17C, the metal layer 520 may be on the second touch insulating layer 420 and/or the third touch insulating layer 440. The metal layer 520 may include the first metal layer 521 and the second metal layer 523, wherein the first metal layer 521 may be on the second touch insulating layer 420, and the second metal layer 523 may be on the third touch insulating layer 440.

The metal layer 520 at least partially overlaps the upper surface DP1*a* of the first dam portion DP1, the second side surface DP1*c* of the first dam portion DP1, the upper surface DP2*a* of the second dam portion DP2, and the second side surface DP2*c* of the second dam portion DP2, but may not overlap the first side surface DP2*b* of the second dam portion DP2. The metal layer 520 may at least partially cover the upper surface DP1*a* of the first dam portion DP1, the second side surface DP1*c* of the first dam portion DP1, the upper surface DP2*a* of the second dam portion DP2, and the second side surface DP2*c* of the second dam portion DP2, and may not cover the first side surface DP2*b* of the second dam portion DP2.

The first metal layer 521 and the second metal layer 523 at least partially overlap the upper surface DP1*a* of the first dam portion DP1, the second side surface DP1*c* of the first dam portion DP1, the upper surface DP2*a* of the second dam portion DP2, and the second side surface DP2*c* of the second dam portion DP2, but may not overlap the first side surface DP2*b* of the second dam portion DP2. The first metal layer 521 and the second metal layer 523 may at least partially cover the upper surface DP1*a* of the first dam portion DP1, the second side surface DP1*c* of the first dam portion DP1, the upper surface DP2*a* of the second dam portion DP2, and the second side surface DP2*c* of the second dam portion DP2, but may not cover the first side surface DP2*b* of the second dam portion DP2.

The first metal layer 521 and the second metal layer 523 may respectively have the openings 521OP and 523OP exposing at least a portion of the upper surface DP2*a* of the second dam portion DP2 and the first side surface DP2*b* of the second dam portion DP2.

As shown in FIG. 17B, the metal layer 520 may be directly on the second touch insulating layer 420. The metal layer 520 may include the opening 520OP exposing the second dam portion DP2. The opening 520OP formed in the metal layer 520 may at least partially expose the upper surface DP2*a* of the second dam portion DP2 and the first side surface DP2*b* of the second dam portion DP2.

As shown in FIG. 17C, the metal layer 520 may be directly on the third touch insulating layer 440. The metal layer 520 may include the opening 520OP exposing the second dam portion DP2. The opening 520OP formed in the metal layer 520 may at least partially expose the upper surface DP2*a* of the second dam portion DP2 and the first side surface DP2*b* of the second dam portion DP2.

Figure 18A:
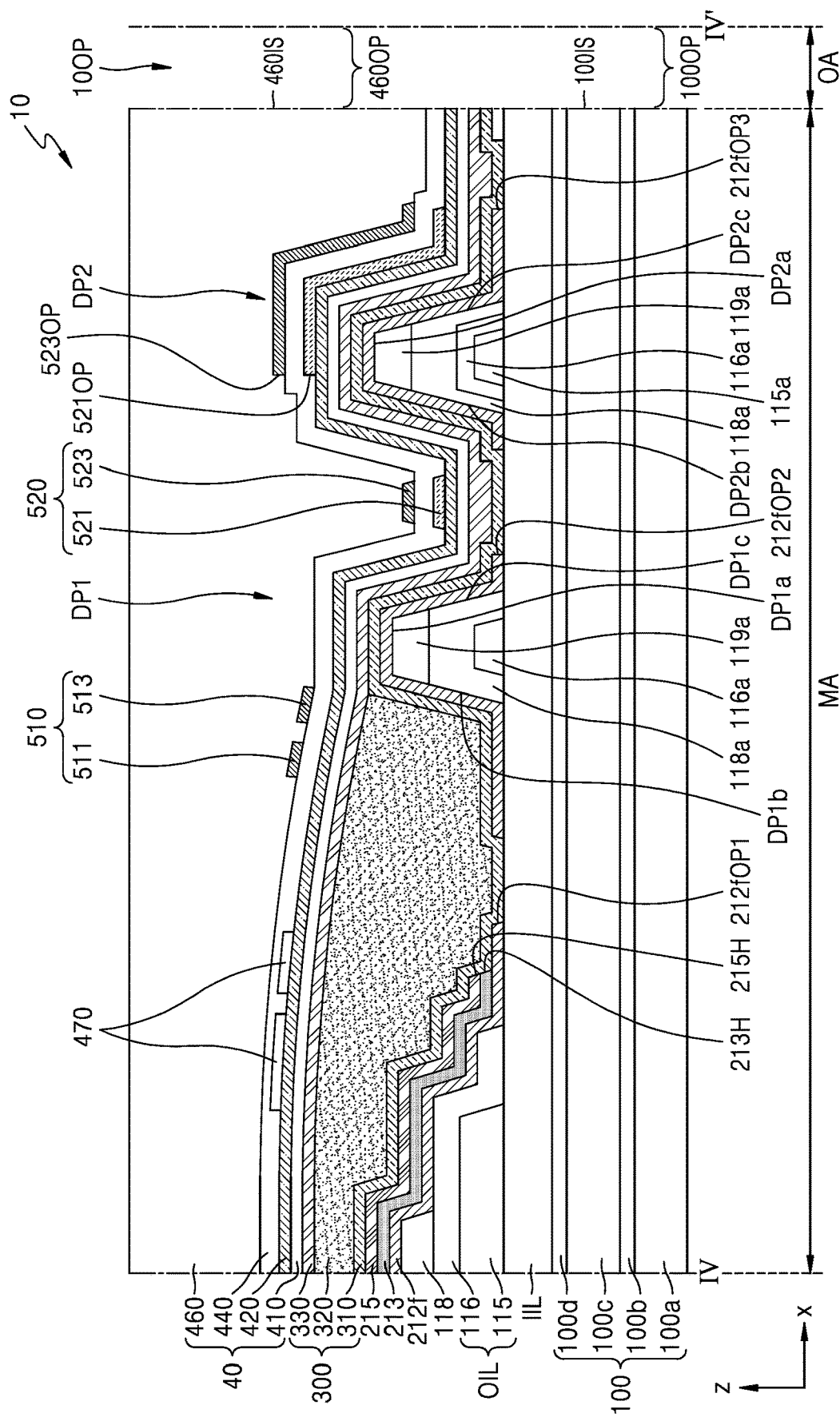
FIG. 18C is a schematic cross-sectional view of a portion of a display panel according to an embodiment.
Figure 18B:
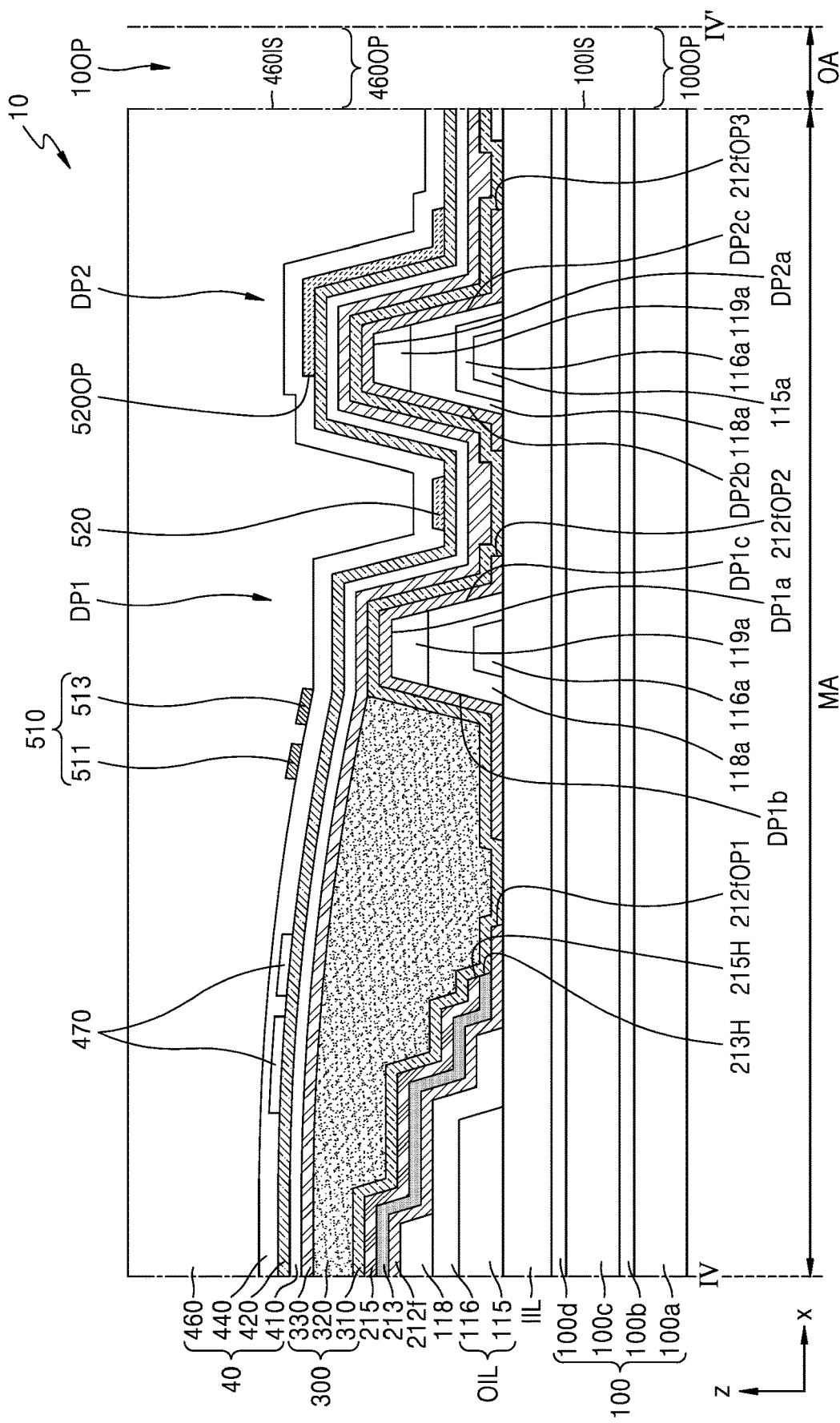
Figure 18C:
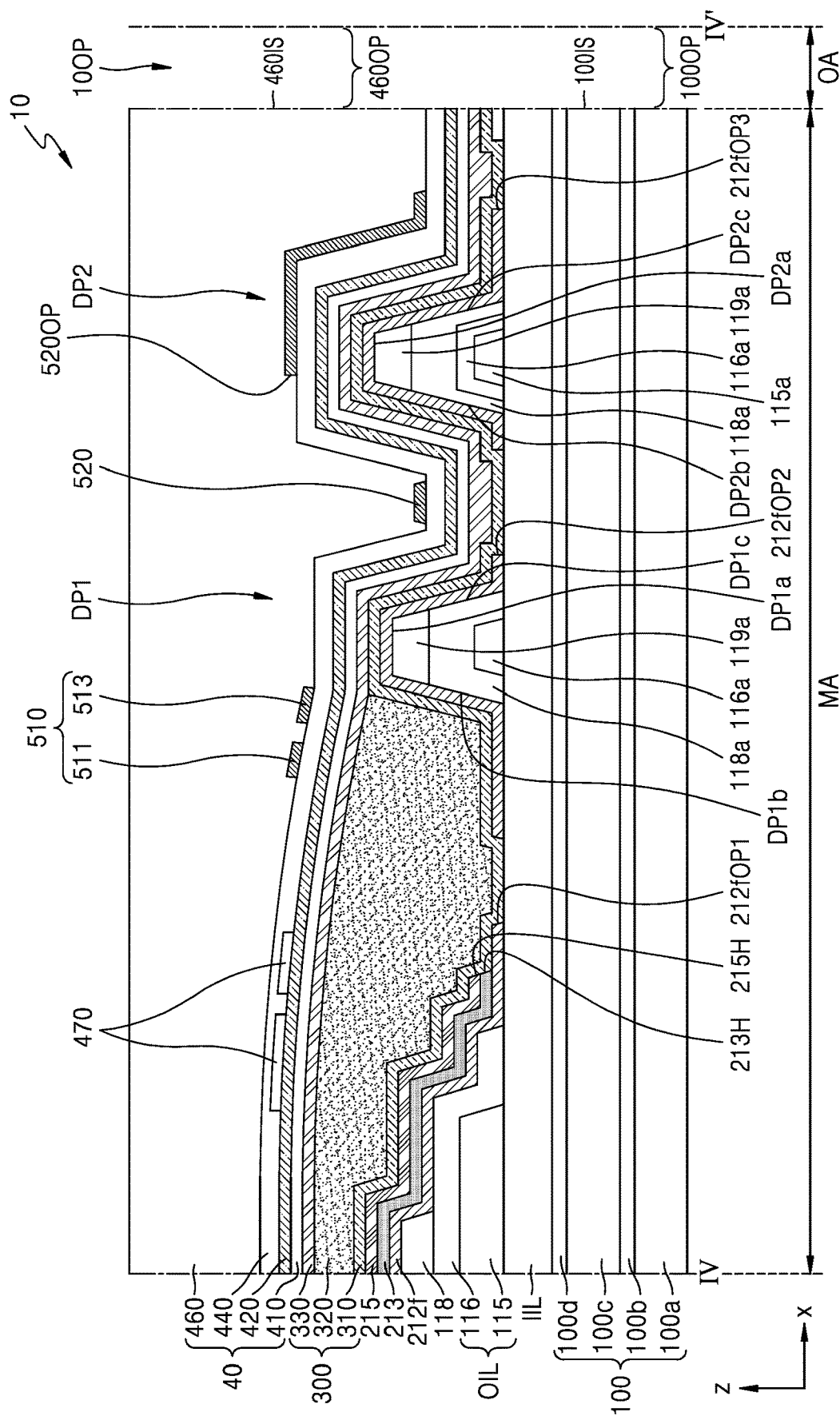

Each of FIGS. 18A to 18C is a schematic cross-sectional view of a portion of the display panel 10 according to an embodiment. The embodiments of FIGS. 18A to 18C differ from the embodiments of FIGS. 17A to 17C in that the metal layer 520 does not overlap the first dam portion DP1. In FIGS. 18A to 18C, the same reference numerals as those in FIGS. 17A to 17C refer to the same members and/or analogous members.

Referring to FIGS. 18A to 18C, the metal layer 520 may be on the second touch insulating layer 420 and/or the third touch insulating layer 440. The metal layer 520 may include the first metal layer 521 and the second metal layer 523, wherein the first metal layer 521 may be on the second touch insulating layer 420, and the second metal layer 523 may be on the third touch insulating layer 440.

The metal layer 520 may not overlap the first dam portion DP1, and may overlap the second dam portion DP2. The metal layer 520 may not be on the first dam portion DP1, and may be only on the second dam portion DP2. The metal layer 520 may not cover the first dam portion DP1, and may cover the second dam portion DP2.

The first metal layer 521 and the second metal layer 523 may at least partially overlap the second dam portion DP2, and the first metal layer 521 and the second metal layer 523 may not overlap the first dam portion DP1. The first metal layer 521 and the second metal layer 523 may at least partially overlap the upper surface DP2a of the second dam portion DP2, and may at least partially overlap the second side surface DP2c of the second dam portion DP2. The first metal layer 521 and the second metal layer 523 may respectively have the openings 521OP and 523OP exposing at least a portion of the upper surface DP2a of the second dam portion DP2 and the first side surface DP2b of the second dam portion DP2.

As shown in FIG. 18B, the metal layer 520 may be directly on the second touch insulating layer 420. The metal layer 520 may include the opening 520OP exposing the second dam portion DP2. The opening 520OP formed in the metal layer 520 may at least partially expose the upper surface DP2a of the second dam portion DP2 and the first side surface DP2b of the second dam portion DP2.

As shown in FIG. 18C, the metal layer 520 may be directly on the third touch insulating layer 440. The metal layer 520 may include the opening 520OP exposing the second dam portion DP2. The opening 520OP formed in the metal layer 520 may at least partially expose the upper surface DP2a of the second dam portion DP2 and the first side surface DP2b of the second dam portion DP2.

Figure 19A:
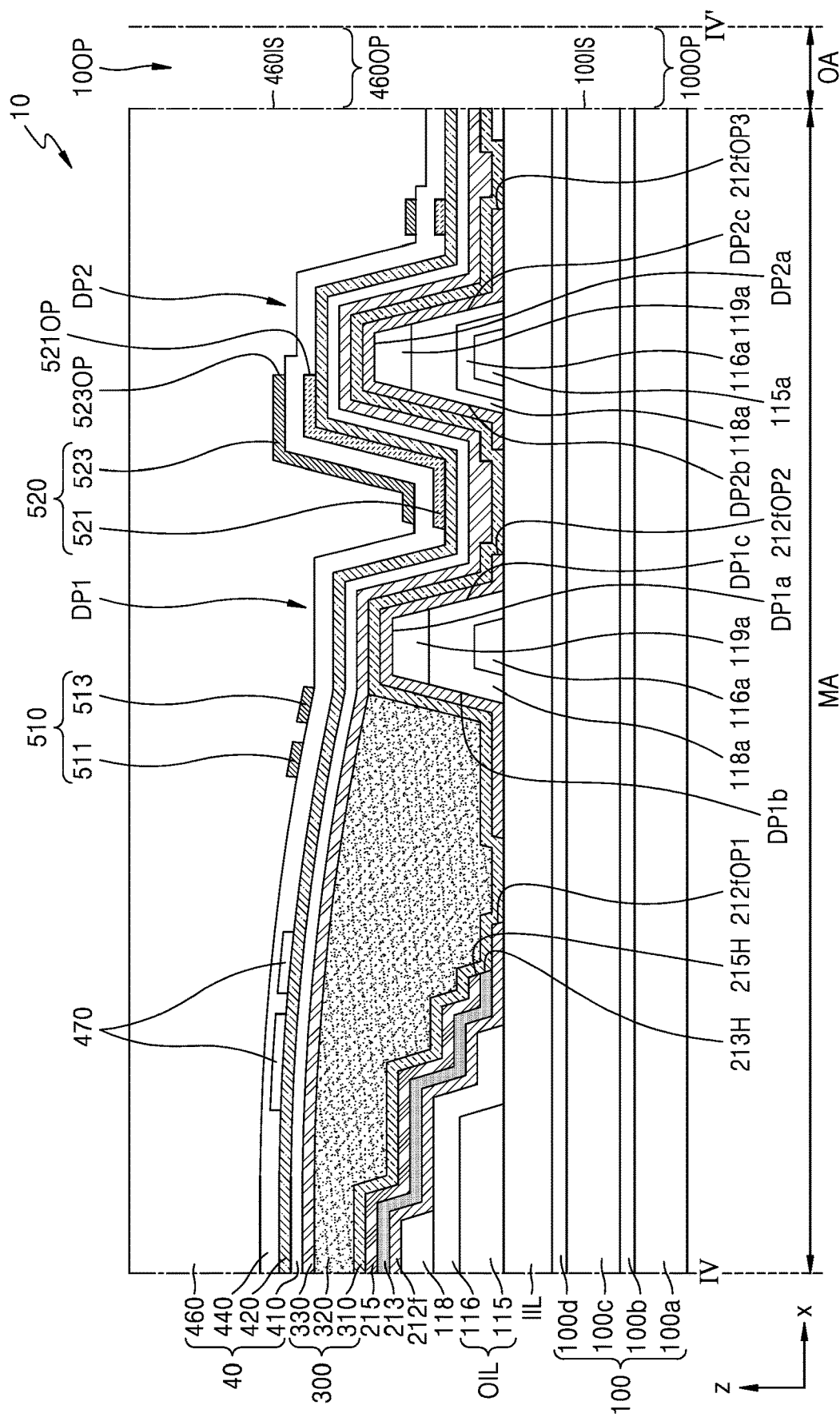
FIG. 19C is a schematic cross-sectional view of a portion of a display panel according to an embodiment.
Figure 19B:
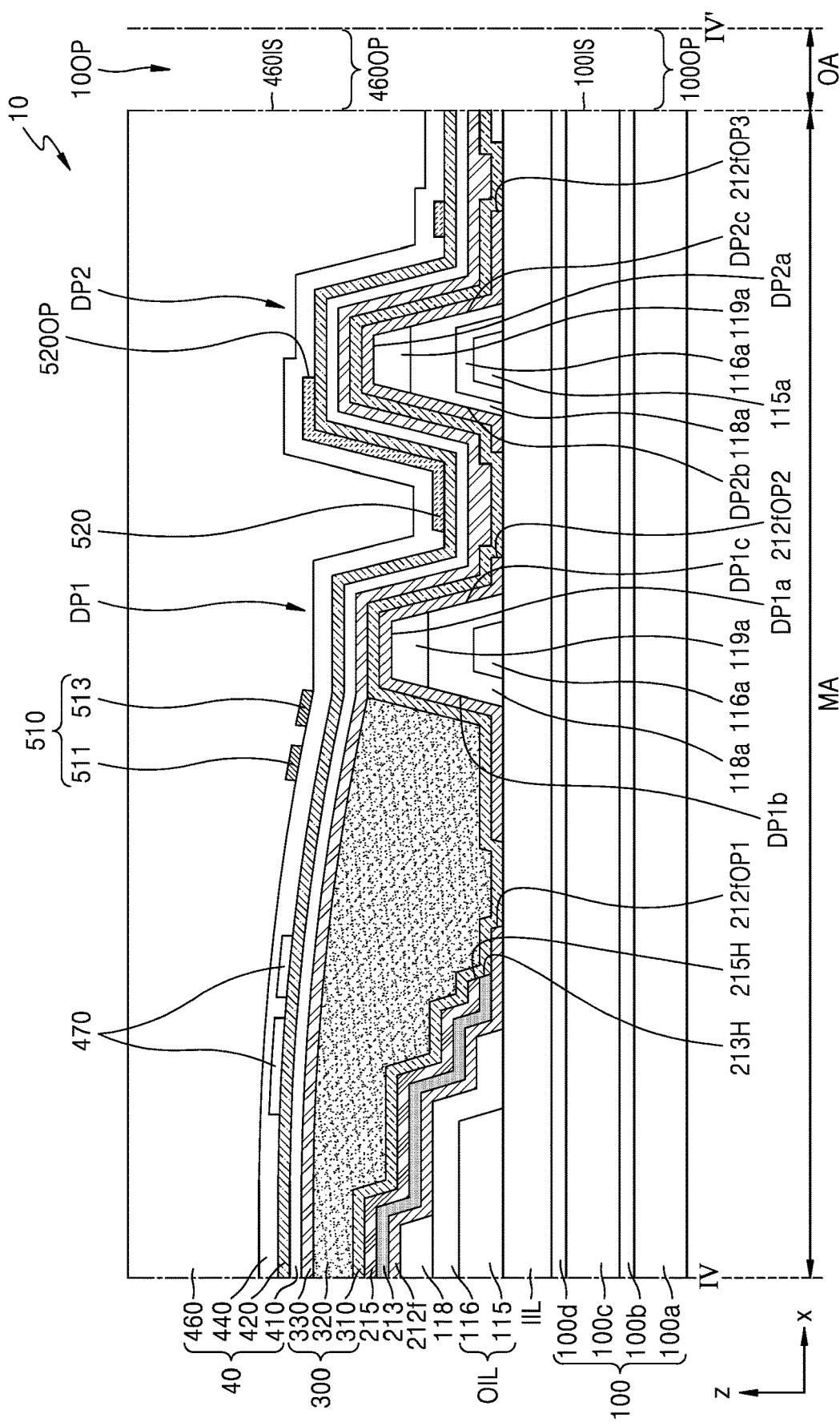
Figure 19C:
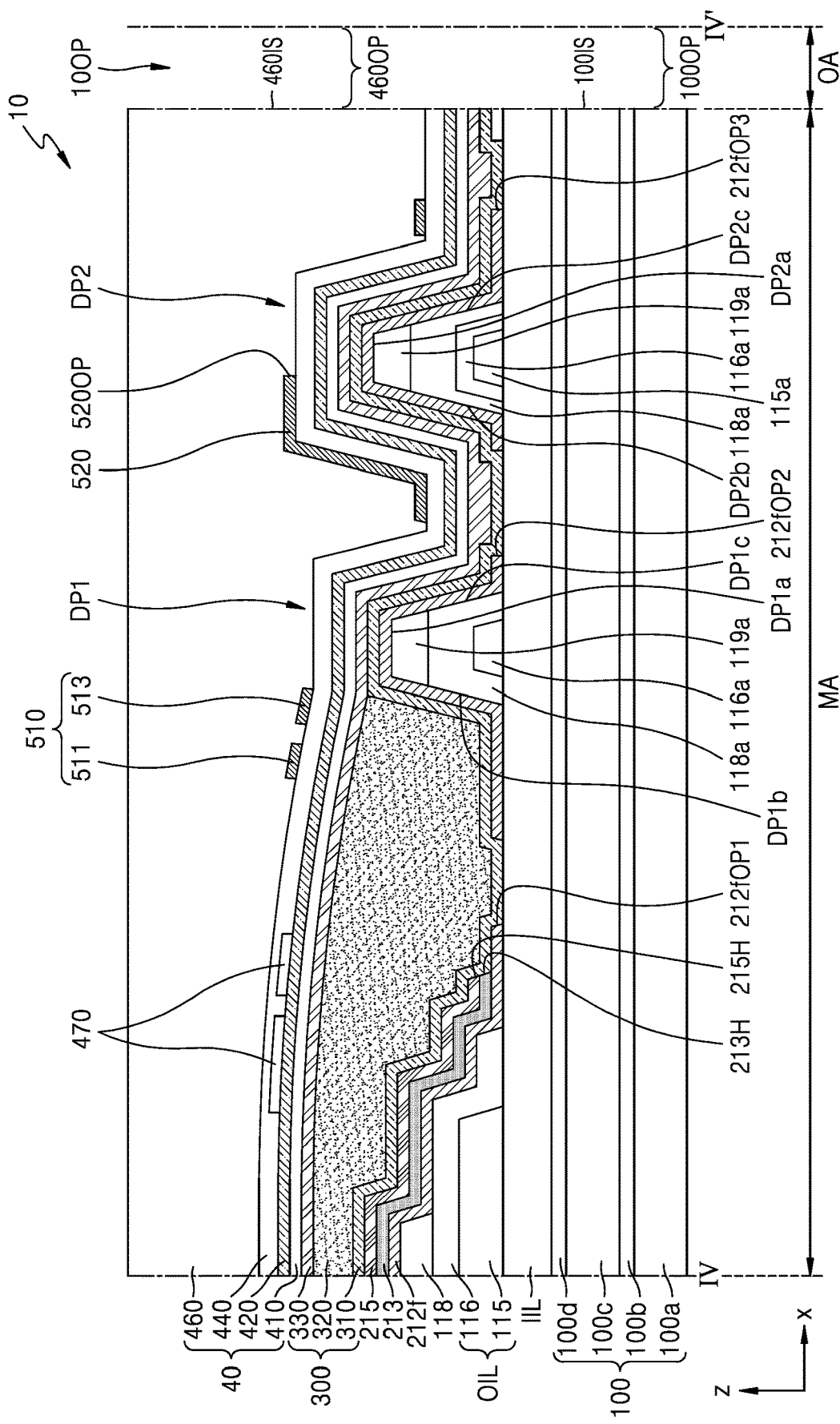

Each of FIGS. 19A to 19C is a schematic cross-sectional view of a portion of the display panel 10 according to an embodiment. The embodiments of FIGS. 19A to 19C differ from the embodiments of FIGS. 18A to 18C in that the metal layer 520 overlaps the first side surface DP2b of the second dam portion DP2 and does not overlap the second side surface DP2c of the second dam portion DP2. In FIGS. 19A to 19C, the same reference numerals as those in FIGS. 18A to 18C refer to the same members and/or analogous members.

Referring to FIGS. 19A to 19C, the metal layer 520 may be on the second touch insulating layer 420 and/or the third touch insulating layer 440. The metal layer 520 may include the first metal layer 521 and the second metal layer 523, wherein the first metal layer 521 may be on the second touch insulating layer 420, and the second metal layer 523 may be on the third touch insulating layer 440.

The metal layer 520 may overlap the first side surface DP2b of the second dam portion DP2, and may not overlap the second side surface DP2c of the second dam portion DP2. The metal layer 520 may at least partially cover the first side surface DP2b of the second dam portion DP2, and may not cover the second side surface DP2c of the second dam portion DP2.

The first metal layer 521 and the second metal layer 523 may at least partially overlap the upper surface DP2a of the second dam portion DP2, and may at least partially overlap the first side surface DP2b of the second dam portion DP2. The first metal layer 521 and the second metal layer 523 may respectively have the openings 521OP and 523OP exposing at least a portion of the upper surface DP2a of the second dam portion DP2 and the second side surface DP2c of the second dam portion DP2.

As shown in FIG. 19B, the metal layer 520 may be directly on the second touch insulating layer 420. The metal layer 520 may include the opening 520OP exposing the second dam portion DP2. The opening 520OP formed in the metal layer 520 may at least partially expose the upper surface DP2a of the second dam portion DP2 and the second side surface DP2c of the second dam portion DP2.

As shown in FIG. 19C, the metal layer 520 may be directly on the third touch insulating layer 440. The metal layer 520 may include the opening 520OP exposing the second dam portion DP2. The opening 520OP formed in the metal layer 520 may at least partially expose the upper surface DP2a of the second dam portion DP2 and the second side surface DP2c of the second dam portion DP2.

Figure 20:
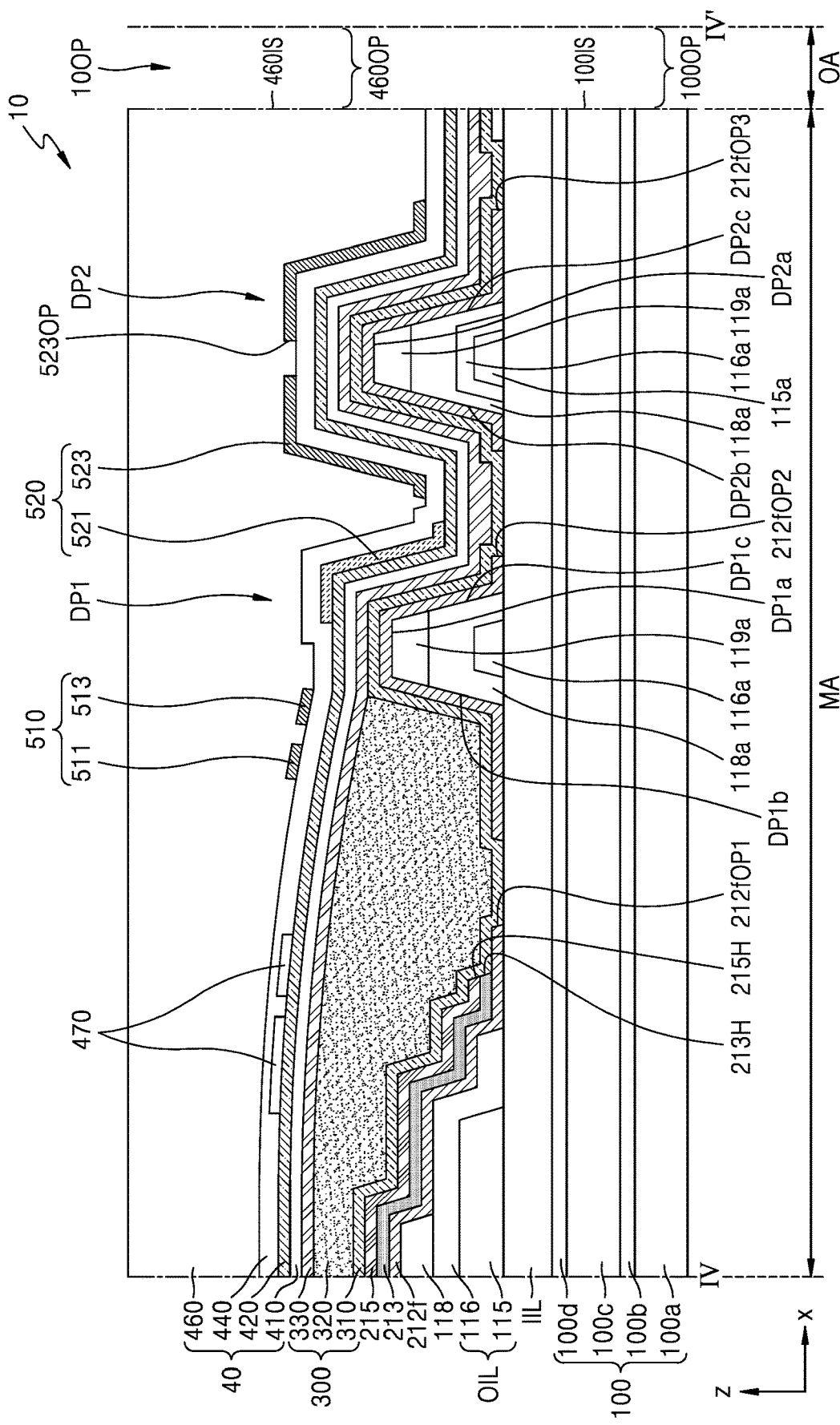
FIG. 20 is a schematic cross-sectional view of a portion of a display panel according to an embodiment.

FIG. 20 is a schematic cross-sectional view of a portion of the display panel 10 according to an embodiment. The embodiment of FIG. 20 differs from the embodiment of FIG. 13A in that the first metal layer 521 at least partially overlaps the first dam portion DP1, and the second metal layer 523 at least partially overlaps the second dam portion DP2. In FIG. 20, the same reference numerals as those in FIG. 13A refer to the same members and/or analogous members.

Referring to FIG. 20, the metal layer 520 may be in the middle area MA. The metal layer 520 may overlap at least one of the first dam portion DP1 and the second dam portion DP2.

The metal layer 520 may be on the second touch insulating layer 420 and/or the third touch insulating layer 440. The metal layer 520 may include the first metal layer 521 and the second metal layer 523, wherein the first metal layer 521 may be on the second touch insulating layer 420, and the second metal layer 523 may be on the third touch insulating layer 440.

The first metal layer 521 may at least partially overlap the first dam portion DP1, and the second metal layer 523 may at least partially overlap the second dam portion DP2. The first metal layer 521 may at least partially overlap the upper surface DP1a of the first dam portion DP1 and the second side surface DP1c of the first dam portion DP1; the second metal layer 523 may at least partially overlap the upper surface DP2a of the second dam portion DP2, the first side surface DP2b of the second dam portion DP2, and the second side surface DP2c of the second dam portion DP2.

The second metal layer 523 may include the opening 523OP exposing the second dam portion DP2. The opening 523OP formed in the second metal layer 523 may at least partially expose the upper surface DP2a of the second dam portion DP2.

Figure 21:
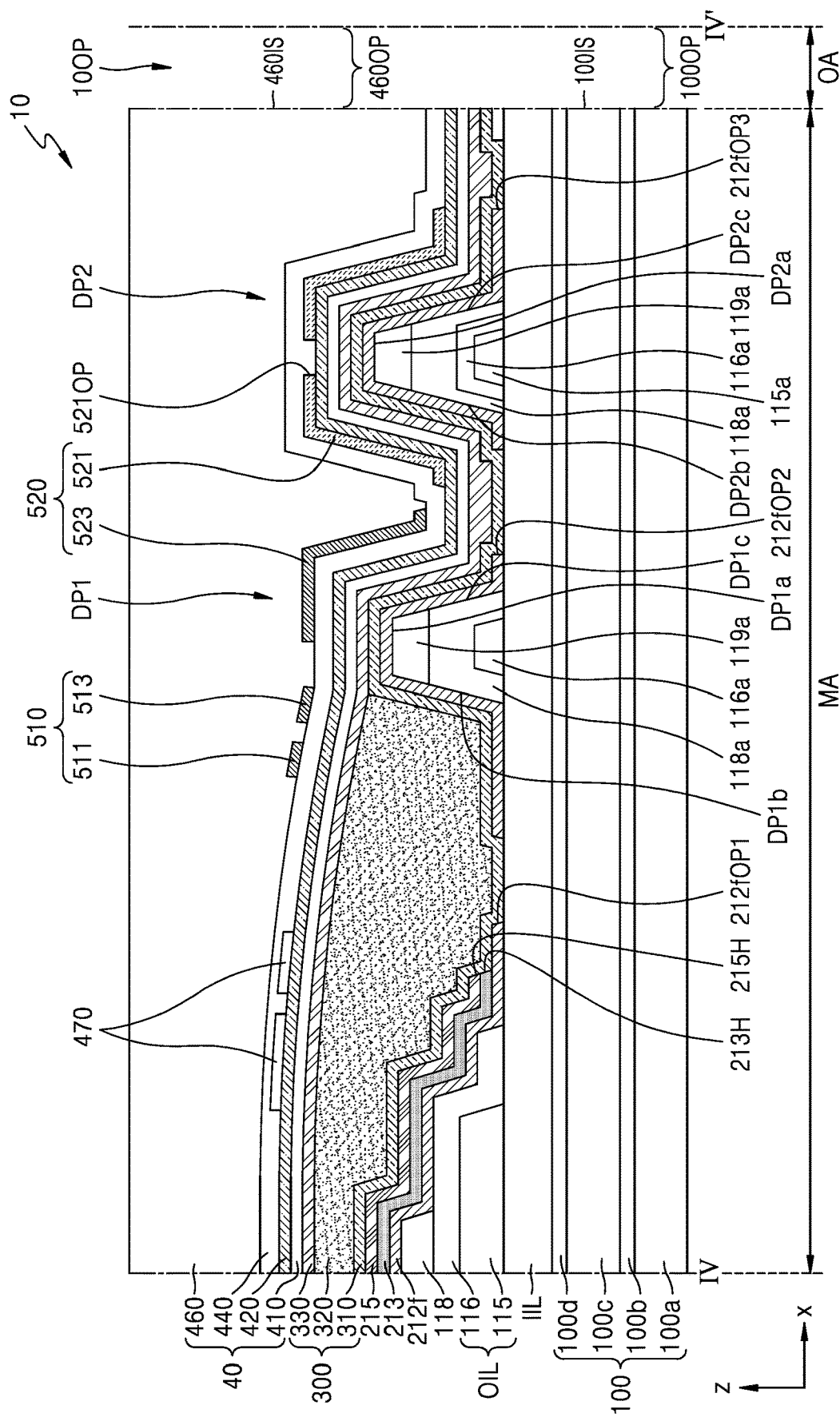
FIG. 21 is a schematic cross-sectional view of a portion of a display panel according to an embodiment.

FIG. 21 is a schematic cross-sectional view of a portion of the display panel 10. The embodiment of FIG. 21 differs from the embodiment of FIG. 13A in that the first metal layer 521 at least partially overlaps the second dam portion DP2, and the second metal layer 523 at least partially overlaps the first dam portion DP1. In FIG. 21, the same reference numerals as those in FIG. 13A refer to the same members and/or analogous members.

Referring to FIG. 21, the metal layer 520 may be in the middle area MA. The metal layer 520 may overlap at least one of the first dam portion DP1 and the second dam portion DP2.

The metal layer 520 may be on the second touch insulating layer 420 and/or the third touch insulating layer 440. The metal layer 520 may include the first metal layer 521 and the second metal layer 523, wherein the first metal layer 521 may be on the second touch insulating layer 420, and the second metal layer 523 may be on the third touch insulating layer 440.

The first metal layer 521 may at least partially overlap the second dam portion DP2, and the second metal layer 523 may at least partially overlap the first dam portion DP1. The first metal layer 521 may at least partially overlap the upper surface DP2a of the second dam portion DP2, the first side surface DP2b of the second dam portion DP2, and the second side surface DP2c of the second dam portion DP2, and the second metal layer 523 may at least partially overlap the upper surface DP1a of the first dam portion DP1 and the second side surface DP1c of the first dam portion DP1.

The first metal layer 521 may include the opening 521OP exposing the second dam portion DP2. The opening 521OP formed in the first metal layer 521 may at least partially expose the upper surface DP2a of the second dam portion DP2.

When a groove is formed in the substrate 100 or the organic insulating layer OIL to prevent oxygen or moisture in the vicinity of the opening area OA from penetrating (or diffusing) into the light-emitting diode of the display area DA, an organic insulating layer for filling the groove may be needed, and an operation of filling the groove may be performed between operations of forming the first touch insulating layer 410 and the second touch insulating layer 420.

The display panel 10 may include no groove in the substrate 100 or the organic insulating layer OIL. Therefore, no operation of filling the groove may be needed, and a manufacturing operation of the display panel 10 may be simplified. In addition, a step difference between the display area DA and the middle area MA may be minimized by the planarization layer 460 formed on the second conductive layer 450.

Figure 22A:
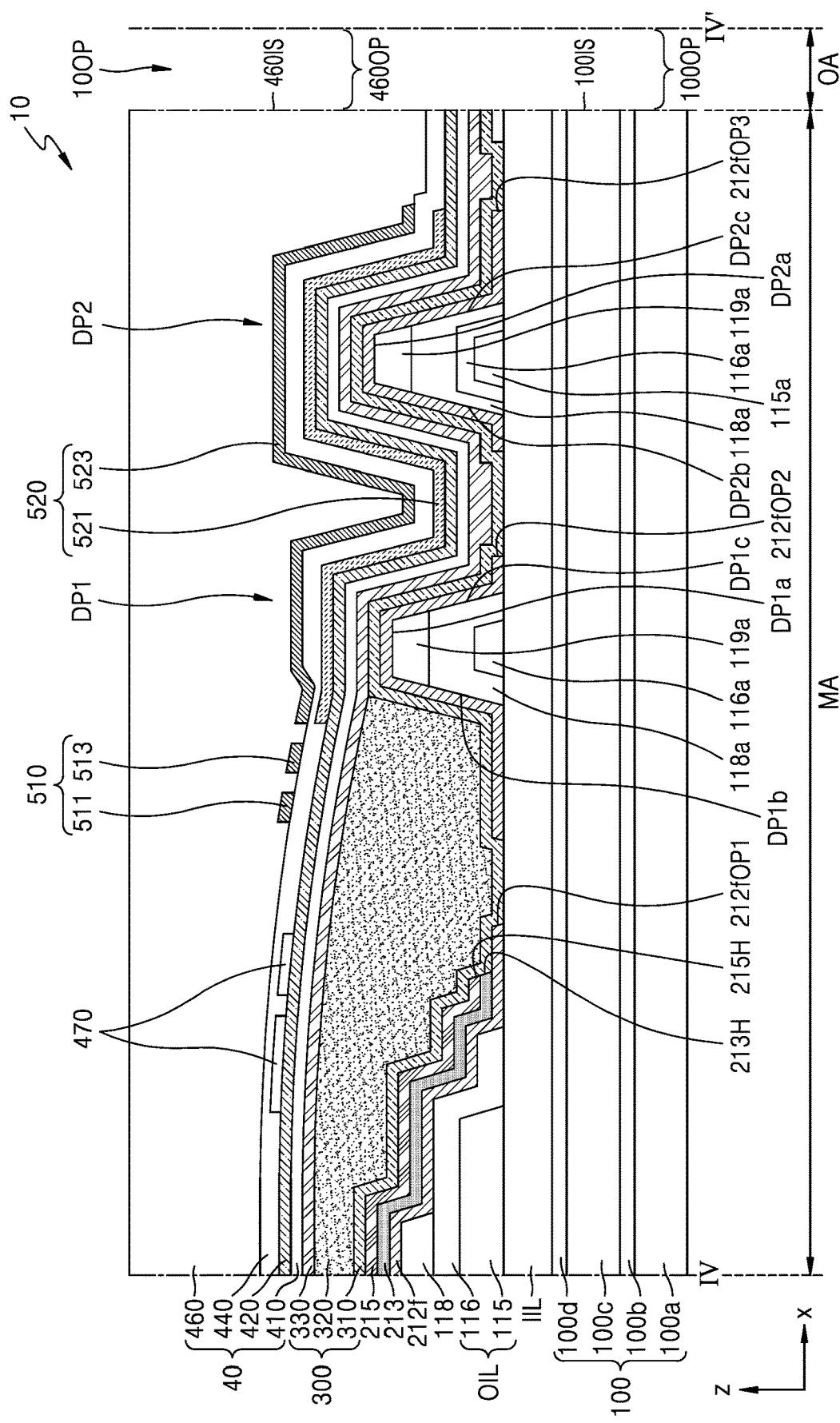
FIG. 22C is a schematic cross-sectional view of a portion of a display panel according to an embodiment.
Figure 22B:
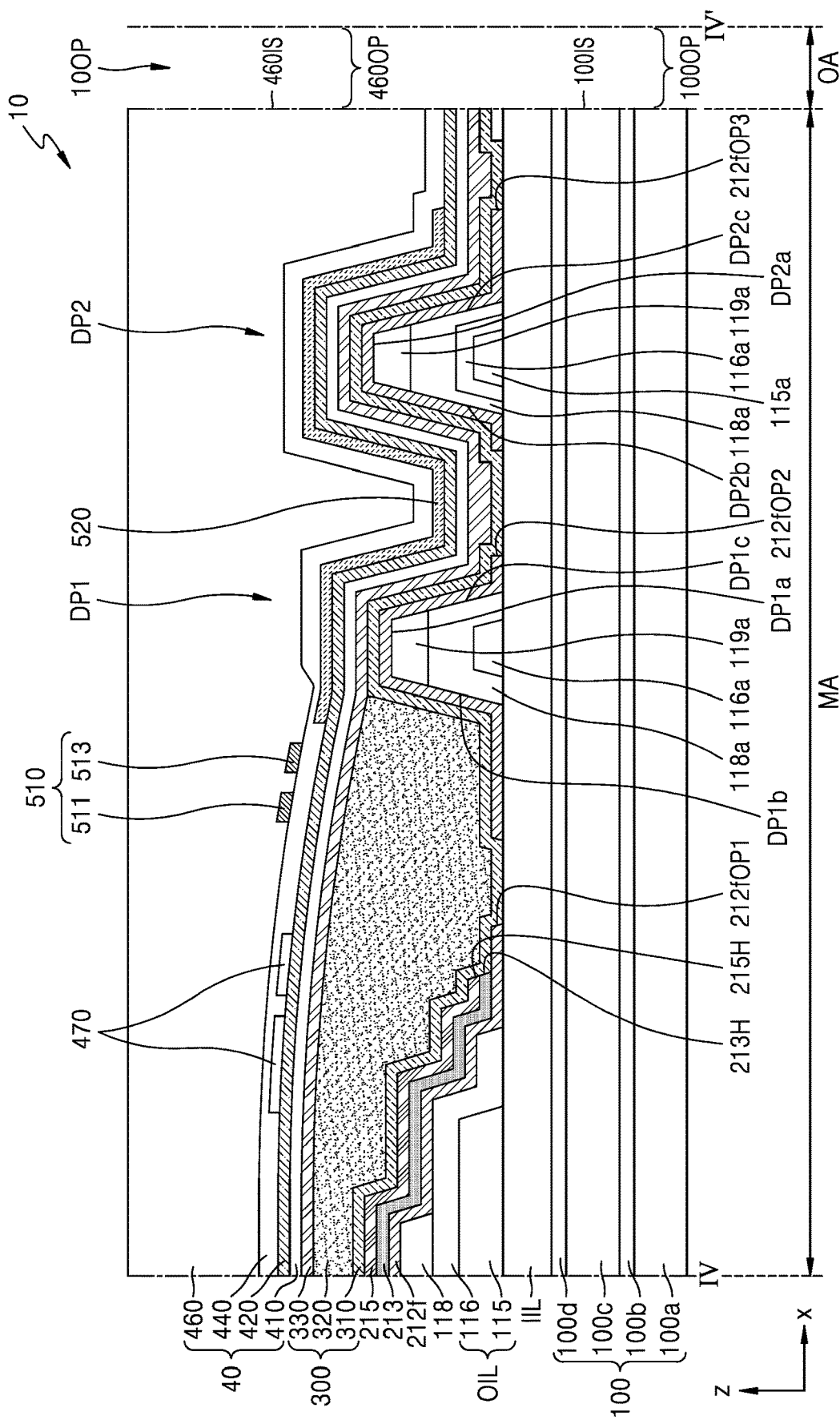
Figure 22C:
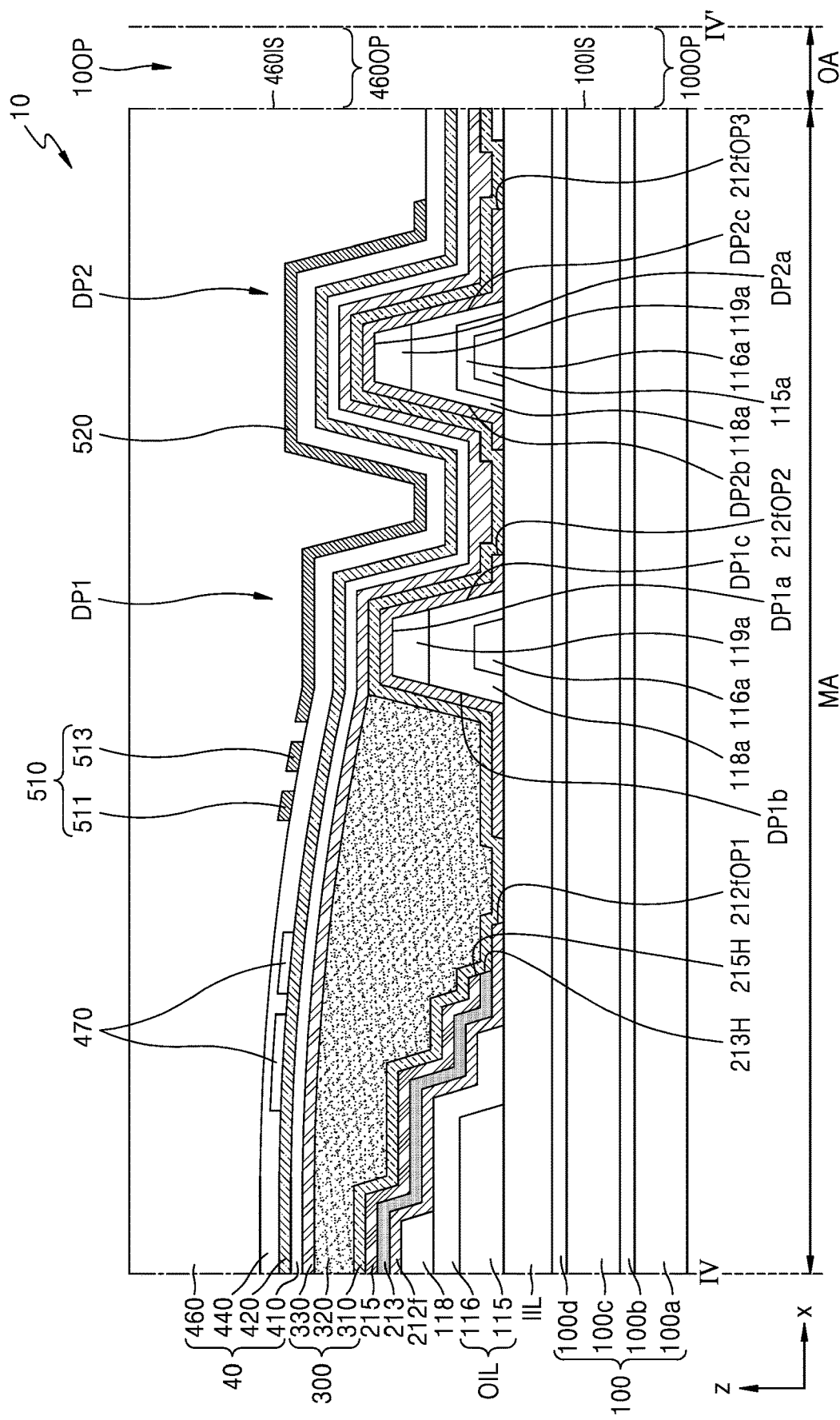

FIGS. 22A to 22C are schematic cross-sectional views each illustrating a portion of the display panel 10 according to an embodiment. In FIGS. 22A to 22C, the same reference numerals as those of FIGS. 14A to 14C refer to the same members or analogous members.

Referring to FIGS. 22A to 22C, the metal layer 520 may be arranged on the second touch insulating layer 420 and/or the third touch insulating layer 440. The metal layer 520 may include the first metal layer 521 and the second metal layer 523, wherein the first metal layer 521 may be arranged on the second touch insulating layer 420, and the second metal layer 523 may be arranged on the third touch insulating layer 440.

The metal layer 520 may partially or completely overlap the upper surface of the first dam portion DP1, the first side surface DP1b of the first dam portion DP1, and the second side surface DP1C of the first dam portion DP1. Each of the first metal layer 521 and the second metal layer 523 may partially or completely overlap the upper surface of the first dam portion DP1, the first side surface DP1b of the first dam portion DP1, and the second side surface DP1C of the first dam portion DP1.

The metal layer 520 may partially or completely cover the upper surface of the first dam portion DP1, the first side surface DP1b of the first dam portion DP1, and the second side surface DP1C of the first dam portion DP1. Each of the first metal layer 521 and the second metal layer 523 may partially or completely cover the upper surface of the first dam portion DP1, the first side surface DP1b of the first dam portion DP1, and the second side surface DP1C of the first dam portion DP1.

The metal layer 520 may partially or completely overlap the upper surface DP2a of the second dam portion DP2, the first side surface DP2b of the second dam portion DP2, and the second side surface DP2c of the second dam portion DP2. Each of the first metal layer 521 and the second metal layer 523 may partially or completely overlap the upper surface DP2a of the second dam portion DP2, the first side surface DP2b of the second dam portion DP2, and the second side surface DP2c of the second dam portion DP2.

The metal layer 520 may partially or completely cover the upper surface DP2a of the second dam portion DP2, the first side surface DP2b of the second dam portion DP2, and the second side surface DP2c of the second dam portion DP2. Each of the first metal layer 521 and the second metal layer 523 may partially or completely cover the upper surface DP2a of the second dam portion DP2, the first side surface DP2b of the second dam portion DP2, and the second side surface DP2c of the second dam portion DP2.

The metal layer 520 may be integrally formed to partially or completely overlap the first dam portion DP1 and the second dam portion DP2. The metal layer 520 may be integrally formed to partially or completely overlap the upper surface DP1a of the first dam portion DP1, the first side surface DP1b of the first dam portion DP1, the second side surface DP1c of the first dam portion DP1, the upper surface DP2a of the second dam portion DP2, the first side surface DP2b of the second dam portion DP2, and the second side surface DP2c of the second dam portion DP2. Each of the first metal layer 521 and the second metal layer 523 may be integrally formed to partially or completely overlap the upper surface DP1a of the first dam portion DP1, the first side surface DP1b of the first dam portion DP1, the second side surface DP1c of the first dam portion DP1, the upper surface DP2a of the second dam portion DP2, the first side surface DP2b of the second dam portion DP2, and the second side surface DP2c of the second dam portion DP2.

The metal layer 520 may be integrally formed to partially or completely cover the first dam portion DP1 and the second dam portion DP2. The metal layer 520 may be integrally formed to partially or completely cover the upper surface DP1a of the first dam portion DP1, the first side surface DP1b of the first dam portion DP1, the second side surface DP1c of the first dam portion DP1, the upper surface DP2a of the second dam portion DP2, the first side surface DP2b of the second dam portion DP2, and the second side surface DP2c of the second dam portion DP2. Each of the first metal layer 521 and the second metal layer 523 may be integrally formed to partially or completely cover the upper surface DP1a of the first dam portion DP1, the first side surface DP1b of the first dam portion DP1, the second side surface DP1c of the first dam portion DP1, the upper surface DP2a of the second dam portion DP2, the first side surface DP2b of the second dam portion DP2, and the second side surface DP2c of the second dam portion DP2.

Referring to FIG. 22B, the metal layer 520 may be arranged only directly the second touch insulating layer 420 and covered by the third touch insulating layer 440. Referring to FIG. 22C, the metal layer 520 may be arranged directly on the third touch insulating layer 440 and spaced from the second touch insulating layer 420.

Referring to FIGS. 22A to 22C, the crack sensing layer 510 may include the first crack sensing layer 511 and the second crack sensing layer 513. The crack sensing layer 510 may be between the first opening 212f OP1 defined in the functional layer 212f and the first dam portion DP1.

Figure 23A:
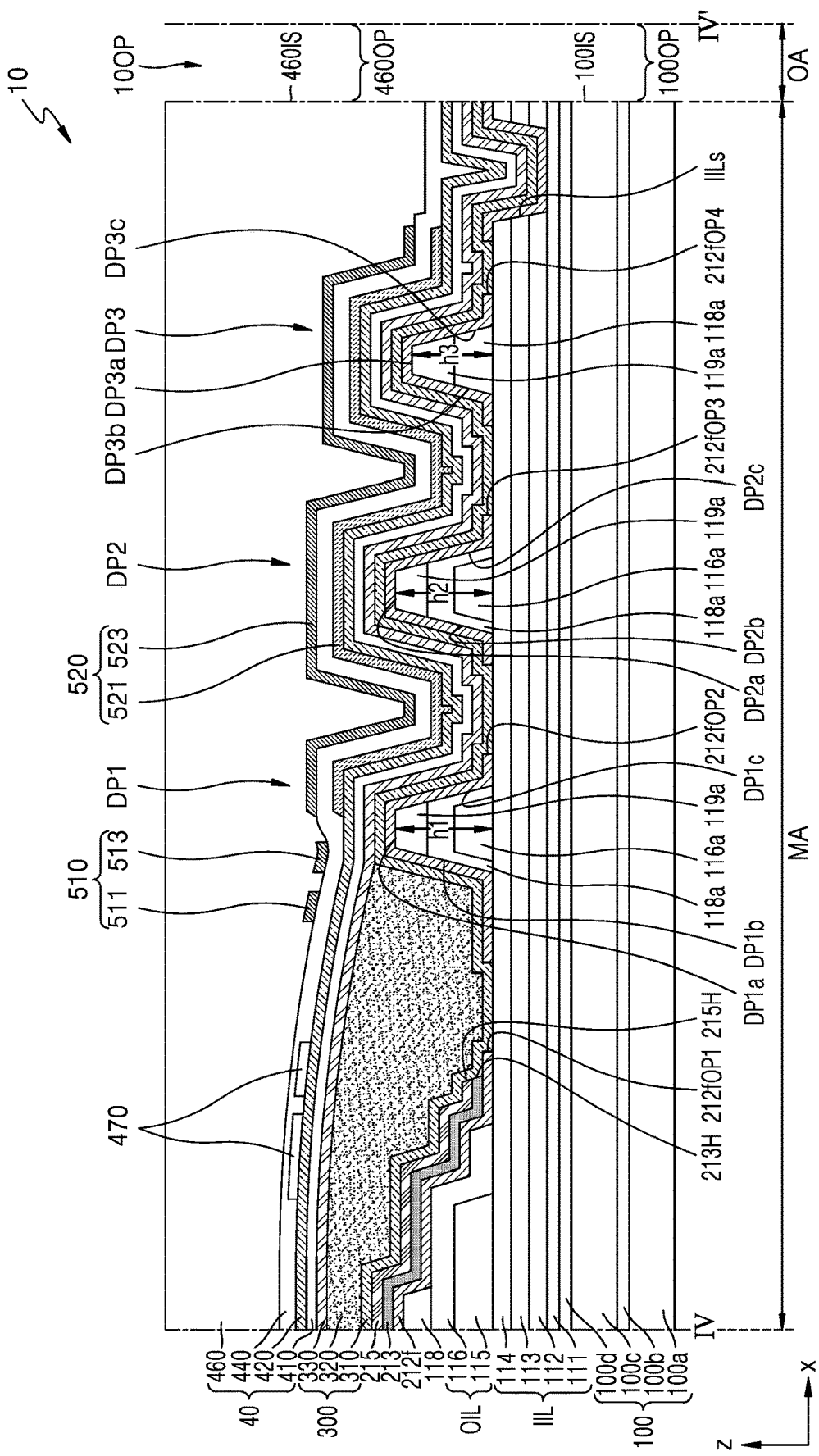
FIG. 23C is a schematic cross-sectional view of a portion of a display panel according to an embodiment.
Figure 23B:
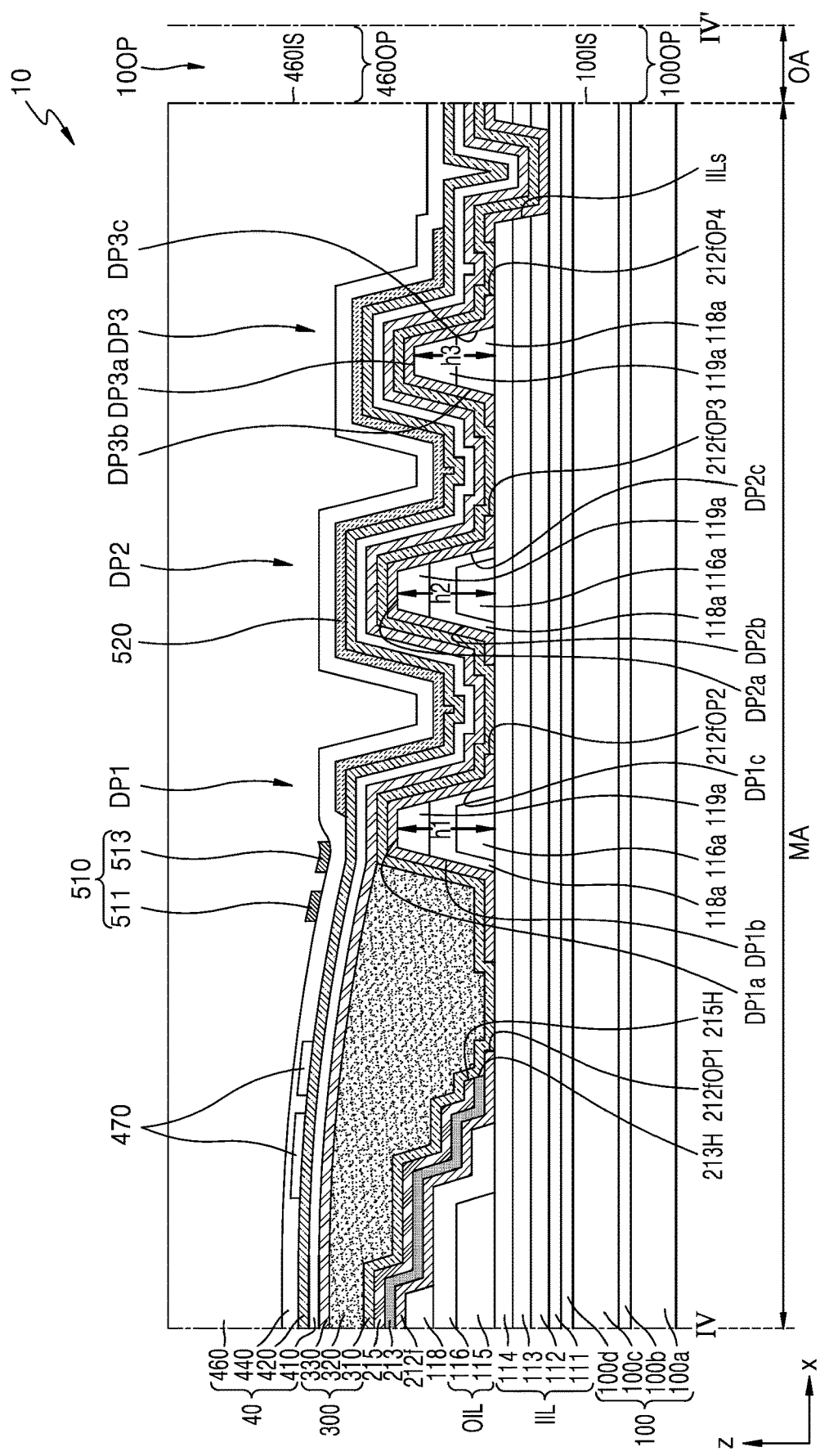
Figure 23C:
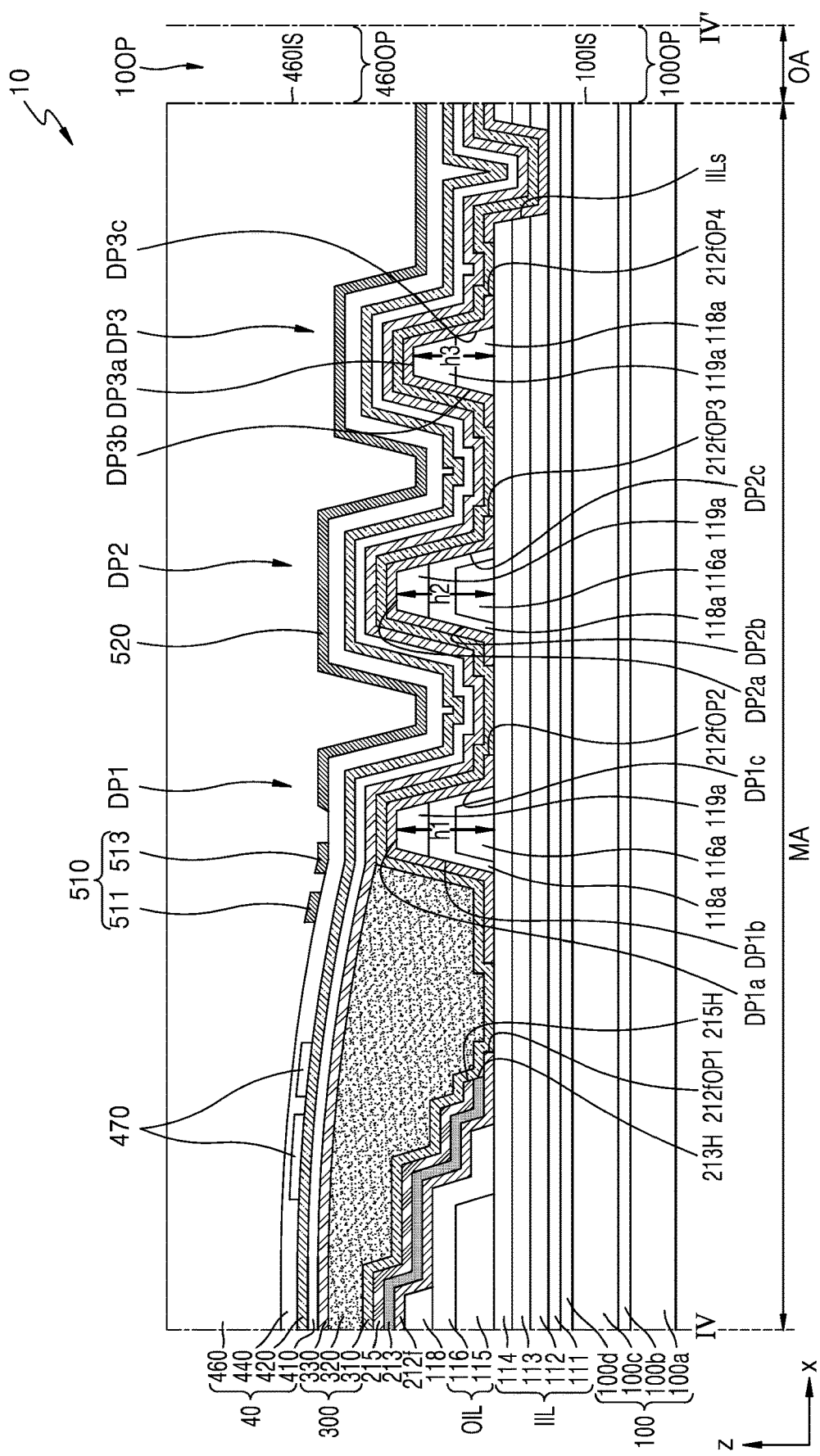

FIGS. 23A to 23C are schematic cross-sectional views each illustrating a portion of the display panel 10 according to an embodiment. FIGS. 23A to 23C illustrate components arranged in the middle area MA. In FIGS. 23A to 23C, the same reference numerals as those in FIG. 6 refer to the same members or analogous members.

Referring to FIGS. 23A to 23C, The substrate 100 may include the first base layer 100a, the first barrier layer 100b, the second base layer 100c, and the second barrier layer 100d. The first base layer 100a, the first barrier layer 100b, the second base layer 100c, and the second barrier layer 100d may be continuously arranged. The first base layer 100a, the first barrier layer 100b, the second base layer 100c, and the second barrier layer 100d may be continuously arranged in a direction from a display area (DA of FIG. 6) to the opening area OA.

The inorganic insulating layer IIL may be on the substrate 100. The inorganic insulating layer IIL may include the buffer layer 111, the first gate insulating layer 112, the second gate insulating layer 113, and the interlayer insulating layer 114. At least one of the buffer layer 111, the first gate insulating layer 112, the second gate insulating layer 113, and the interlayer insulating layer 114 may be discontinuous in the middle area MA.

The organic insulating layer OIL may be on the inorganic insulating layer IIL. The organic insulating layer OIL may include the first organic insulating layer 115 and the second organic insulating layer 116. The second organic insulating layer 116 may cover a side surface of the first organic insulating layer 115. The second organic insulating layer 116 may expose the side surface of the first organic insulating layer 115. The pixel defining film 118 may be on the second organic insulating layer 116.

As described with reference to FIG. 7, the first dam portion DP1 and the second dam portion DP2 may be arranged (or positioned) in the middle area MA. A third dam portion DP3 may be arranged (or positioned) in the middle area MA. Among the first dam portion DP1, the second dam portion DP2, and the third dam portion DP3, the first dam portion DP1 may be positioned closest to a display area (DA of FIG. 7), the third dam portion DP3 may be positioned closest to the opening area OA, and the second dam portion DP2 may be between the first dam portion DP1 and the third dam portion DP3. Although three dam portions DP1, DP2, and DP3 are illustrated as being included in the middle area MA in FIG. 23A, fewer or more dam portions, such as one, two, or four, may be included in the middle area MA.

The first dam portion DP1, the second dam portion DP2, and the third dam portion DP3 may be arranged on the inorganic insulating layer IIL. The first dam portion DP1, the second dam portion DP2, and the third dam portion DP3 may be arranged on an upper surface of the interlayer insulating layer 114. The first dam portion DP1, the second dam portion DP2, and the third dam portion DP3 may be arranged on one of an upper surface of the buffer layer 111, an upper surface of the first gate insulating layer 112, and an upper surface of the second gate insulating layer 113.

The first dam portion DP1 and the second dam portion DP2 may be provided by stacking a plurality of layers. The first dam portion DP1 and the second dam portion DP2 may each include the second organic pattern layer 116a, the third organic pattern layer 118a, and the fourth organic pattern layer 119a. The first dam portion DP1 and the second dam portion DP2 may each include the second organic pattern layer 116a, the third organic pattern layer 118a, and the fourth organic pattern layer 119a, which are stacked. The second organic pattern layer 116a may include the same material as the second organic insulating layer 116 and may be formed in the same process as the second organic insulating layer 116. The third organic pattern layer 118a may include the same material as the pixel defining film 118 and may be formed in the same process as the pixel defining film 118. The fourth organic pattern layer 119a may include the same material as the above-described spacer (119 of FIG. 6) and may be formed in the same process as the above-described spacer.

Although not illustrated in the drawing, each of the first dam portion DP1 and the second dam portion DP2 may include two or more layers that include the same material(s) as and are formed in the same process/processes as two or more of the first organic insulating layer 115, the second organic pattern layer 116a, the third organic pattern layer 118a, and the fourth organic pattern layer 119a.

The first dam portion DP1 and the second dam portion DP2 may be provided at the same height. A first height h1 of the first dam portion DP1 may be same as a second height h2 of the second dam portion DP2. The first height h1 of the first dam portion DP1 may be greater than or less than the second height h2 of the second dam portion DP2. A height may be a length from an upper surface of the inorganic insulating layer IIL to an upper surface of a dam portion.

The third dam portion DP3 may be shorter than the first dam portion DP1 and/or the second dam portion DP2. A third height h3 of the third dam portion DP3 may be less than the first height h1 of the first dam portion DP1 and/or the second height h2 of the second dam portion DP2.

The functional layer 212f may be in the middle area MA. The functional layer 212f is in the display area DA, but at least a portion of the functional layer 212f may extend from the display area DA to the middle area MA. The functional layer 212f may include at least one of the first functional layer (212a of FIG. 6) and the second functional layer (212c of FIG. 6) described above with reference to FIG. 6.

The functional layer 212f may be discontinuous in the middle area MA. The functional layer 212f may include at least one opening (e.g., first to fourth openings 212fOP1, 212fOP2, 212fOP3, and 212fOP4) positioned in the middle area MA.

Although not illustrated in the drawing, after forming a sacrificial layer on the inorganic insulating layer IIL and forming the functional layer 212f on the sacrificial layer, the functional layer 212f formed on the sacrificial layer may be removed in an operation of removing the sacrificial layer by irradiating a laser on a rear surface of the substrate 100, and the first to fourth openings 212fOP1, 212fOP2, 212fOP3, and 212fOP4 may be formed in the functional layer 212f.

The openings 212fOP1, 212fOP2, 212fOP3, and 212fOP4 of the functional layer 212f may be on the inorganic insulating layer IIL. The functional layer 212f is on the upper surface of the inorganic insulating layer IIL, but the upper surface of the inorganic insulating layer IIL may be exposed through the openings 212fOP1, 212fOP2, 212fOP3, and 212fOP4 of the functional layer 212f.

The functional layer 212f may include the first opening 212fOP1, the second opening 212fOP2, the third opening 212fOP3, and the fourth opening 212fOP4. The first opening 212fOP1 may be between a display area (DA of FIG. 7) and the first dam portion DP1, the second opening 212fOP2 may be between the first dam portion DP1 and the second dam portion DP2, the third opening 212fOP3 may be between the second dam portion DP2 and the third dam portion DP3, and the fourth opening 212fOP4 may be between the third dam portion DP3 and the opening area OA.

Penetration (or diffusion) of oxygen or moisture in the vicinity of the opening area OA into a light emitting diode of the display area DA may be prevented or minimized by forming at least one opening (e.g., the first to first to fourth openings 212fOP1, 212fOP2, 212fOP3, and 212fOP4) in the functional layer 212f.

The second electrode 213 and the capping layer 215 may be in the middle area MA. The second electrode 213 and the capping layer 215 are in the display area DA, but at least a portion of the second electrode 213 and the capping layer 215 may extend from the display area DA to the middle area MA.

The second electrode 213 and the capping layer 215 may be discontinuous in the middle area MA. The second electrode 213 and the capping layer 215 in the middle area MA may respectively include holes 213H and 215H corresponding to the opening area OA. The holes 213H and 215H respectively formed in the second electrode 213 and the capping layer 215 may be in the middle area MA. At least a portion of the functional layer 212f and/or the inorganic insulating layer IIL may be exposed through the holes 213 and 215H.

The encapsulation layer 300 may be in the middle area MA. The encapsulation layer 300 is in the display area (DA of FIG. 6), but at least a portion of the encapsulation layer 300 may extend from the display area DA to the middle area MA. The encapsulation layer 300 may include the first inorganic film layer 310, the organic film layer 320, and the second inorganic film layer 330, which are sequentially stacked. Each of the first inorganic film layer 310, the organic film layer 320, and the second inorganic film layer 330 may extend from the display area DA to the middle area MA.

The organic film layer 320 is formed by coating and then curing a monomer, and the flow of the monomer forming the organic film layer 320 may be controlled by the first and second dam portions DP1 and DP2. The flow of the monomer toward the opening area OA may be prevented or minimized by arranging the first dam portion DP1 and/or the second dam portion DP2 in the middle area MA. An end portion of the organic film layer 320 may be positioned at one side of the first dam portion DP1 and/or the second dam portion DP2.

The end portion of the organic film layer 320 is positioned at one side of the first dam portion DP1 and/or the second dam portion DP2, and the first inorganic film layer 310 and the second inorganic film layer 330 may directly contact an upper surface of the first dam portion DP1 and/or the second dam portion DP2.

The third dam portion DP3 may be positioned between the second dam portion DP2 and the opening area OA. The dam portion DP3 may control the flow of the monomer forming the organic film layer 320. The flow of the monomer for forming the organic film layer 320 toward the opening area OA may be prevented or minimized by the third dam portion DP3.

The encapsulation layer 300 may overlap the at least one opening (e.g., the first to first to fourth openings 212fOP1, 212fOP2, 212fOP3, and 212fOP4) formed in the functional layer 212f. The first inorganic film layer 310, the organic film layer 320, and the second inorganic film layer 330 of the encapsulation layer 300 may overlap the first opening 212fOP1 defined in the functional layer 212f.

The first inorganic film layer 310 may be directly on the upper surface of the inorganic insulating layer IIL, the upper surface being at least partially exposed by the first opening 212fOP1 defined in the functional layer 212f. The first inorganic film layer 310 may be directly arranged (or in contact with) the upper surface of the inorganic insulating layer IL, the upper surface being at least partially exposed by the second opening 212fOP2, the third opening 212fOP3, and the fourth opening 212fOP4 defined in the functional layer 212f.

The input sensing layer 40 may be in the middle area MA. The input sensing layer 40 is in the display area (DA of FIG. 6), but at least a portion of the input sensing layer 40 may extend from the display area DA to the middle area MA. The input sensing layer 40 may include the first touch insulating layer 410, the second touch insulating layer 420, the third touch insulating layer 440, and the planarization layer 460, which are sequentially stacked. Each of the first touch insulating layer 410, the second touch insulating layer 420, the third touch insulating layer 440, and the planarization layer 460 may extend from the display area DA to the middle area MA. The first touch insulating layer 410 and/or the second touch insulating layer 420 may be optional.

The alignment mark 470 may be arranged on the second touch insulating layer 420 of the middle area MA. The alignment mark 470 may include the same material as that of a first conductive layer (430 of FIG. 6) described above with reference to FIG. 6 and may be positioned on the same layer as the first conductive layer 430. The alignment mark 470 may include the same material as that of a second conductive layer (450 of FIG. 6) and may be positioned on the same layer as the second conductive layer 450.

The planarization layer 460 may be in the middle area MA. The planarization layer 460 may planarize the middle area MA. The planarization layer 460 may prevent or minimize the generation of a step difference between the display area DA and the middle area MA. The planarization layer 460 may be on the third touch insulating layer 440. The planarization layer 460 may cover an underlying structure.

The display panel 10 may include the opening 10OP. The opening 10OP of the display panel 10 may include openings of components forming the display panel 10. The opening 10OP of the display panel 10 may include the opening 100OP of the substrate 100, the opening 460OP of the planarization layer 460, or the like.

The crack sensing layer 510 may be in the middle area MA. The crack sensing layer 510 may include the first crack sensing layer 511 and the second crack sensing layer 513. The crack sensing layer 510 may be between the display area DA and the first dap portion DP1. The crack sensing layer 510 may be between the first opening 212fOP1 defined in the functional layer 212f and the first dam portion DP1. The crack sensing layer 510 may at least partially overlap the first dam portion DP1. The second crack sensing layer 513 of the crack sensing layer 510 may at least partially overlap the first dam portion DP1. The crack sensing layer 510 may not overlap the first opening 212fOP1.

The crack sensing layer 510 may be on the third touch insulating layer 440. The crack sensing layer 510 may be on the first touch insulating layer 410 or the second touch insulating layer 420.

The metal layer 520 may be in the middle area MA. The metal layer 520 may overlap at least one of the first dam portion DP1, the second dam portion DP2, and the third dam portion DP3. The metal layer 520 may cover at least one of the first dam portion DP1, the second dam portion DP2, and the third dam portion DP3.

The metal layer 520 may be on the second touch insulating layer 420 and/or the third touch insulating layer 440. The metal layer 520 may include the first metal layer 521 and the second metal layer 523. The first metal layer 521 may be on the second touch insulating layer 420, and the second metal layer 523 may be on the third touch insulating layer 440.

The first side surface DP1*b* of the first dam portion DP1 may refer to a side surface adjacent to the display area among side surfaces of the first dam portion DP1, and the second side surface DP1*c* of the first dam portion DP1 may refer to a side surface adjacent to the second dam portion DP2 among the side surfaces of the first dam portion DP1. The first side surface DP2*b* of the second dam portion DP2 may refer to a side surface adjacent to the first dam portion DP1 among side surfaces of the second dam portion DP2, and the second side surface DP2*c* of the second dam portion DP2 may refer to a side surface adjacent to the third dam portion DP3 among the side surfaces of the second dam portion DP2. A first side surface DP3*b* of the third dam portion DP3 may refer to a side surface adjacent to the second dam portion DP2 among side surfaces of the third dam portion DP3, and a second side surface DP3*c* of the third dam portion DP3 may refer to a side surface adjacent to the opening area OA among the side surfaces of the third dam portion DP3.

The metal layer 520 may at least partially overlap the upper surface DP1*a* of the first dam portion DP1 and the second side surface DP1*c* of the first dam portion DP1. Each of the first metal layer 521 and the second metal layer 523 may at least partially overlap the upper surface DP1*a* of the first dam portion DP1 and the second side surface DP1*c* of the first dam portion DP1.

The metal layer 520 may at least partially cover the upper surface DP1*a* of the first dam portion DP1 and the second side surface DP1*c* of the first dam portion DP1. In particular each of the first metal layer 521 and the second metal layer 523 may at least partially cover the upper surface DP1*a* of the first dam portion DP1 and the second side surface DP1*c* of the first dam portion DP1.

The metal layer 520 may partially or completely overlap the upper surface DP2*a* of the second dam portion DP2, the first side surface DP2*b* of the second dam portion DP2, and the second side surface DP2*c* of the second dam portion DP2. Each of the first metal layer 521 and the second metal layer 523 may partially or completely overlap the upper surface DP2*a* of the second dam portion DP2, the first side surface DP2*b* of the second dam portion DP2, and the second side surface DP2*c* of the second dam portion DP2.

The metal layer 520 may partially or completely cover the upper surface DP2*a* of the second dam portion DP2, the first side surface DP2*b* of the second dam portion DP2, and the second side surface DP2*c* of the second dam portion DP2. Each of the first metal layer 521 and the second metal layer 523 may partially or completely cover the upper surface DP2*a* of the second dam portion DP2, the first side surface DP2*b* of the second dam portion DP2, and the second side surface DP2*c* of the second dam portion DP2.

The metal layer 520 may partially or completely overlap an upper surface DP3*a* of the third dam portion DP3, the first side surface DP3*b* of the third dam portion DP3, and the second side surface DP3*c* of the third dam portion DP3. Each of the first metal layer 521 and the second metal layer 523 may partially or completely overlap the upper surface DP3*a* of the third dam portion DP3, the first side surface DP3*b* of the third dam portion DP3, and the second side surface DP3*c* of the third dam portion DP3.

The metal layer 520 may partially or completely cover the upper surface DP3*a* of the third dam portion DP3, the first side surface DP3*b* of the third dam portion DP3, and the second side surface DP3*c* of the third dam portion DP3. Each of the first metal layer 521 and the second metal layer 523 may partially or completely cover the upper surface DP3*a* of the third dam portion DP3, the first side surface DP3*b* of the third dam portion DP3, and the second side surface DP3*c* of the third dam portion DP3.

The metal layer 520 may be integrally formed to at least partially overlap the first dam portion DP1, the second dam portion DP2, and the third dam portion DP3. The metal layer 520 may be integrally formed to at least partially overlap the upper surface DP1*a* of the first dam portion DP1, the second side surface DP1*c* of the first dam portion DP1, the upper surface DP2*a* of the second dam portion DP2, the first side surface DP2*b* of the second dam portion DP2, the second side surface DP2*c* of the second dam portion DP2, the upper surface DP3*a* of the third dam portion DP3, the first side surface DP3*b* of the third dam portion DP3, and the second side surface DP3*c* of the third dam portion DP3. Each of the first metal layer 521 and the second metal layer 523 may be integrally formed to at least partially overlap the upper surface DP1*a* of the first dam portion DP1, the second side surface DP1*c* of the first dam portion DP1, the upper surface DP2*a* of the second dam portion DP2, the first side surface DP2*b* of the second dam portion DP2, the second side surface DP2*c* of the second dam portion DP2, the upper surface DP3*a* of the third dam portion DP3, the first side surface DP3*b* of the third dam portion DP3, and the second side surface DP3*c* of the third dam portion DP3.

The metal layer 520 may be integrally formed to at least partially cover the first dam portion DP1, the second dam portion DP2, and the third dam portion DP3. The metal layer 520 may be integrally formed to at least partially cover the upper surface DP1*a* of the first dam portion DP1, the second side surface DP1*c* of the first dam portion DP1, the upper surface DP2*a* of the second dam portion DP2, the first side surface DP2*b* of the second dam portion DP2, the second side surface DP2*c* of the second dam portion DP2, the upper surface DP3*a* of the third dam portion DP3, the first side surface DP3*b* of the third dam portion DP3, and the second side surface DP3*c* of the third dam portion DP3. Each of the first metal layer 521 and the second metal layer 523 may be integrally formed to at least partially cover the upper surface DP1*a* of the first dam portion DP1, the second side surface DP1*c* of the first dam portion DP1, the upper surface DP2*a* of the second dam portion DP2, the first side surface DP2*b* of the second dam portion DP2, the second side surface DP2*c* of the second dam portion DP2, the upper surface DP3*a* of the third dam portion DP3, the first side surface DP3*b* of the third dam portion DP3, and the second side surface DP3*c* of the third dam portion DP3.

Referring to FIG. 23B, the metal layer 520 may be arranged only on the second touch insulating layer 420. Referring to FIG. 23C, the metal layer 520 may be arranged only on the third touching insulating layer 440.

A groove IILs (for preventing a crack generated in the opening area OA and/or the middle area MA around the opening area OA from being transferred to the display area DA) may be defined in the inorganic insulating layer IIL. At least a portion of the inorganic insulating layer IL may be removed to form the groove IILs. At least a portion of the first gate insulating layer 112, the second gate insulating layer 113, and the interlayer insulating layer 114 may be removed to form the groove IILs. At least a portion of the upper surface of the buffer layer 111 may be exposed through the groove IILs defined in the first gate insulating layer 112, the second gate insulating layer 113, and the interlayer insulating layer 114. At least a portion of the buffer layer 111 may be removed together to form the groove IILs in the buffer layer 111.

The groove IILs may be between the third dam portion DP3 and the opening area OA. The groove IILs defined in the inorganic insulating layer IIL may be between the first dam portion DP1 and the second dam portion DP2 or may be between the second dam portion DP2 and the third dam portion DP3. The groove IILs may be arranged along the periphery of the opening area OA.

At least one of the functional layer 212f, the first inorganic film layer 310, the second inorganic film layer 330, the first touch insulating layer 410, the second touch insulating layer 420, and the third touch insulating layer 440 may be arranged in the groove IILs.

The groove IILs is defined in the inorganic insulating layer IIL arranged in the middle area MA, so that the transfer of a crack generated in the opening area OA and/or the middle area around the opening area OA to the display area DA may be prevented and minimized.

Figure 24A:
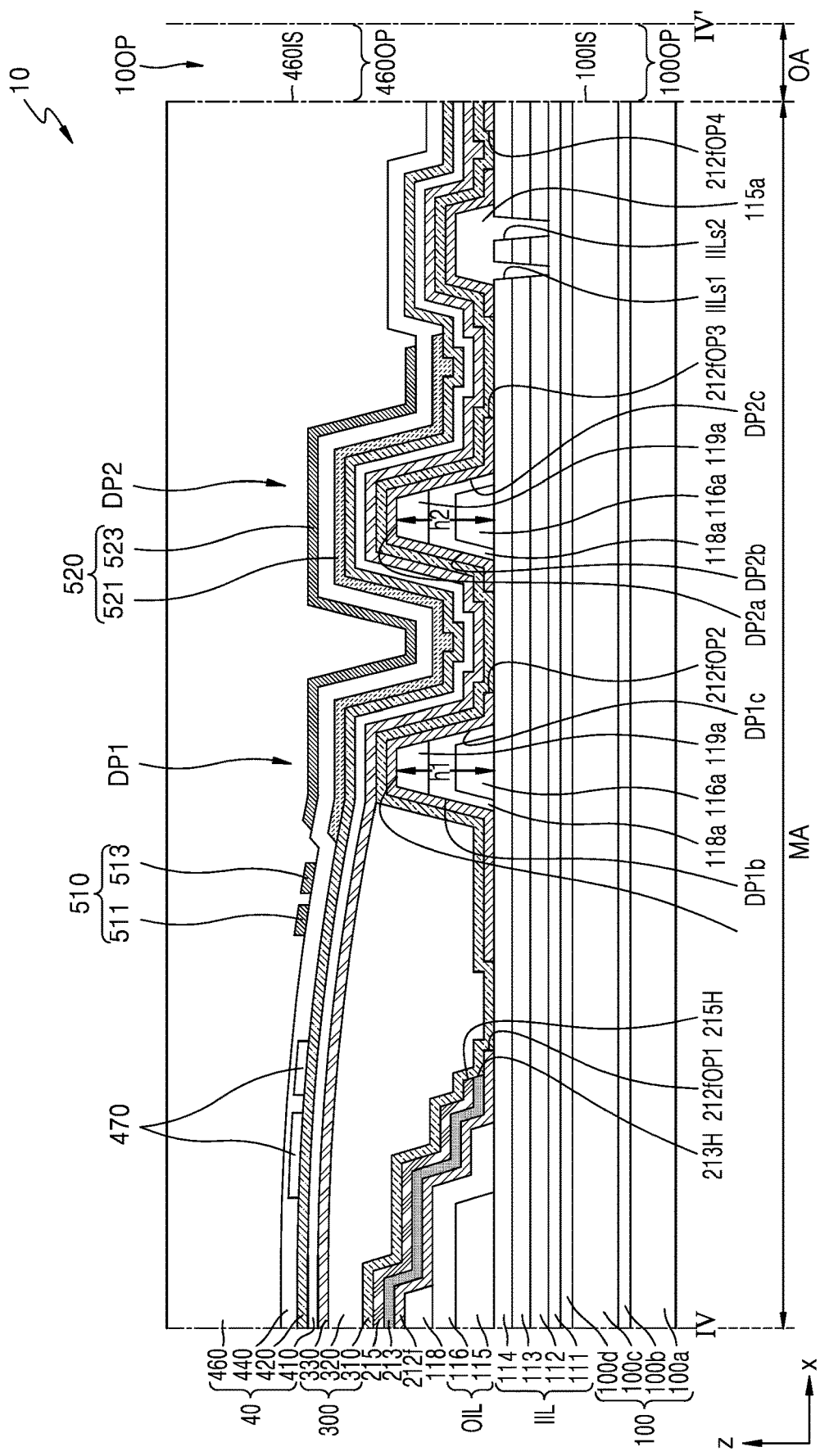
FIG. 24C is a schematic cross-sectional view of a portion of a display panel according to an embodiment.
Figure 24B:
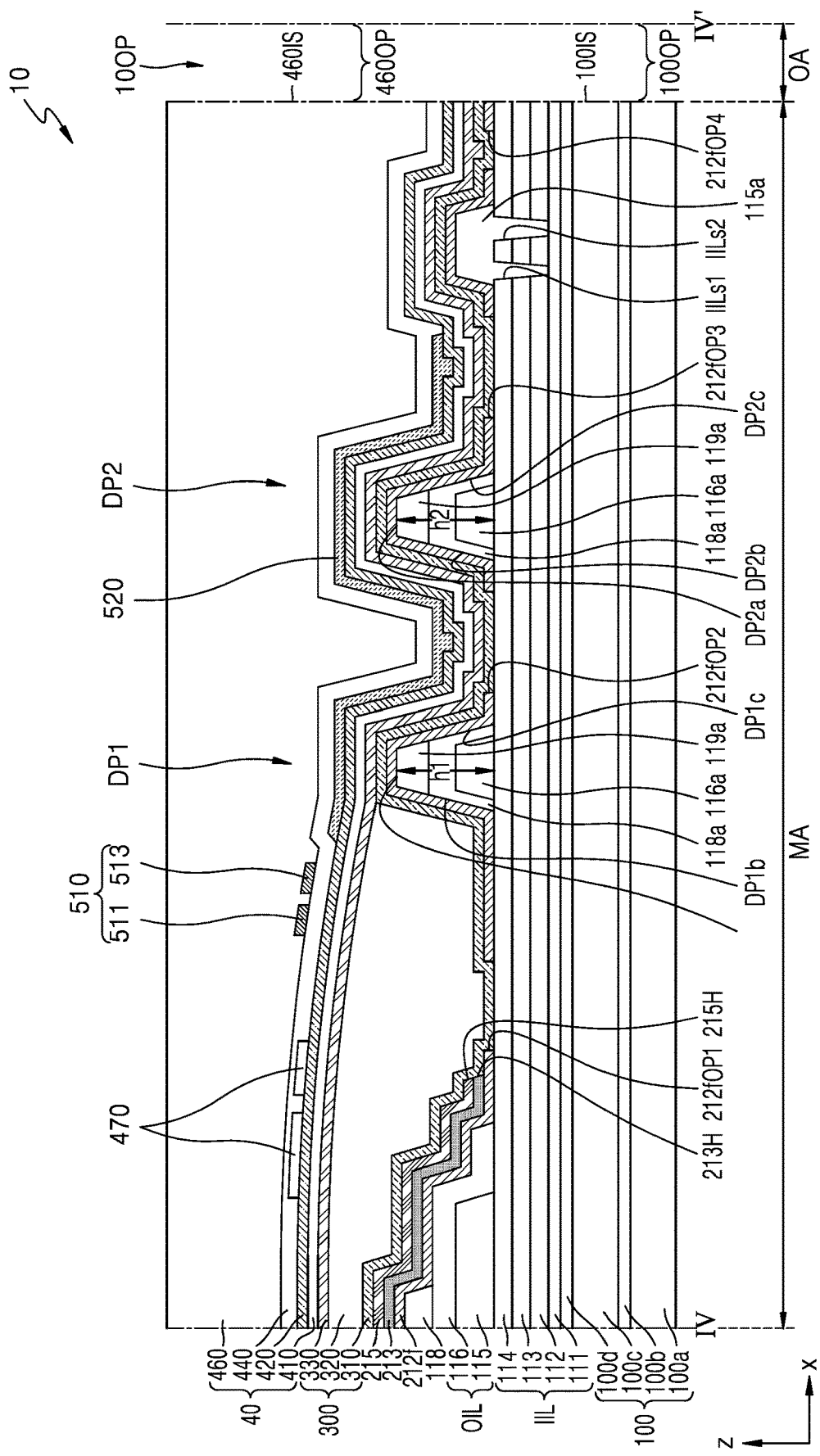
Figure 24C:
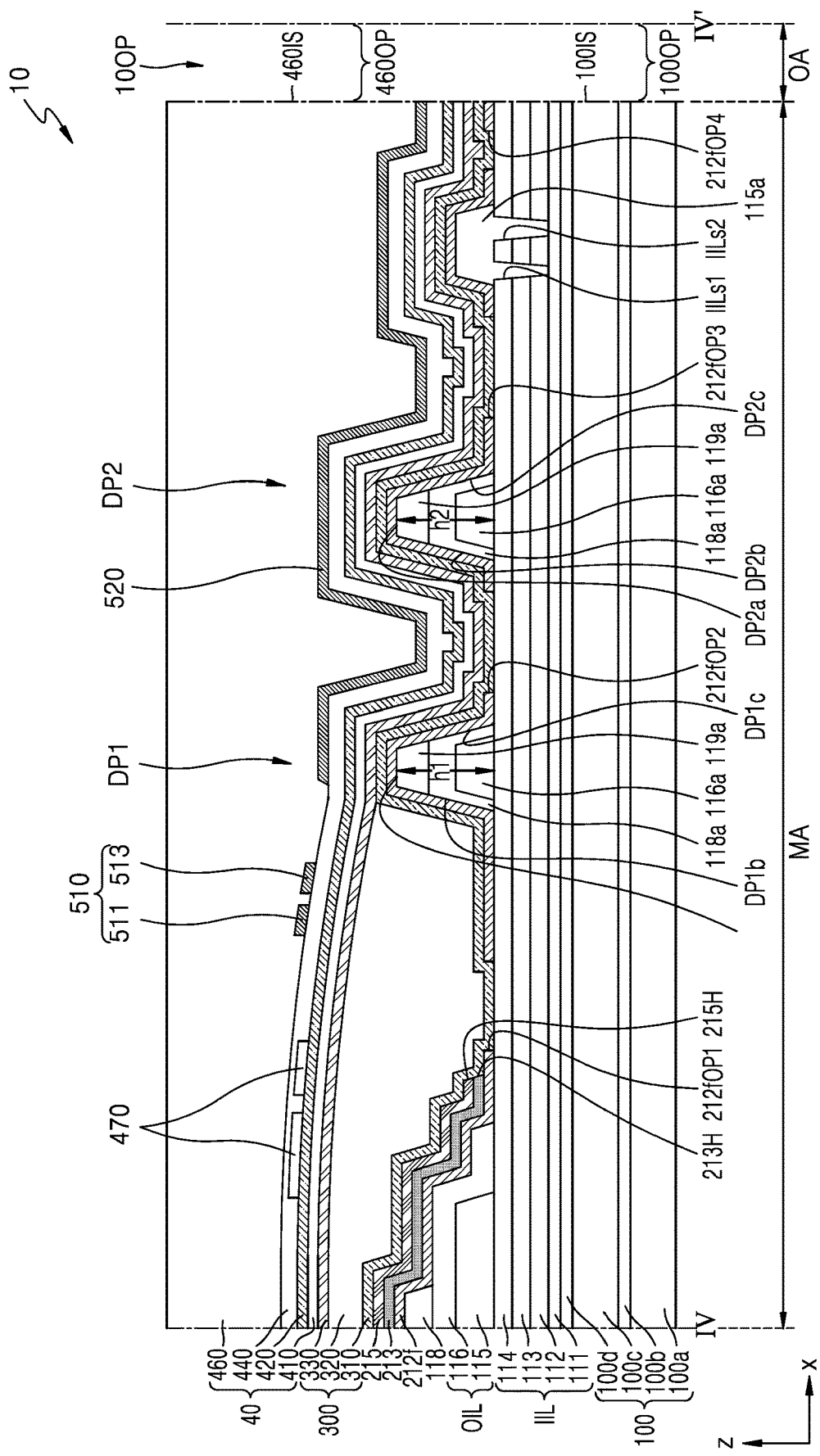

FIGS. 24A to 24C are schematic cross-sectional views each illustrating a portion of the display panel 10 according to an embodiment. FIGS. 24A to 24C are diagrams for explaining components arranged in the middle area MA. In FIGS. 24A to 24C, the same reference numerals as those of FIGS. 23A to 23C refer to the same members or analogous members.

Referring to FIGS. 24A to 24C, the first dam portion DP1 and the second dam portion DP2 may be arranged (or positioned) in the middle area MA. Among the first dam portion DP1 and the second dam portion DP2, the first dam portion DP1 may be positioned close to the display area (DA of FIG. 7), and the second dam portion DP2 may be positioned close to the opening area (OA of FIG. 7). Although two dam portions DP1 and DP2 are illustrated as being included in the middle area MA in FIG. 24A, fewer or more dam portions, such as one, three, and four, may be included in the middle area MA.

The first dam portion DP1 and the second dam portion DP2 may have the same height. The first height h1 of the first dam portion DP1 may be same as the second height h2 of the second dam portion DP2. The first height h1 of the first dam portion DP1 may be greater or less than the second height h2 of the second dam portion DP2.

The crack sensing layer 510 may be in the middle layer MA. The crack sensing layer 510 may include the first crack sensing layer 511 and the second crack sensing layer 513. The crack sensing layer 510 may be between the display area DA and the first dam portion DP1. The crack sensing layer 510 may be between the first opening 212fOP1 defined in the functional layer 212f and the first dam portion DP1.

The metal layer 520 may be in the middle area MA. The metal layer 520 may overlap at least one of the first dam portion DP1 and the second dam portion DP2. The metal layer 520 may cover at least one of the first dam portion DP1 and the second dam portion DP2.

The metal layer 520 may partially or completely overlap the upper surface DP1a of the first dam portion DP1, the first side surface DP1b of the first dam portion DP1, and the second side surface DP1c of the first dam portion DP1. Each of the first metal layer 521 and the second metal layer 523 may partially or completely overlap the upper surface DP1a of the first dam portion DP1, the first side surface DP1b of the first dam portion DP1, and the second side surface DP1c of the first dam portion DP1.

The metal layer 520 may partially or completely cover the upper surface DP1a of the first dam portion DP1, the first side surface DP1b of the first dam portion DP1, and the second side surface DP1c of the first dam portion DP1. Each of the first metal layer 521 and the second metal layer 523 may partially or completely cover the upper surface DP1a of the first dam portion DP1, the first side surface DP1b of the first dam portion DP1, and the second side surface DP1c of the first dam portion DP1.

The metal layer 520 may partially or completely overlap the upper surface DP2a of the second dam portion DP2, the first side surface DP2b of the second dam portion DP2, and the second side surface DP2c of the second dam portion DP2. Each of the first metal layer 521 and the second metal layer 523 may partially or completely overlap the upper surface DP2a of the second dam portion DP2, the first side surface DP2b of the second dam portion DP2, and the second side surface DP2c of the second dam portion DP2.

The metal layer 520 may partially or completely cover the upper surface DP2a of the second dam portion DP2, the first side surface DP2b of the second dam portion DP2, and the second side surface DP2c of the second dam portion DP2. Each of the first metal layer 521 and the second metal layer 523 may partially or completely cover the upper surface DP2a of the second dam portion DP2, the first side surface DP2b of the second dam portion DP2, and the second side surface DP2c of the second dam portion DP2.

The metal layer 520 may be integrally formed to partially or completely overlap the first dam portion DP1 and the second dam portion DP2. The metal layer 520 may be integrally formed to partially or completely overlap the upper surface DP1a of the first dam portion DP1, the first side surface DP1b of the first dam portion DP1, the second side surface DP1c of the first dam portion DP1, the upper surface DP2a of the second dam portion DP2, the first side surface DP2b of the second dam portion DP2, and the second side surface DP2c of the second dam portion DP2. Each of the first metal layer 521 and the second metal layer 523 may be integrally formed to partially or completely overlap the upper surface DP1a of the first dam portion DP1, the first side surface DP1b of the first dam portion DP1, the second side surface DP1c of the first dam portion DP1, the upper surface DP2a of the second dam portion DP2, the first side surface DP2b of the second dam portion DP2, and the second side surface DP2c of the second dam portion DP2.

The metal layer 520 may be integrally formed to partially or completely cover the first dam portion DP1 and the second dam portion DP2. The metal layer 520 may be integrally formed to partially or completely cover the upper surface DP1a of the first dam portion DP1, the first side surface DP1b of the first dam portion DP1, the second side surface DP1c of the first dam portion DP1, the upper surface DP2a of the second dam portion DP2, the first side surface DP2b of the second dam portion DP2, and the second side surface DP2c of the second dam portion DP2. Each of the first metal layer 521 and the second metal layer 523 may be integrally formed to partially or completely cover the upper surface DP1a of the first dam portion DP1, the first side surface DP1b of the first dam portion DP1, the second side surface DP1c of the first dam portion DP1, the upper surface DP2a of the second dam portion DP2, the first side surface DP2b of the second dam portion DP2, and the second side surface DP2c of the second dam portion DP2.

Referring to FIG. 24B, the metal layer may be arranged directly on the second touch insulating layer 420 and covered by the third touch insulating layer 440. Referring to FIG. 24C, the metal layer 520 may be arranged directly on the third touch insulating layer 440 and spaced from the second touch insulating layer 420.

In an embodiment, first and second grooves IILs1 and IILs2 for preventing a crack generated in the opening area OA and/or the middle area MA around the opening area OA from being transferred to the display area DA may be defined in the inorganic insulating layer IIL. At least a portion of the inorganic insulating layer IIL may be removed to form the first and second grooves IILs1 and IILs2. At least a portion of the first gate insulating layer 112, the second gate insulating layer 113, and the interlayer insulating layer 114 may be removed to form the first groove IILs1 and the second groove IILs2. At least a portion of the upper surface of the buffer layer 111 may be exposed through the first and second grooves IILs1 and IILs2 defined in the first gate insulating layer 112, the second gate insulating layer 113, and the interlayer insulating layer 114. At least a portion of the buffer layer 111 may be removed together to form the first and second grooves IILs1 and IILs2 in the buffer layer 111.

The first groove IILs1 and the second groove IILs2 may be between the second dam portion DP2 and the opening area OA. The first groove IILs1 and the second groove IILs2 defined in the inorganic insulating layer IIL may be between the first dam portion DP1 and the second dam portion DP2. The first groove IILs1 and the second groove IILs2 may be arranged along the periphery of the opening area OA.

The first organic pattern layer 115a may be on the inorganic insulating layer IIL. The first organic pattern layer 115a may include the same material as that of the first organic insulating layer 115 and may be formed in the same operation as the first organic insulating layer 115. The first organic pattern layer 115a may fill the first groove IILs1 and the second groove IILs2 defined in the inorganic insulating layer IL. The first organic pattern layer 115a may be arranged in the first groove IILs1 and the second groove IILs2 defined in the inorganic insulating layer IL.

The first and second grooves IILs1 and IILs2 are defined in the inorganic insulating layer IIL arranged in the middle area MA, and the first organic pattern layer 115a is arranged in the first and second grooves IILs1 and IILs2, so that the transfer of a crack generated in the opening area OA and/or the middle area MA around the opening area OA to the display area DA may be prevented or minimized.

The functional area 212f may be discontinuous in the middle area MA. The functional area 212f may include at least one opening (e.g., the first to first to fourth openings 212fOP1, 212fOP2, 212fOP3, and 212fOP4) positioned in the middle area MA.

The openings 212fOP1, 212fOP2, 212fOP3, and 212fOP4 defined in the functional layer 212f may be on the inorganic insulating layer IIL. The function layer 212f is on the upper surface of the inorganic insulating layer IIL, but the upper surface of the inorganic insulating layer IIL may be exposed through the openings 212fOP1, 212fOP2, 212fOP3, and 212fOP4 of the functional layer 212f.

The functional layer 212f may include the first opening 212fOP1, the second opening 212fOP2, the third opening 212fOP3, and the fourth opening 212fOP4. The first opening 212fOP1 may be between the display area (DA of FIG. 7) and the first dam portion DP1, the second opening 212fOP2 may be between the first dam portion DP1 and the second dam portion DP2, the third opening 212fOP3 may be between the second dam portion DP2 and the first organic pattern layer 115a, and the fourth opening 232fOP4 may be between the first organic pattern 115a and the opening area OA.

The at least one opening (e.g., the first to first to fourth openings 212fOP1, 212fOP2, 212fOP3, and 212fOP4) is defined in the functional layer 212f, so that penetration (or diffusion) of oxygen or moisture in the vicinity of the opening area OA into a light-emitting diode of the display area DA may be prevented or minimized.

In a display panel according to an embodiment, external impurities such as moisture may be prevented from damaging display elements around an opening area, and the detection sensitivity of cracks generated in a middle area around the opening area may be satisfactory.

The embodiments described above are illustrative and not for purposes of limitation. Description of features or aspects within each embodiment may be applicable for similar features or aspects in other embodiments. Various changes in form and details may be made to the described embodiments without departing from the scope defined by the following claims.

What is claimed is:

1. A display panel comprising:
a substrate comprising a transmission area, a display area at least partially surrounding the transmission area, and an intermediate area positioned between the transmission area and the display area;
a light-emitting diode positioned on the display area and comprising a first electrode, a second electrode, and a functional layer positioned between the first electrode and the second electrode;
a first dam positioned on the intermediate area;
a crack sensing member positioned farther from the transmission area than the first dam; and
a planarization layer positioned on the crack sensing member.

2. The display panel of claim 1, further comprising a second dam positioned between the first dam and the transmission area.

3. The display panel of claim 2, further comprising at least one metal layer overlapping at least one of the first dam and the second dam.

4. The display panel of claim 3, wherein the at least one metal layer at least partially overlaps each of a first face of the first dam and a second face of the first dam, wherein the second face of the first dam is positioned between the first face of the first dam and the second dam, wherein the at least one metal layer at least partially overlaps each of a first face of the second dam, a second face of the second dam, and a third face of the second dam, wherein the second face of the second dam is positioned between the first face of the second dam and the first dam, and wherein the third face of the second dam is positioned between the first face of the second dam and the transmission area.

5. The display panel of claim 4, wherein the at least one metal layer comprises an opening exposing at least one of the first face of the second dam, the second face of the second dam, and the third face of the second dam.

6. The display panel of claim 4, wherein the at least one metal layer comprises a first metal layer and a second metal layer, and wherein the first metal layer and the second metal layer at least partially overlap each other.

7. The display panel of claim 6, wherein the planarization layer covers and directly contacts the second metal layer.

8. The display panel of claim 6, further comprising an input sensing layer arranged on the light-emitting diode, wherein the input sensing layer comprises a first touch insulating layer, a first conductive layer, a second touch insulating layer, and a second conductive layer, which are sequentially stacked.

9. The display panel of claim 8, wherein each of the first touch insulating layer and the second touch insulating layer extends from the display area to the intermediate area, and wherein the at least one metal layer directly contacts at least one of the first touch insulating layer and the second touch insulating layer.

10. The display panel of claim 8, wherein the first metal layer is positioned between the first touch insulating layer and the second touch insulating layer, and wherein the second touch insulating layer is positioned between the first metal layer and the second metal layer.

11. The display panel of claim 1, wherein a thickness of the planarization layer is in a range of 16,000 angstroms (Å) to 150,000 Å.

12. The display panel of claim 1, wherein the planarization layer is positioned directly on the crack sensing member.

13. The display panel of claim 1, wherein the crack sensing member at least partially overlaps the first dam.

14. The display panel of claim 1, wherein the crack sensing member comprises a first crack sensing member section and a second crack sensing member section, which are formed of a same material, wherein the first crack sensing member section is positioned between the display area and the transmission area, and wherein the second crack sensing member section is spaced from the first crack sensing member section and is positioned between the first crack sensing member section and the transmission area.

15. The display panel of claim 14, wherein a distance between the first crack sensing member section and the second crack sensing member section is 2 μm or more.

16. The display panel of claim 14, wherein the crack sensing member further comprises a third crack sensing member section, wherein the third crack sensing member section is bent and is formed of the same material as the first crack sensing member section and the second crack sensing member section, and wherein the first crack sensing member section is connected through the third crack sensing member section to the second crack sensing member section.

17. The display panel of claim 9, wherein the crack sensing member is positioned directly on the first touch insulating layer or the second touch insulating layer.

18. The display panel of claim 1, wherein the second electrode extends from the display area to the intermediate area and comprises a hole corresponding to the transmission area.

19. The display panel of claim 18, wherein the functional layer extends from the display area to the intermediate area and comprises at least one opening positioned on the intermediate area.

20. The display panel of claim 19, further comprising an inorganic insulating layer positioned on the substrate, wherein at least one edge of the at least one opening of the functional layer directly contacts the inorganic insulating layer.

21. The display panel of claim 20, wherein the at least one opening comprises a first opening, a second opening, and a third opening, wherein the first opening is positioned between the display area and the first dam, wherein the second opening is positioned between the first dam and the second dam, and wherein the third opening is positioned between the second dam and the transmission area.

22. The display panel of claim 19, further comprising an encapsulation layer arranged on the light-emitting diode, wherein the encapsulation layer comprises a first inorganic film layer, an organic film layer, and a second inorganic film layer, which are sequentially stacked.

23. The display panel of claim 22, wherein the encapsulation layer extends from the display area to the intermediate area, and wherein the encapsulation layer overlaps the at least one opening of the functional layer.

24. The display panel of claim 1, further comprising an alignment mark positioned between the display area and the crack sensing member.

25. A display apparatus comprising:
a component; and
a display panel, wherein the display panel comprises:
a substrate comprising an transmission area at least partially exposing the component, a display area at least partially surrounding the transmission area, and an intermediate area positioned between the transmission area and the display area;
a light-emitting diode positioned on the display area and comprising a first electrode, a second electrode, and a functional layer positioned between the first electrode and the second electrode;
a first dam positioned on the intermediate area;
a crack sensing member positioned farther from the transmission area than the first dam; and
a planarization layer positioned on the crack sensing member.

26. The display apparatus of claim 25, wherein the display panel further comprises a second dam positioned between the first dam and the transmission area.

27. The display apparatus of claim 26, wherein the display panel further comprises at least one metal layer overlapping at least one of the first dam and the second dam.

28. The display apparatus of claim 27, wherein the at least one metal layer comprises a first metal layer and a second metal layer, and wherein the first metal layer and the second metal layer at least partially overlap each other.

29. The display apparatus of claim 28, wherein the planarization layer covers and directly contacts the second metal layer.

30. The display apparatus of claim 25, wherein the component comprises at least one of an imaging device and a sensor.

31. A display panel comprising:
a substrate comprising an transmission area, a display area at least partially surrounding the transmission area, and a middle area between the transmission area and the display area;
a light-emitting diode arranged in the display area and comprising a first electrode, a second electrode, and a functional layer between the first electrode and the second electrode;
a first dam positioned on the middle area;
a crack sensing layer at least partially positioned between the display area and the first dam and at least partially overlapping the first dam; and
a second dam between the first dam and the transmission area.

32. The display panel of claim 31, further comprising a third dam between the second dam and the transmission area.

33. The display panel of claim 32, wherein the first dam has a first height, and the second dam has a second height equal to the first height.

34. The display panel of claim 33, wherein the third dam has a third height less than the first height.

35. The display panel of claim 32, further comprising: an inorganic insulating layer positioned on the substrate and including a groove.

36. The display panel of claim 35, wherein the groove is between the third dam and the transmission area.

37. The display panel of claim 35, wherein the functional layer extends from the display area to the middle area and comprises at least one opening on the middle area.

38. The display panel of claim 37, wherein the at least one opening comprises a first opening, a second opening, a third opening, and a fourth opening,
- wherein the first opening is between the display area and the first dam,
- wherein the second opening is between the first dam and the second dam,
- wherein the third opening is between the second dam and the third dam, and
- wherein the fourth opening is between the third dam and the transmission area.

39. The display panel of claim 38, further comprising a metal layer arranged on the middle area and overlapping at least one of the first dam, the second dam, and the third dam.

40. The display panel of claim 39, wherein the metal layer at least partially overlaps the fourth opening.

* * * * *